(12) United States Patent
Hakewill et al.

(10) Patent No.: US 6,862,563 B1
(45) Date of Patent: Mar. 1, 2005

(54) METHOD AND APPARATUS FOR MANAGING THE CONFIGURATION AND FUNCTIONALITY OF A SEMICONDUCTOR DESIGN

(75) Inventors: James Robert Howard Hakewill, Radlett (GB); Mohammed Noshad Khan, Edgware (GB); Edward Plowman, Gamlingay (GB)

(73) Assignee: ARC International, Herts (GB)

( * ) Notice: Subject to any disclaimer, the term of this patent is extended or adjusted under 35 U.S.C. 154(b) by 0 days.

(21) Appl. No.: 09/418,663

(22) Filed: Oct. 14, 1999

Related U.S. Application Data

(60) Provisional application No. 60/104,271, filed on Oct. 14, 1998.

(51) Int. Cl.[7] ............................................. G06F 17/50
(52) U.S. Cl. ............................. 703/14; 703/13; 716/2; 716/18
(58) Field of Search ..................... 703/14, 13; 716/2, 716/18

(56) References Cited

U.S. PATENT DOCUMENTS

| | | | |
|---|---|---|---|
| 5,361,373 A | | 11/1994 | Gilson |
| 5,404,319 A | * | 4/1995 | Smith et al. .................... 716/18 |
| 5,450,586 A | | 9/1995 | Kuzara et al. |
| 5,491,640 A | | 2/1996 | Sharma et al. |
| 5,493,508 A | | 2/1996 | Dangelo et al. |
| 5,502,661 A | | 3/1996 | Glunz |
| 5,535,331 A | | 7/1996 | Swoboda et al. |
| 5,537,580 A | | 7/1996 | Giomi et al. |
| 5,544,067 A | | 8/1996 | Rostoker et al. |
| 5,555,201 A | | 9/1996 | Dangelo et al. |
| 5,696,956 A | | 12/1997 | Razdan et al. |
| 5,748,875 A | | 5/1998 | Tzori |
| 5,801,958 A | * | 9/1998 | Dangelo et al. ................ 716/1 |
| 5,812,416 A | | 9/1998 | Gupte et al. |
| 5,819,050 A | | 10/1998 | Boehling et al. |
| 5,819,064 A | | 10/1998 | Razdan et al. |
| 5,841,663 A | | 11/1998 | Sharma et al. |
| 5,854,929 A | | 12/1998 | Van Praet et al. |
| 5,854,930 A | | 12/1998 | McLain et al. |
| 5,867,399 A | * | 2/1999 | Rostoker et al. ............. 324/142 |
| 5,870,588 A | | 2/1999 | Rompaey et al. |

(List continued on next page.)

FOREIGN PATENT DOCUMENTS

| | | |
|---|---|---|
| GB | 2308470 | 6/1997 |
| WO | WO 97 13209 A | 4/1997 |

OTHER PUBLICATIONS

Cambell et al, "A tutorial for make", Proceedings of the 1985 ACM annual conference on the range of computing; mid–80's perspective, 1985, Denver, Colorado, United States, pp. 3740380. ISBN 0–89791–170–9.*

(List continued on next page.)

*Primary Examiner*—W. D. Thomson
*Assistant Examiner*—Ed Garcia-Otero
(74) *Attorney, Agent, or Firm*—Gazdzinski & Associates

(57) ABSTRACT

A method of managing the configuration, design parameters, and functionality of an integrated circuit (IC) design using a hardware description language (HDL). Instructions can be added, subtracted, or generated by the designer interactively during the design process, and customized HDL descriptions of the IC design are generated through the use of scripts based on the user-edited instruction set and inputs. The customized HDL description can then be used as the basis for generating "makefiles" for purposes of simulation and/or logic level synthesis. The method further affords the ability to generate an HDL model of a complete device, such as a microprocessor or DSP. A computer program implementing the aforementioned method and a hardware system for running the computer program are also disclosed.

54 Claims, 44 Drawing Sheets

U.S. PATENT DOCUMENTS

| | | | |
|---|---|---|---|
| 5,898,595 A | | 4/1999 | Bair et al. |
| 5,994,892 A | * | 11/1999 | Turino et al. ................. 716/11 |
| 5,999,734 A | | 12/1999 | Willis et al. |
| 6,006,022 A | | 12/1999 | Rhim et al. |
| 6,026,219 A | | 2/2000 | Miller et al. |
| 6,035,123 A | | 3/2000 | Razdan et al. |
| 6,110,223 A | | 8/2000 | Southgate et al. |
| 6,173,434 B1 | * | 1/2001 | Wirthlin et al. ............... 716/12 |
| 6,182,206 B1 | | 1/2001 | Baxter |
| 6,195,593 B1 | | 2/2001 | Nguyen |
| 6,226,776 B1 | | 5/2001 | Panchul et al. |
| 6,269,467 B1 | * | 7/2001 | Chang et al. ................... 716/1 |
| 6,317,860 B1 | * | 11/2001 | Heile ............................ 716/5 |
| 6,321,369 B1 | * | 11/2001 | Heile et al. .................... 716/18 |
| 6,324,678 B1 | * | 11/2001 | Dangelo et al. .............. 703/23 |
| 6,360,350 B1 | * | 3/2002 | Gabele et al. ................. 716/18 |
| 6,378,123 B1 | * | 4/2002 | Dupenloup .................. 716/11 |
| 6,385,757 B1 | | 5/2002 | Gupta et al. |
| 6,408,428 B1 | | 6/2002 | Schlansker et al. |
| 6,421,818 B1 | * | 7/2002 | Dupenloup et al. ........... 716/18 |
| 6,457,173 B1 | | 9/2002 | Gupta et al. |
| 6,477,683 B1 | * | 11/2002 | Killian et al. .................. 716/1 |
| 6,477,697 B1 | | 11/2002 | Killian et al. |
| 6,637,018 B1 | * | 10/2003 | Demler ......................... 716/18 |
| 2003/0208723 A1 | * | 11/2003 | Killian et al. ................... 716/1 |

OTHER PUBLICATIONS

"HDL Chip Design" by Douglas J. Smith, Ninth printing Jul. 2001, minor updates. First Printing Jun. 1996. Doone Publications. ISBN 0–9651934–3–8. pp. 1–25.*

Rainer Leupers and Peter Marwedel, Retargetable Code Generation based on Structural Processor Descriptions, Design Automation for Embedded Systems, vol. 3, No. 1, Jan. 1998, p. 1–36.

George Hadjiyiannis, Silvina Hanono, and Scrinivas Devadas, ISDL: An Instruction Set Description Language for Retargetability, 4 pages, 1997.

Vojin Zavojnovic, Stefan Pees, Christian Schlaeger, Markus Willems, Rainer Schoenen and Heinrich Meyr, DSP Processor/Complier Co–Design A Quantitative Approach, Integrated Systems for Signal Processing, Aachen University Technology, p. 761–765, 1998.

Elms, A., "Tuning a Customisable RISC Core for DSP," Electronic Product Design, Sep. 1997, vol. 18, No. 9, pp. 19–20, 22, XP000909039.

"Custom–Fit Processors: Letting Applications Define Architectures" by Josh Fisher,Paolo Faraboschi,and Giuseppe Desoli.

MDR—Microprocessor Report Article entitled "Tensilica Patents Raise Eyebrows" by Tom R. Halfhill dated Dec. 9, 2002.

Hartoog et al, "Generation of Software Tools from Processor Descriptions for Hardware/Software Codesign," ACM, Jun. 1997, pp. 303–306.*

Freericks "The nML Machine Description Formalism" (Bericht 1991/15 pp. 3–41).

Fauth et al. "Describing Instruction Set Processors Using nML" (Proc. Euro. Design & Test Conf., Paris, Mar. 1995, IEEE 1995, 5 pp.).

Internet Publication http://www.retarget.com/brfchsch-k.html (19 pp) No date.

Internet Publication http://www.synopsys.com/products/designware/8051_ds.html (8 pp) No date.

Internet Publication http://www.synopsys.com/products/designware/dwpci_ds.html (16 pp) No date.

Internet Publication http://www.lexra.com/product.html (11 pp) No date.

Internet Publication http://www.risccores.com/html/body_aboutarc,htm (13 pp) No date.

Clucas, R., "Designing with a customisable miscroprocessor core," Electronic Eng'g, vol. 71, No. 865, Feb. 1, 1999, p. 35.

Hogl, H., et al., "Enable + +: A General–Purpose L2 Trigger Processor," Nuclear Science Symp. & Medical Imaging Conf., vol. 2, Oct. 21–28, 1995, pp. 667–671.

Wollan, V., "A Design Methodology Achieving Fast Development Cycles for Complex VLSI Architectures," Proc. on the European Conf. on Design Automation, Feb. 22–Mar. 25, 1993, pp. 532–535.

Tensilica, Inc; Xtensa Instruction Set Architecture (ISA) Reference Manual Revision 1.0. (First 25 pages).

Tensilica, Inc. Instruction Extension Language (TIE) Reference Manual Revision 1.3.

Compton et al., "Configurable Computing: A Survey of Systems and Software," Technical Report, Northwestern University, Dept. of ECE, 1999.

Hauk et al., "The Chimaera Reconfigurable Functional Unit." Proceedings of the IEEE Symposium on Field–Programmable Custom Computing Machines, 1997.

Razdan et al., "A High–Performance Microarchitecture with Hardware–Programmable Function Units," Proceedings of MICRO–27, Nov. 1997.

Wang et al., "Hardware/Software Instruction Set Configurability for System–on–Chip Processors," Proceedings of Design Automation Conference, 2001.

Berekovic, Mladen, et al., A Core Generator for Fully Synthesizable and Highly Parameterizable RISC–Cores for System–On–Chip Designs, 1998 IEEE Workshop on Signal Processing Systems, pp. 561–568, XP–002137267.

Yang, Jin–Hyuk, et al., "MetaCore: A Configurable & Instruction–Level Extensible DSP Core," Proceedings of the ASP–DAC '98 Asian and South Pacific Design Automation Conference 1998, pp. 325–326, XP–002137268.

* cited by examiner

METHOD AND APPARATUS FOR MANAGING THE CONFIGURATION AND FUNCTIONALITY OF A SEMICONDUCTOR DESIGN

The present application claims priority to U.S. Provisional Patent Application Ser. No. 60/104,271, entitled "Method and Apparatus for Managing the Configuration and Functionality of a Semiconductor Design" filed Oct. 14, 1998.

Copyright

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. Field of the Invention

The invention relates generally to the field of integrated circuit design. More specifically, the invention provides a method for managing the configuration, design parameters, and functionality of an integrated circuit design in which custom instructions and other elements may be arbitrarily controlled by the designer.

2. Description of Related Technology

Several types of computer-aided design (CAD) tools are available to design and fabricate integrated circuits (IC). Such computer-aided or automated IC design tools can include modules or programs addressing both the synthesis and optimization processes. Synthesis is generally defined as an automatic method of converting a higher level of abstraction to a lower level of abstraction, and can include any desired combination of synthesis techniques which occur at various levels of abstraction. So-called "behavioral synthesis" is a design tool wherein the behavior (e.g. inputs, outputs, and functionality) of a desired IC are entered into a computer program to design a device that exhibits the desired behavior. Such tools permit IC designers to produce increasingly complex and capable devices, sometimes having logic gate counts in the tens of millions, with few or no errors and in a much shorter time period than would be otherwise possible with manual design techniques such as hand layouts.

Examples of synthesis processes which involve different levels of abstraction include architectural level synthesis and logic level synthesis, both of which may be incorporated into the IC design process.

Architectural level synthesis is primarily concerned with the macroscopic structure of the circuit; it utilizes functional blocks (including information relating to their interconnections and internal functionality). Architectural level synthesis includes register transfer level (RTL) synthesis, which can have multi-bit components such as registers and operators.

Logic level synthesis, on the other hand, is concerned with gate level design. Logic level synthesis determines a microscopic structure of a circuit and transforms a logic model into an interconnection of instances of library cells. The result of the logic level synthesis is a netlist of logic devices and their interconnections. Logic-level synthesizers (so-called synthesis "engines") are available from several commercial vendors.

The synthesis process generally begins with the designer compiling a set of IC specifications based on the desired functionality of the target device. These specifications are then encoded in a hardware description language (HDL) such as VHDL® (VHSIC hardware description language) available from IEEE of New York, NY, or Verilog® available from Cadence Design Systems, Inc. of Santa Clara, Calif. The specifications define an IC in terms of the desired inputs and outputs, as well as desired functionality such as available memory or clock speed. From the HDL, the designer then generates a "netlist" including a list of gates and their interconnections, which is descriptive of the circuitry of the desired IC. Ultimately, the design is compiled and masks fabricated for producing the physical IC. FIG. 1 illustrates a typical prior art IC design and fabrication approach.

Unfortunately, while well suited for simpler devices and single components, the aforementioned prior art approaches to automated IC design suffer several limitations, especially when applied to the design of more complex ICs such as CPU-based processors. These problems stem largely from the requirement that the instruction set be fixed prior to, and not modifiable during, the design and synthesis processes, thereby reducing the flexibility and capability afforded the designer both during and after the design process. These problems are highlighted by the practice of supplying predefined CPU designs to users desiring to integrate a processor into their systems Integrated Circuit design. Specifically, by not being able to consider certain instructions, functions, or components in the design during synthesis, the designer is required to attempt to "backfit" these elements to the design, which often times creates compatibility issues or other problems. This disability also effectively precludes optimization of the design for certain parameters (such as die size or clock speed) since the resulting design necessarily has a higher gate count, and does not have the benefit of customized instructions specific to the desired architecture and functionality. Furthermore, such prior art systems are incapable of automatically assembling a HDL model of the complete processor and simulating its operation, an approach which can greatly increase the efficiency and effectiveness of the design process.

Based on the foregoing, an improved method (and associated apparatus) is needed for managing the configuration, design parameters, and functionality of an integrated circuit design in which the instruction set can be interactively varied by the user. Specifically, such an improved method would permit the user to add or subtract existing instructions, as well as generate new instructions specifically adapted for use with the design, while retaining the ability to verify the accuracy and correctness of the VHDL model and the subsequent synthesized logic or layout. Additionally, the improved method would allow the user to generate descriptive models of the complete processor as opposed to just individual logic circuits or modules, thereby further enhancing the simulation and synthesis processes. Furthermore, the user could automatically or interactively select various design parameters (such as the existence of a memory interface or peripheral component) during the design and synthesis processes to preclude having to retrofit or modify the design at a later time. This latter ability would greatly enhance the integration of such components into the design, thereby effectively eliminating incompatibilities, and reducing the resulting IC to its smallest possible dimension, clock speed, and power consumption, with the least amount of effort and cost.

SUMMARY OF THE INVENTION

The present invention satisfies the aforementioned needs by providing an automated means of managing the configuration, design parameters, and functionality of an integrated circuit design, through the use of an interactive computer program.

In a first aspect of the invention, an improved method for managing the configuration, design parameters, and functionality of an integrated circuit design is disclosed. In one embodiment of the disclosed method, the user inputs information relating to the design hierarchy and HDL library files, and generates a computer program script based on these inputs. Custom instructions and other elements (such as special-purpose registers, new condition code choices, local scratchpad RAM, or a library of multimedia extensions for 3D or DSP applications) may be arbitrarily added to the existing HDL instruction set by the designer as well during the design process. Unlike adding an external ASIC or other component post-synthesis, these instructions become included within the processor instruction and register set so as to eliminate integration problems, and allow maximal optimization based on one or more selected attributes. Ultimately, the generated script is run, and a customized HDL model of the IC is produced based on the user-defined instruction set. This customized HDL model is then used as the basis for further simulation and/or synthesis as desired by the designer. This method further affords the designer the ability to generate an HDL model of the entire IC, thereby greatly enhancing the efficiency of the design process. This ability is especially useful for complex CPU- based processor designs, although it may readily be applied to other types of components.

In a second aspect of the invention, the aforementioned method is further embodied in a menu-driven computer program which may be used in conjunction with a microcomputer or other similar device for designing and managing the configuration of integrated circuits. In one exemplary embodiment, this menu-driven computer program comprises a series of routines or "modules" which perform various sets or groups of related functions. An interactive architecture module gathers information about the designer's system, available libraries, and the design configuration to be generated. A hierarchy generation module assists in ordering logical blocks or entities and routing signals within the design, as well as ultimately generating a netlist. An HDL generation module generates a merged HDL file descriptive of the design. In the exemplary embodiment, these modules are connected together via computer programs scripts or user initiated execution of the individual modules. In yet another embodiment, these modules may also be compiled into one comprehensive program, and bundled with other software tools that facilitate rapid and integrated design of the subject IC on a standard microcomputer.

In a third aspect of the invention, an apparatus for generating, simulating, and/or synthesizing an integrated circuit design using the aforementioned method is disclosed. In a first embodiment, a microcomputer having a microprocessor, display, and input device is used to run the previously described menu-driven computer program, thereby allowing the designer to interact with the program during the design, simulation, and/or synthesis processes. The microcomputer further includes a storage device and network interface to allow for the storage, retrieval, and sharing of information between two or more microcomputers configured with the aforementioned computer program.

In a fourth aspect of the invention, an integrated circuit design depicted in a hardware description language and synthesized using the aforementioned method of the invention is disclosed.

In a fifth aspect of the invention, an integrated circuit fabricated using the aforementioned synthesized design is disclosed. In one exemplary embodiment, the integrated circuit comprises a reduced instruction set CPU (RISC) processor.

In a sixth aspect of the invention, a data storage device adapted for use with a computer system and comprising in part the aforementioned computer program is disclosed.

DETAILED DESCRIPTION OF THE INVENTION

Figure 1:
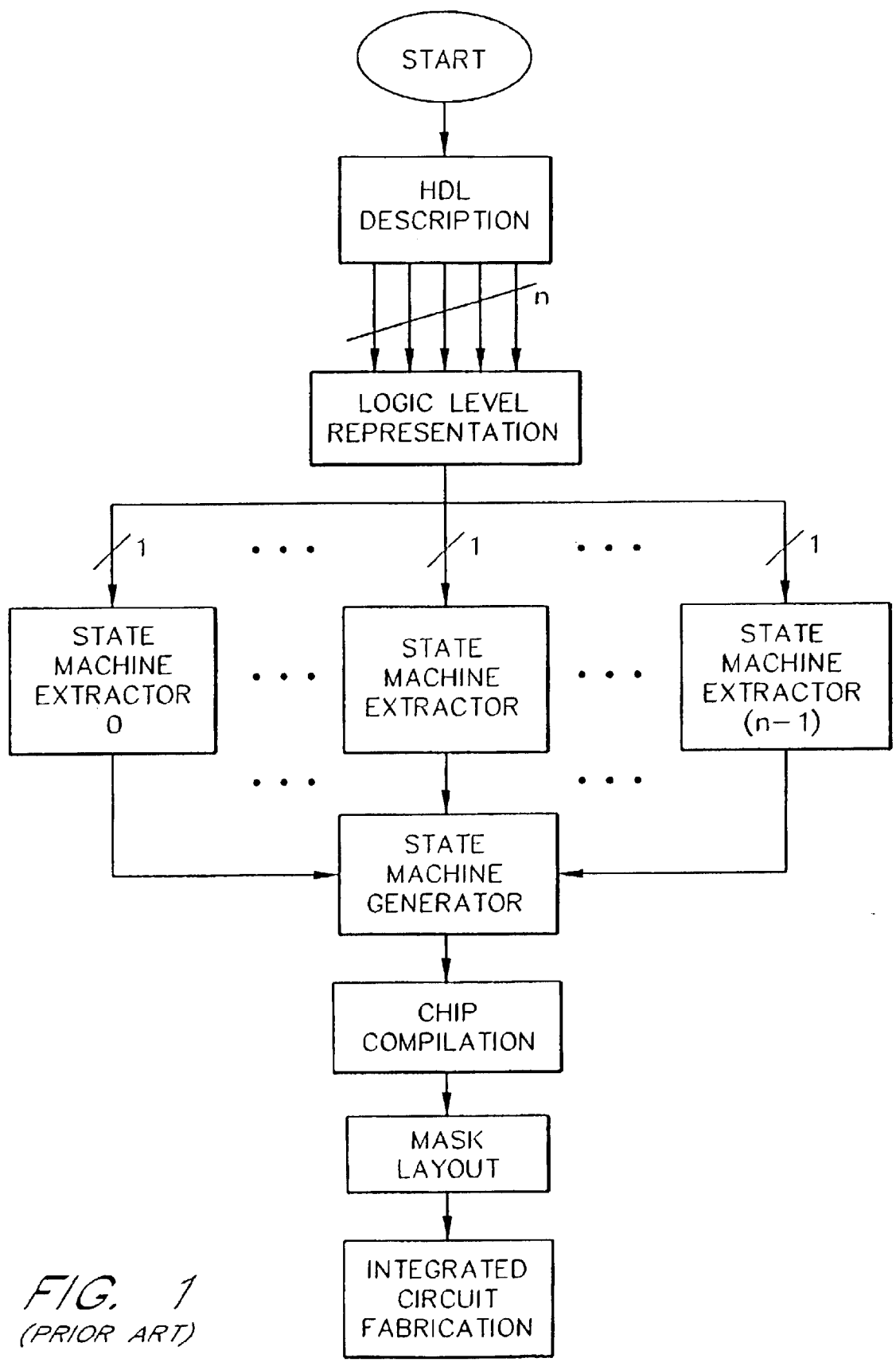
FIG. 1 is a flow diagram illustrating a typical prior art integrated circuit design and synthesis method.

Reference is now made to the drawings wherein like numerals refer to like parts throughout.

As used herein, the terms "computer program," "routine," "subroutine," and "algorithm" are essentially synonymous, with "computer program" being used typically (but not exclusively) to describe collections or groups of the latter three elements. In general, however, all of the aforementioned terms as used herein are meant to encompass any series of logical steps performed in a sequence to accomplish a given purpose.

Also, while the following description relates explicitly to the VHDL environment, it can be appreciated that the general principles and functionality of the present invention may be embodied in other description language environments including, for example, Verilog®.

BACKGROUND OF "ARC™"

In the following discussion, the term "ARCT" (ARC RISC Core) refers to a microprocessor-like central processing unit (CPU) architecture. While the method of present invention can be applied to other types of integrated circuits including, for example, application specific integrated circuits (ASICs) and field-programmable gate arrays (FPGAs), the microprocessor-like CPU design is chosen to more clearly illustrate the operation and capability of the invention.

As discussed in greater detail below, the present invention takes in one embodiment the form of a computer program having a synthesizable and customizable (i.e., "soft") macro with a complementary suite of software tools for configuration and hardware-software co-design. This computer program employs the concept of a "system builder" to accomplish much of the desired functionality. In the present context, the ARC system builder refers to that portion or module of the computer program whereby the designer controls the generation of the subject CPU design. In one particular embodiment, the system builder directs the assembly of a series of predefined VHDL based designs along with design elements created by the user (also in VHDL, or whatever other description language is chosen) to produce a new, custom CPU specific to the user's specifications and needs. Hence, the system builder controls the creation and testing of HDL-based synthesizable CPUs. This approach further provides users with a great deal of flexibility in configuring the specific attributes of the resulting CPU.

The ARC System builder is embodied in a series of "scripts" that allows users to build customized ARC systems along with support files for both design simulation and synthesis. A script is more specifically a computer program, often written in a special computer programming language designed for the purpose. Such script languages include for example the "perl" and language commonly employed in UNIX based computer systems as a "scripting language." There are other languages available to write scripts compatible with the present invention. It is noted that for the purposes of the present discussion, the term "scripts" refers to any series of logical instructions or actions of a computer program which are executed in a predefined order.

When executed, the ARC system builder script produces a series of questions, answered primarily through menus (as illustrated in greater detail below in the exemplary menu structure of Appendix I), the answers to which are used to build the VHDL simulator and synthesis files. An installation script allows several different ARC features to be selected, such as processor cache size and cache line length, size of external memory space to be cached, and clock period/skew. The script creates a working directory for the user, and further generates various VHDL files necessary to support further customized VHDL development.

The term "makefile" as used herein refers to the commonly used UNIX makefile function or similar function of a computer system well known to those of skill in the computer programming arts. The makefile function causes other programs or algorithms resident in the computer system to be executed in the specified order. In addition, it further specifies the names or locations of data files and other information necessary to the successful operation of the specified programs. It is noted, however, that the invention disclosed herein may utilize file structures other than the "makefile" type to produce the desired functionality.

Central to the method of the invention is the concept that one computer program may write another program, which is subsequently executed by the computer system. For example, one script may write a second script that is tailored by user input to perform a special task. The task is then performed when the second script is executed. This "dynamic scripting" is employed in various aspects of the invention, as further described herein.

DETAILED DESCRIPTION OF METHOD

Figure 2:
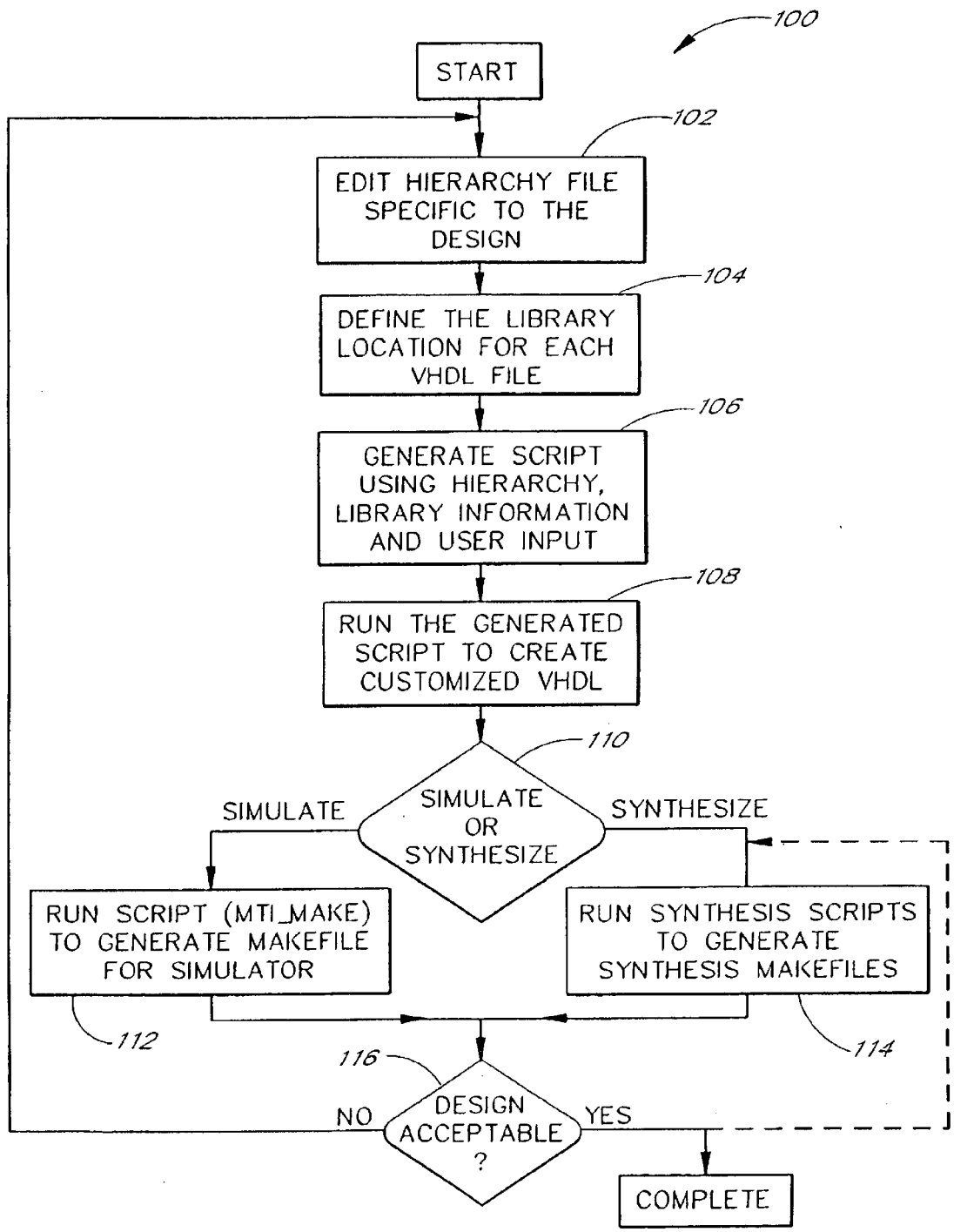
FIG. 2 is a flow diagram illustrating the general integrated circuit design and synthesis method of the invention.

Referring now to FIG. 2, one embodiment of the generalized method of the invention is described. While this description is presented in terms of an algorithm or computer program running on a microcomputer or other similar processing device, it can be appreciated that other hardware environments (including minicomputers, workstations, networked computers, "supercomputers", and mainframes) may be used to practice this method 100. Additionally, one or more portions of the computer program may be embodied in hardware or firmware as opposed to software if desired, such alternate embodiments being well within the skill of the computer artisan.

Initially, the hierarchy file specific to the processor design under consideration is edited in the first step 102. Specifically, desired modules or functions for the design are selected by the user, and instructions relating to the design are added, subtracted, or generated as necessary. For example, in signal processing applications, it is often advantageous for CPUs to include a single "multiply and accumulate" (MAC) instruction. This instruction commonly improves system performance and reduces the amount of computer code required to perform signal processing tasks; two desirable characteristics in such systems. Conversely, applications that are essentially logical control oriented in nature have little or no need for such an instruction. Eliminating the instruction from a purpose-built CPU reduces the CPU die size and gate count, also a generally preferred advantage. In still another case, an instruction that is only of value to one specific application may be defined and implemented by designers. In all of these examples, the present invention permits designers a greater degree of control over the CPU design and more flexibility in making design tradeoffs and optimizations.

It should also be recognized that when using the system builder of the present embodiment in its most common mode, the hierarchy of design is determined by the script, and a "hierarchy builder" is called by the script builder.

In step 104 of the method of FIG. 2, the technology library location for each VHDL file is defined by the user. The technology library files in the present invention store all of the information related to cells necessary for the synthesis process, including for example logical function, input/output timing, and any associated constraints. In the present invention, each user can define his/her own library name and location(s), thereby adding further flexibility.

A makefile is then generated in the third step 106 using the hierarchy file information, library information previously described, as well as additional user input information relating to the desired configuration and attributes of the device. For example, in the ARC system builder, the user is asked to input the type of "build" (e.g., overall device or system configuration), width of the external memory system data bus, different types of extensions, cache type/size, etc., as described in additional detail below with respect to FIGS. 3a–3e. It will be recognized that such user input may be in the form of an interactive software prompt, or alternatively may occur using command line parameters, by accessing a pre-built configuration file, or a concurrently running application or other computer program resident on the designer's system or another system linked thereto. Many other methods of input are also possible, all of which are considered to be within the scope of the invention.

Next, the makefile generated in the third step 106 is run in a fourth step 108 to create a customized VHDL model. As part of this step, the user is presented with a variety of optional response menus and prompts to further define the VHDL model based on his/her desired attributes.

At this point in the program, a decision is made whether to synthesize or simulate the design (step 110). If simulation is chosen, a separate script ("MTI-make"in the present embodiment) is run in step 112 to generate a separate simulation makefile for use in the simulation. Simulation scripts and makefiles are generally well known to those of ordinary skill in the art, and accordingly will not be discussed further herein. Alternatively, if synthesis is chosen, the synthesis script(s) (e.g., "synopsys_make") are run in step 114 to generate corresponding synthesis makefiles. After completion of the synthesis/simulation scripts, the adequacy of the design is evaluated in step 116. For example, a synthesis engine may create a specific physical layout of the design that meets the performance criteria of the overall design process yet does not meet the die size requirements. In this case, the designer will make changes to the control files, libraries, or other elements that can affect the die size. The resulting set of design information is then used to re-run the synthesis script.

Note that there are many different criteria that may be used to determine whether or not a design is acceptable. In general, each design will have a different set of criteria used to determine the acceptability of the final design. Die size, power consumption, clock speed, and numerous other factors may constitute alone or collectively design constraints or targets. This great variability in acceptance criteria is one factor that demands the flexibility of the present invention.

If the generated design is acceptable, the design process is completed. If the design is not acceptable, the process steps beginning with step 102 are re-performed until an acceptable design is achieved. In this fashion, the method 100 is iterative. Note that if the simulation path 112 is chosen in order to simulate the operation of the generated design, the user may subsequently run the synthesis scripts per step 114 (dotted line in FIG. 2) if desired to synthesize the logical design into a physical structure.

Appendix I illustrates the operation of an algorithm utilizing the method of FIG. 2. In Appendix I, several explicit examples illustrating various menu structures, design considerations, and user input options are presented. Note that these examples are merely illustrative of the general process performed by the user in practicing the method of the present invention using the VHDL software embodiment set forth herein.

Appendix II is a list of the VHDL script files used in conjunction with the VHDL embodiment of the algorithm of the present invention.

It is noted that while the source code for the embodiment of the computer program set forth herein is written using AWK, a programming language commonly found on UNIX workstations, but also available on other personal computers, the program may be embodied using any of a number of different programming languages such as, for example, C++. The source code directed to the exemplary AWK embodiment of the invention described herein is set forth in Applicant's aforementioned Provisional U.S. Pat. Application No. 60/104,271, which is incorporated herein by reference in its entirety.

Figure 2A:
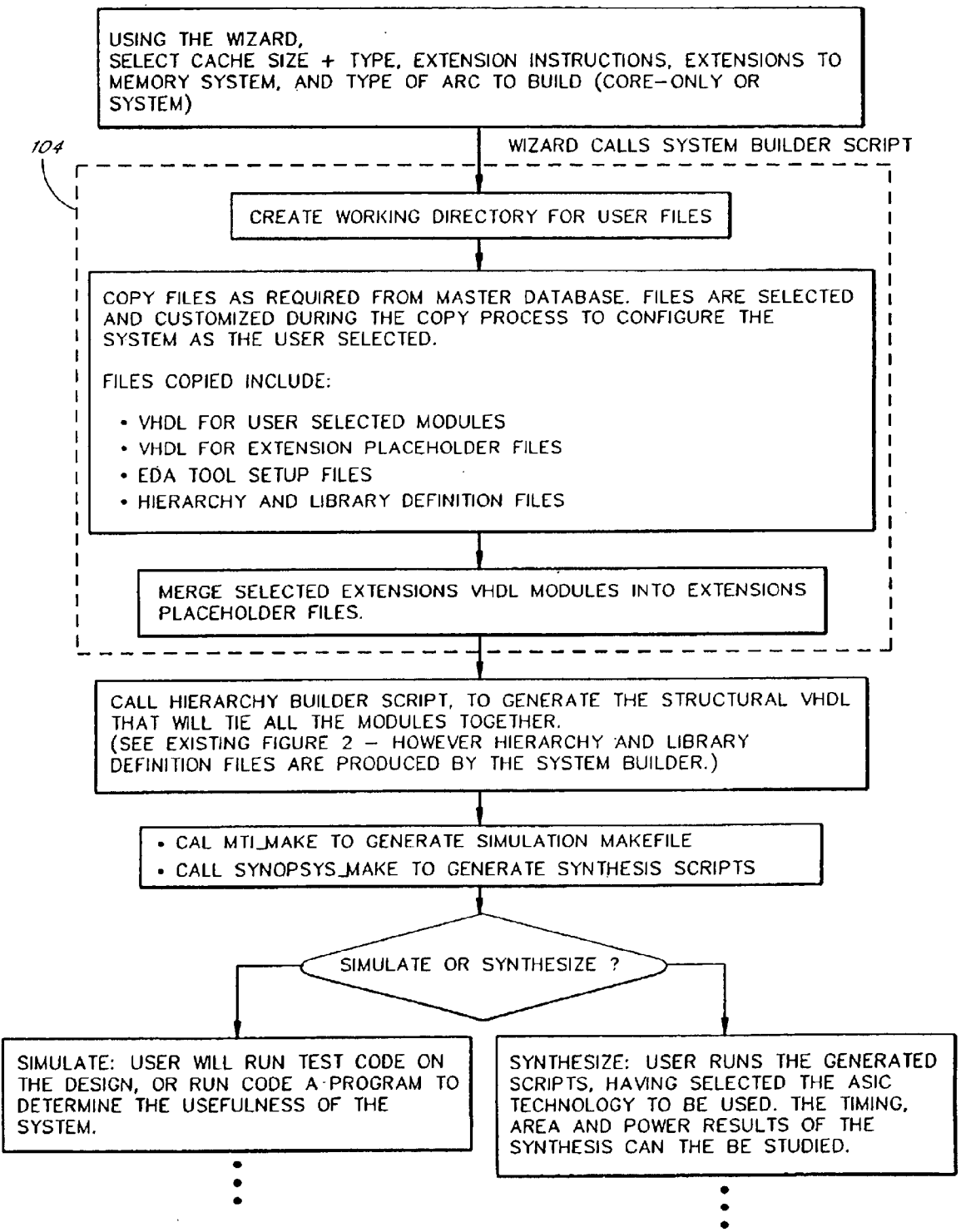
FIG. 2a is a flow diagram illustrating one specific embodiment of the generalized method of FIG. 2.

Referring now to FIG. 2a, one specific embodiment of the general method of FIG. 2 is described. In this embodiment, certain steps of the method depicted in FIG. 2 are separated into constituent parts for illustration purposes. For example, step 102 of FIG. 2 is separated into an interactive ("wizard") component and a hierarchy generator ("hiergen") component (not shown). The interactive component of step 102 provides substantially all of the direct user interaction control. Through a series of questions answered by the user, the program selects the relevant design elements necessary to realize the user's design. Portions of this information are used by the hierarchy generator to create a makefile script that is executed to build the HDL hierarchy.

Similarly, the step 104 of defining the library location for each VHDL file in FIG. 2 corresponds to the steps of (i) creating a working directory 204, (ii) copying files from a master database 206, and merging the selected extension VHDL modules into placeholder files 208. The remainder of method 100 depicted in FIG. 2a generally parallels that of FIG. 2.

It will be appreciated by one skilled in the relevant art that there are a large number of alternative partitionings or structures of the flowchart of FIG. 2, each of which results in the same or similar sets of scripts, makefiles, and other design data for a given set of input data. Further, it may be advantageous for additional data or partitionings to be selected in order to utilize commonly available tools for executing portions of the method 100. Also, the order of performance of several of the individual steps present in the method of FIG. 2 (and FIG. 2a) may be permuted without departing from the invention as disclosed herein.

Referring now to FIGS. 3a–3e, one embodiment of the architecture functionality of the invention ("ARChitect™") is described in detail. The architecture module essentially gathers information about the designer's system, including for example, specifications from the designer's libraries, and assembles this information for later use by other modules within the program. The output of the ARChitect™ process is an HDL synthesizable model of the IC under design.

Figure 3A:
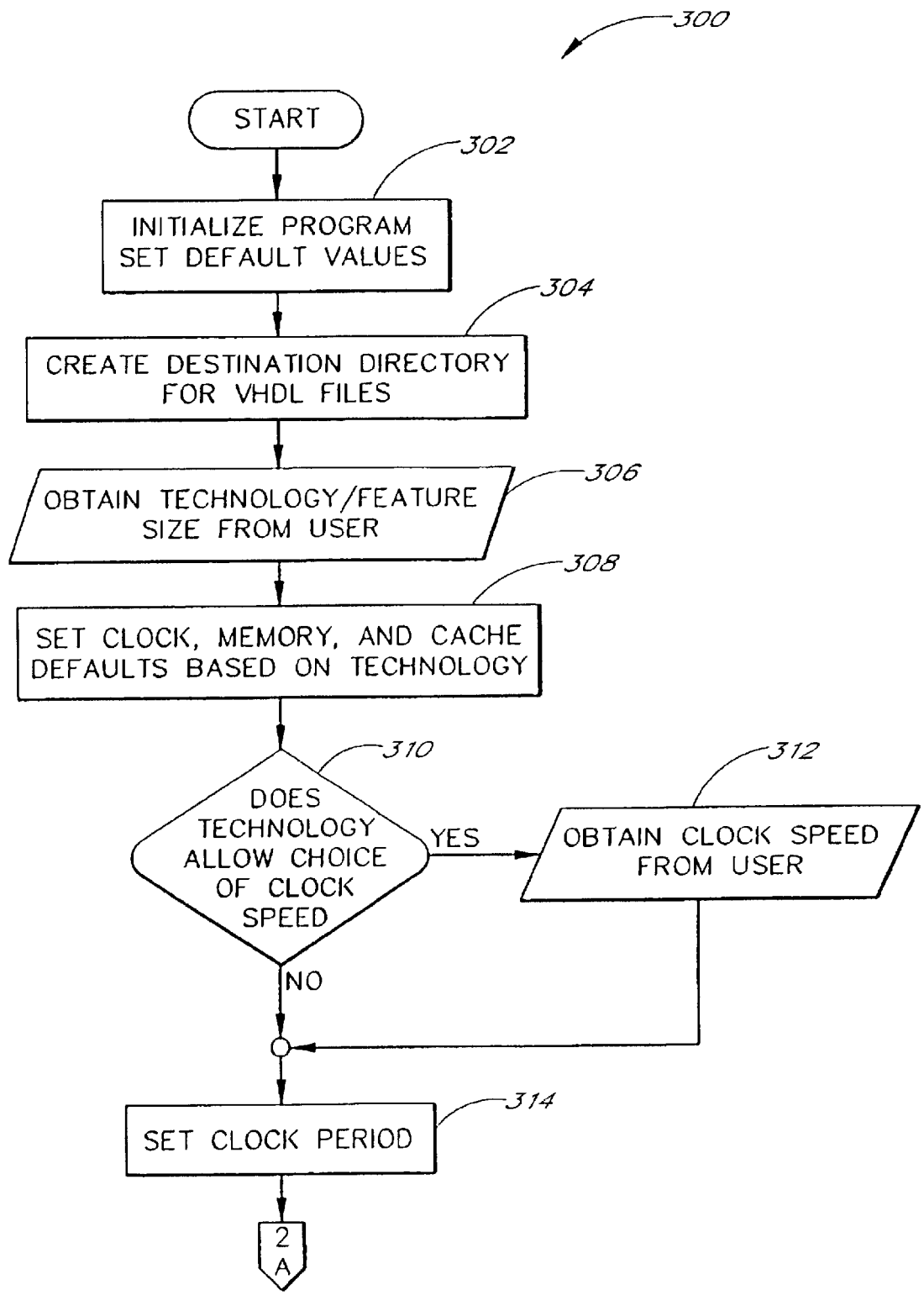
FIGS. 3a–3e collectively comprise a logical flow diagram illustrating one exemplary embodiment of the architecture module of the invention.

As shown in FIG. 3a, the process 300 specifically employed by the ARChitect™ module comprises a series of steps, the first of which is initializing the program and setting default values 302. Next, a destination directory is created in step 304 for the HDL (in this case VHDL) files to be generated in subsequent steps. In step 306, the technology/feature size is obtained from the user (or another source, as previously described). For example, the user may desire a 0.18 micron process for their design.

In step 308, the system clock, memory configuration, and cache default values are set based on the technology chosen in step 306 above. If the technology chosen by the user allows a choice of clock speed, the user is prompted (or the selection otherwise obtained) in steps 310 and 312. The clock period is then set per step 314.

Figure 3B:
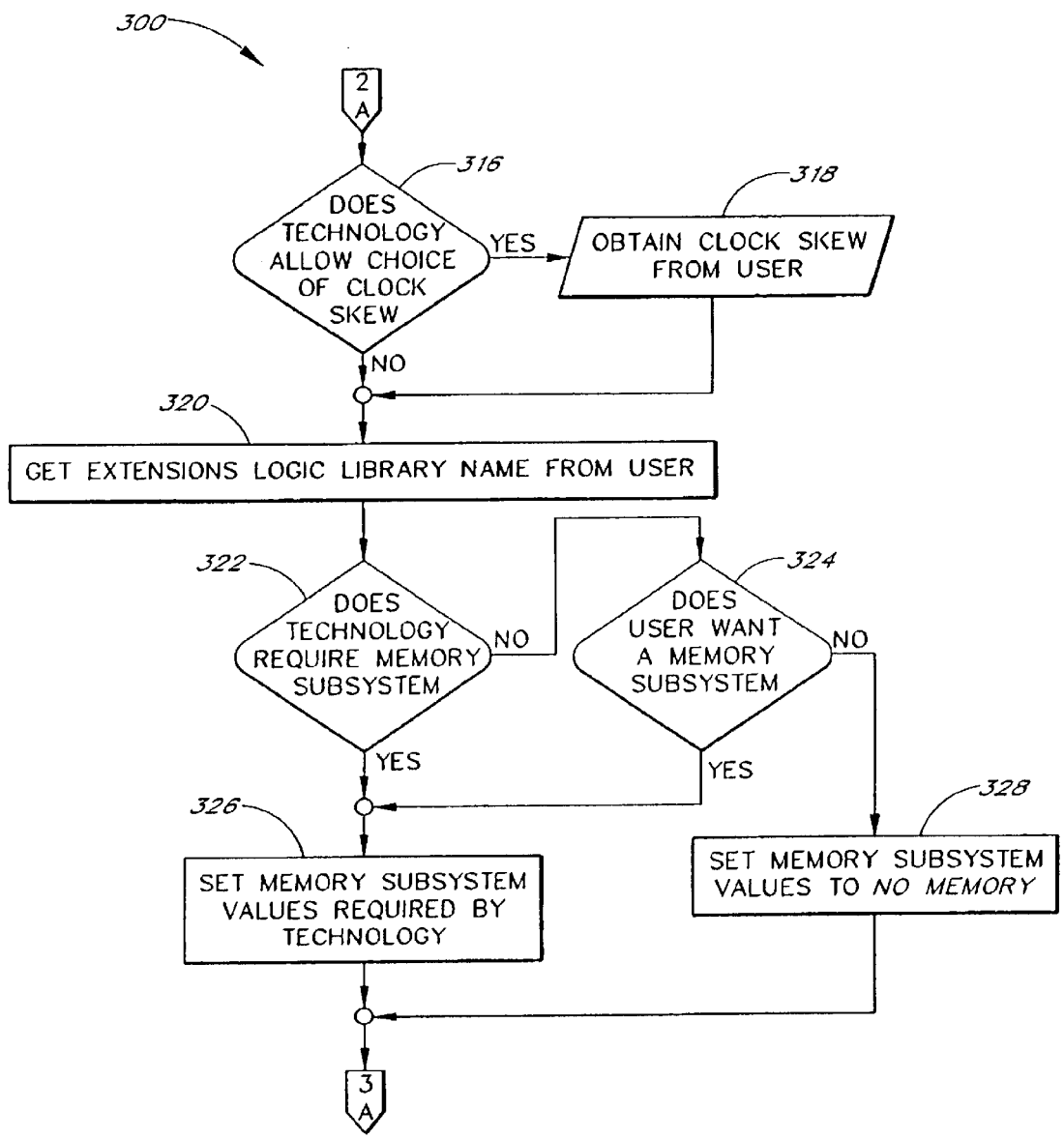

Referring now to FIG. 3b, the process 300 continues with steps 316 and 318, wherein the clock skew is selected (or otherwise defaulted). The extensions logic library name/location is then obtained from the user in step 320. As used herein, the term "extensions" refers to a set of predetermined logical functions. For example, extensions within the ARC system may include rotate, arithmetic and logical shifts within the barrel shifter, small multi-cycle multiply, MAC function, swap function (for swapping upper and lower bytes), timer interrupt, and the like. Lastly, in steps 322–328, the need or user desire for a memory subsystem such as a scratchpad RAM is analyzed (based on the user's technology choice), and the memory subsystem values are set accordingly.

Figure 3C:
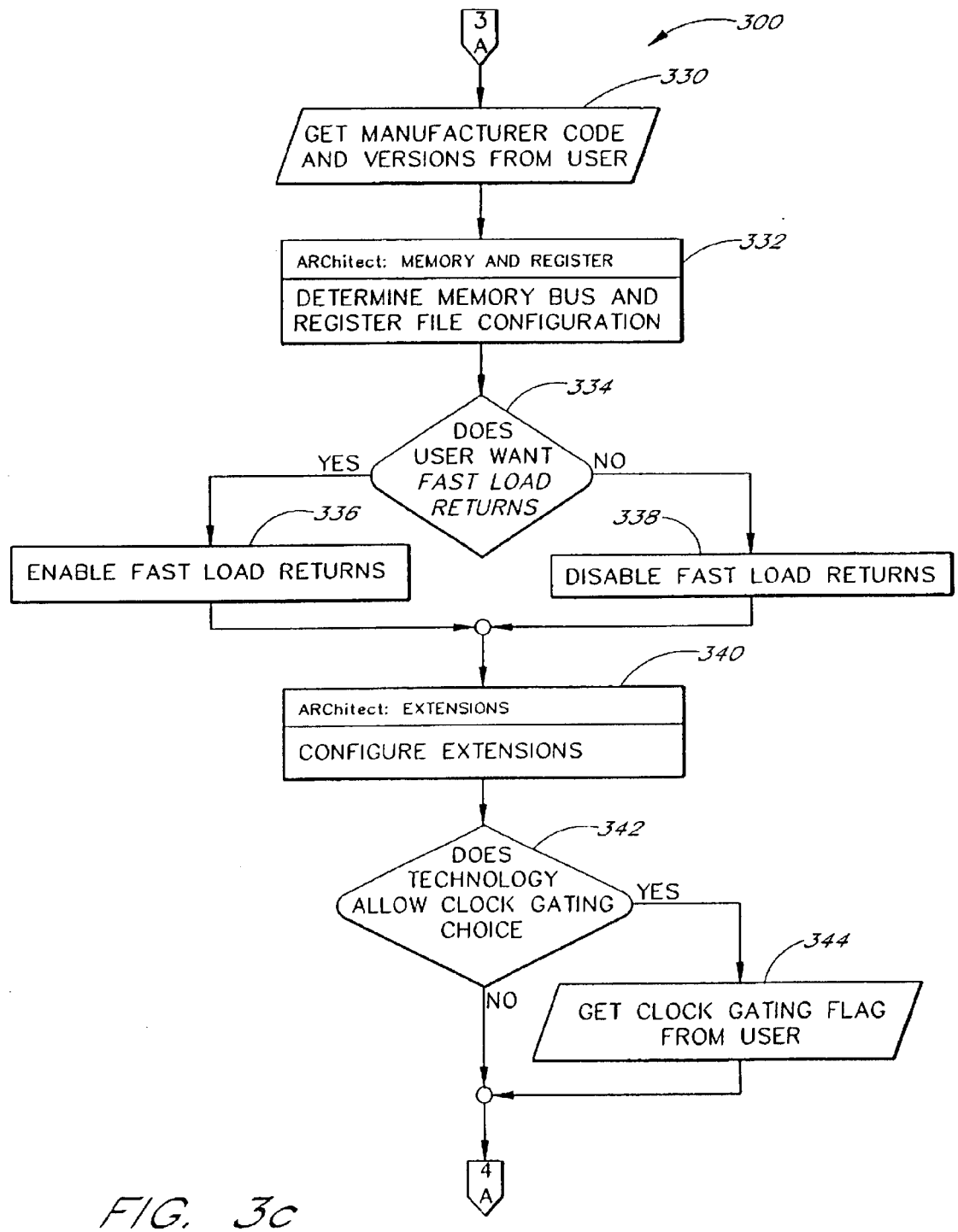

Referring now to FIG. 3c, the method 300 continues with step 330, wherein the user's manufacturer code (specific to each user entity) and version are obtained from the user. In step 332, the memory bus and register file configuration required for the design are determined; see the discussion of FIG. 4 herein for further details of this process. Once the memory/register configuration is determined, the user is prompted in step 334 to determine if the use of fast load returns is desired. As used herein, the term "fast load returns" refers to the condition in which the processor initiates a load operation but continues other execution before the load has been confirmed as being completed. Steps 336–338 allow the user to enable/disable this functionality, respectively, as desired.

Next, in step 340, the system configures the extensions used with the design as specified in step 320 described above. FIGS. 5a–5h depicts this process in greater detail, as discussed further below. The user's choice of technology (step 306) is then examined in step 342 to determine if clock gating is allowed; if so, the user is prompted for a clock gating flag in step 344.

Figure 3D:
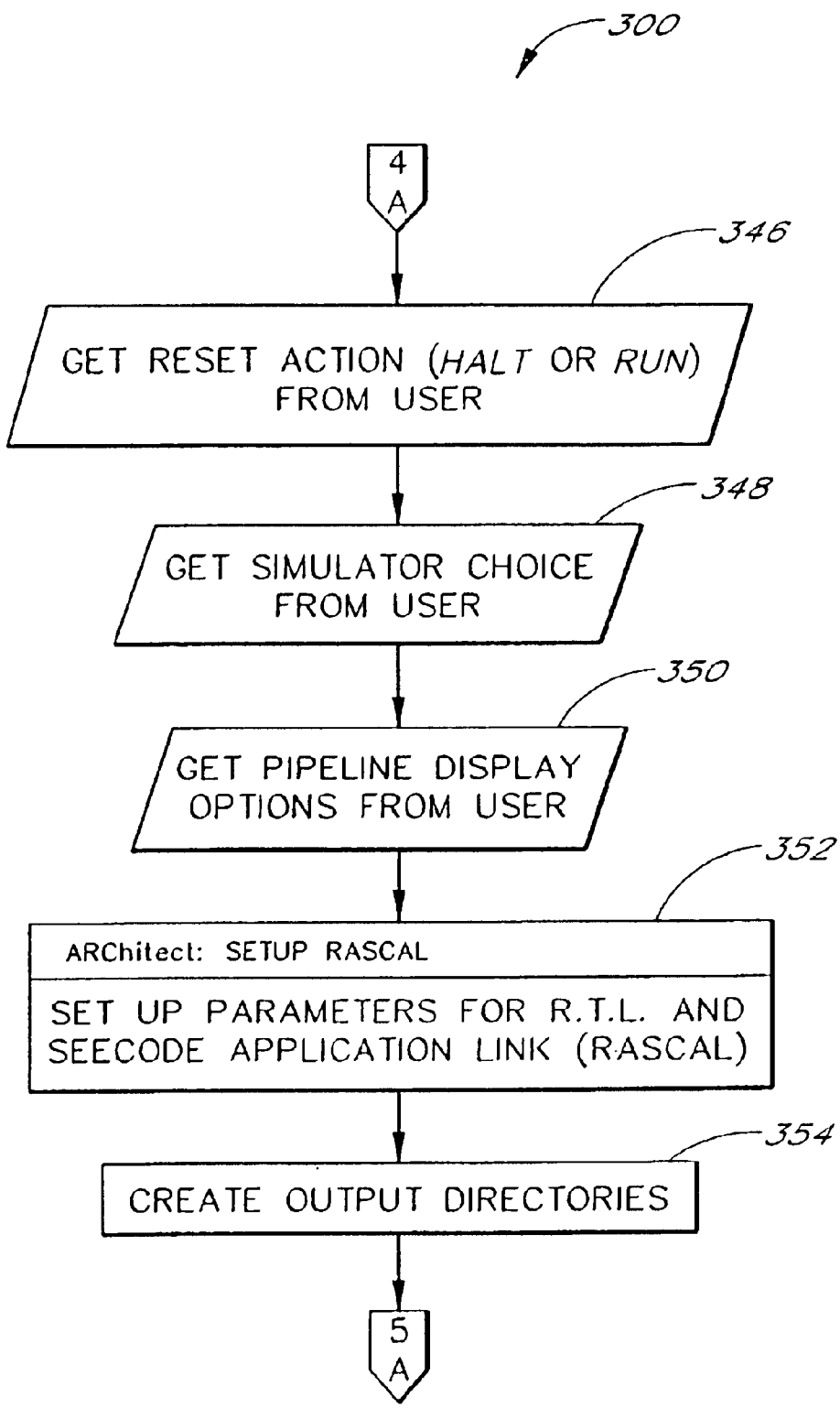

Referring now to FIG. 3d, the user is next prompted for a series of inputs including the desired reset action (i.e., "halt" or "run") per step 346, simulator choice (step 348), and pipeline display options (step 350). In step 352, the setup parameters for the register transfer link (RTL) and SeeCode Application Link ("RACAL™") are defined, as discussed in greater detail below with reference to FIG. 8. RASCAL™ is a utility module available from ARC Cores, Ltd. that connects the debugger module to the MTI simulator. This connection allows the debugger to control the simulation of code on the IC system model in the MTI simulator for hardware/software co-verification. The output directories for the files are then created in step 354.

Figure 3E:
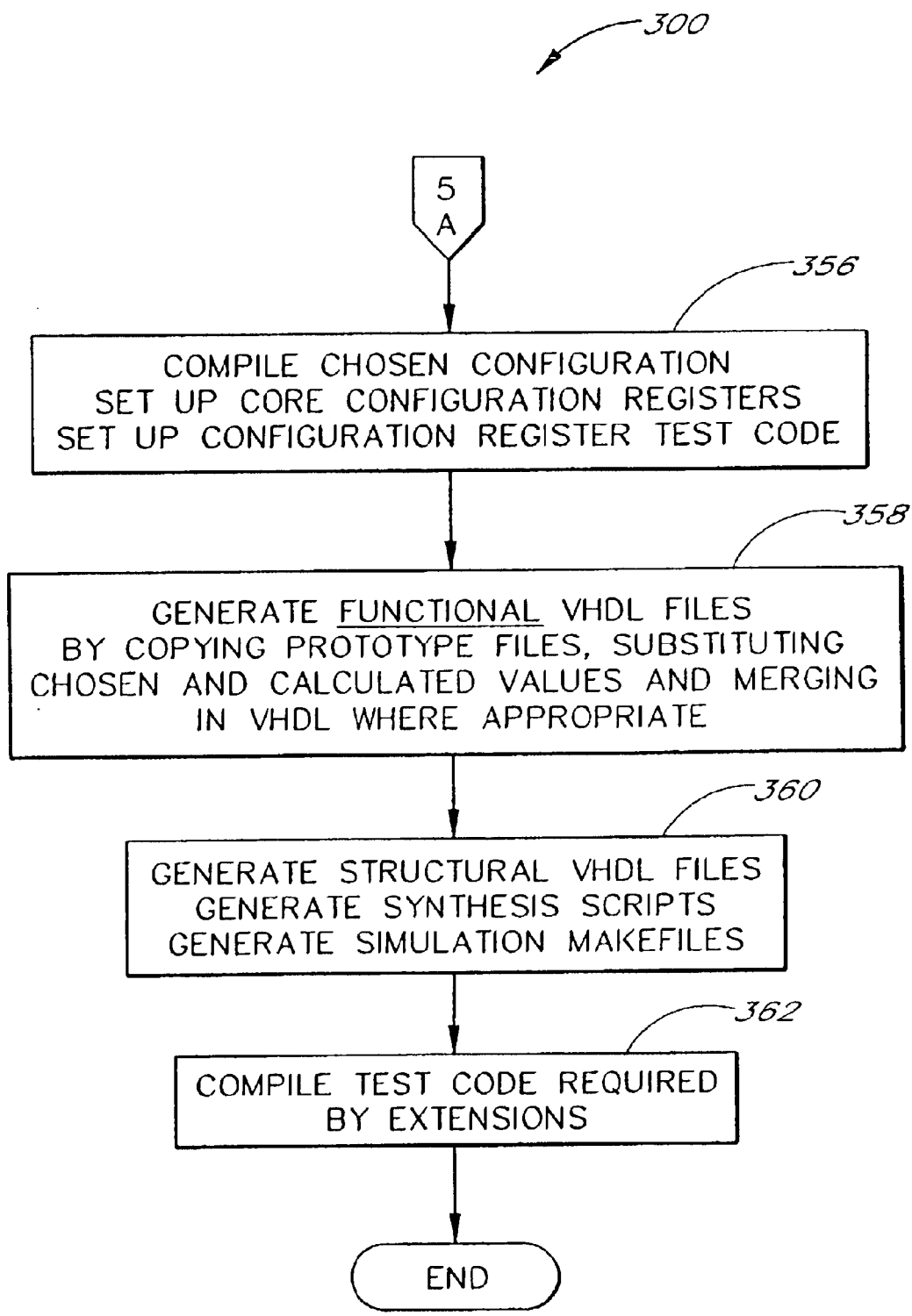

Referring now to FIG. 3e, the configuration is compiled, the core configuration registers and configuration register test code are set up per step 356. Next, in step 358, the functional HDL files are generated by (i) copying prototype files; (ii) substituting chosen and calculated values where required; and (iii) merging in the HDL where required. Note that in the illustrated embodiment, only the prototype files actually required for the selected configuration are copied.

In step 360, the structural HDL files are generated, along with the synthesis scripts and simulation makefiles. Lastly, the test code required by the chosen extensions is compiled in step 362.

Figure 4:
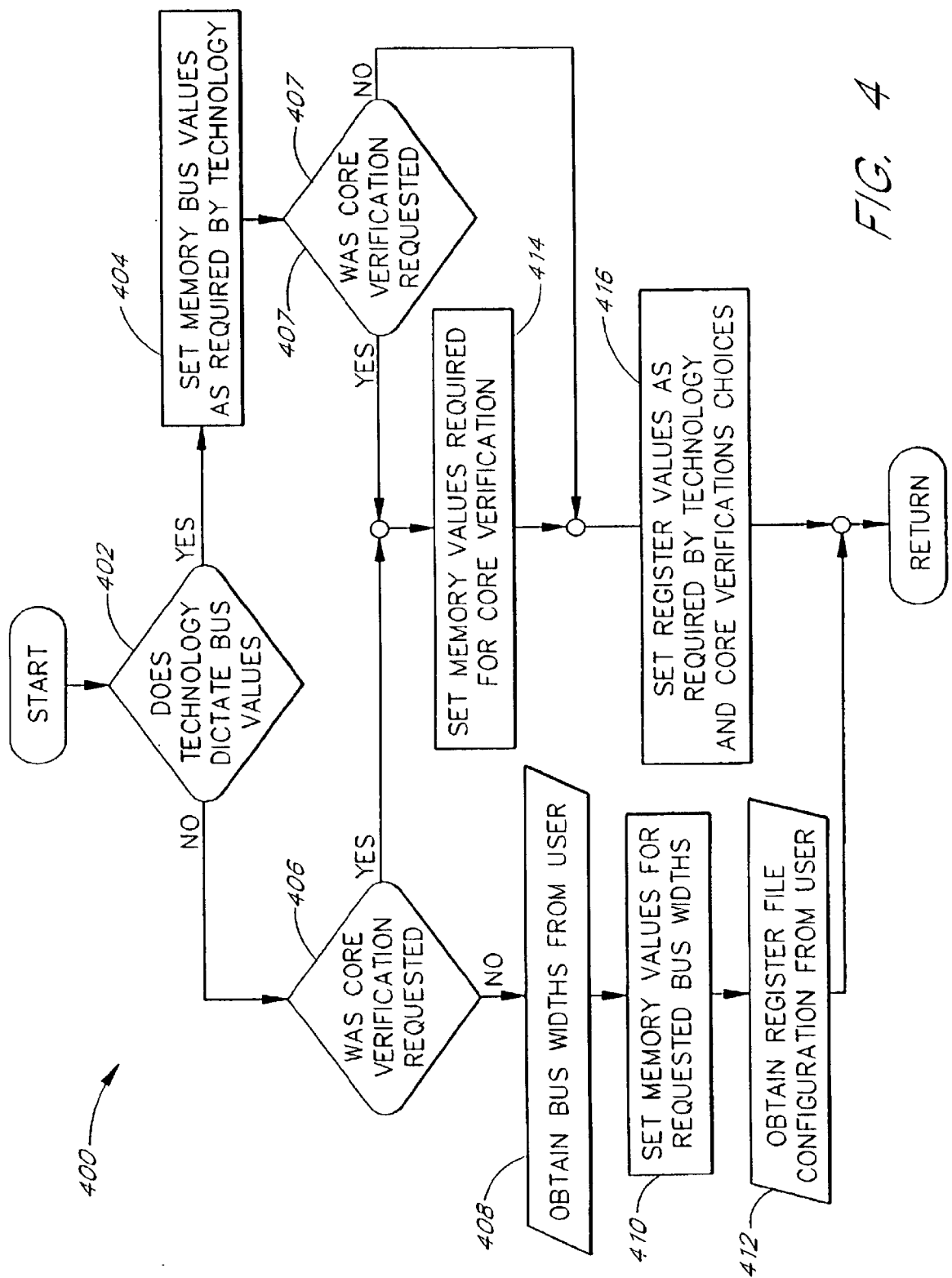
FIG. 4 is a logical flow diagram illustrating one exemplary embodiment of the method of determining the memory and register configuration of the system under design as shown generally in FIG. 3c herein.

Referring now to FIG. 4, one exemplary embodiment of the method of determining the memory and register configuration of the system under design as shown generally in step 332 of FIG. 3c is described. The method 400 comprises an initial determination in step 402 of whether the bus parameters are dictated by the technology previously chosen in step 306 (FIG. 3a). If the chosen technology requires specific bus values, these values are set in step 404. If not, (or alternatively, after setting the bus values in step 404), it is next determined whether core verification was requested by the user (steps 406, 407). If not, and the technology selected does not dictate the bus values, then the user is prompted to provide the desired bus widths in step 408. The memory values appropriate to the selected bus width are then set in step 410, and the user prompted for the desired register file configuration in step 412.

If core verification was requested by the user in steps 406 or 407, the memory values required for such verification are set in step 414, and the register values required by the selected technology and the core verification are set in step 416.

In the case that the technology selected does dictate the bus values, and core verification is not selected, then the register values are set per step 416 previously described.

Figure 5A:
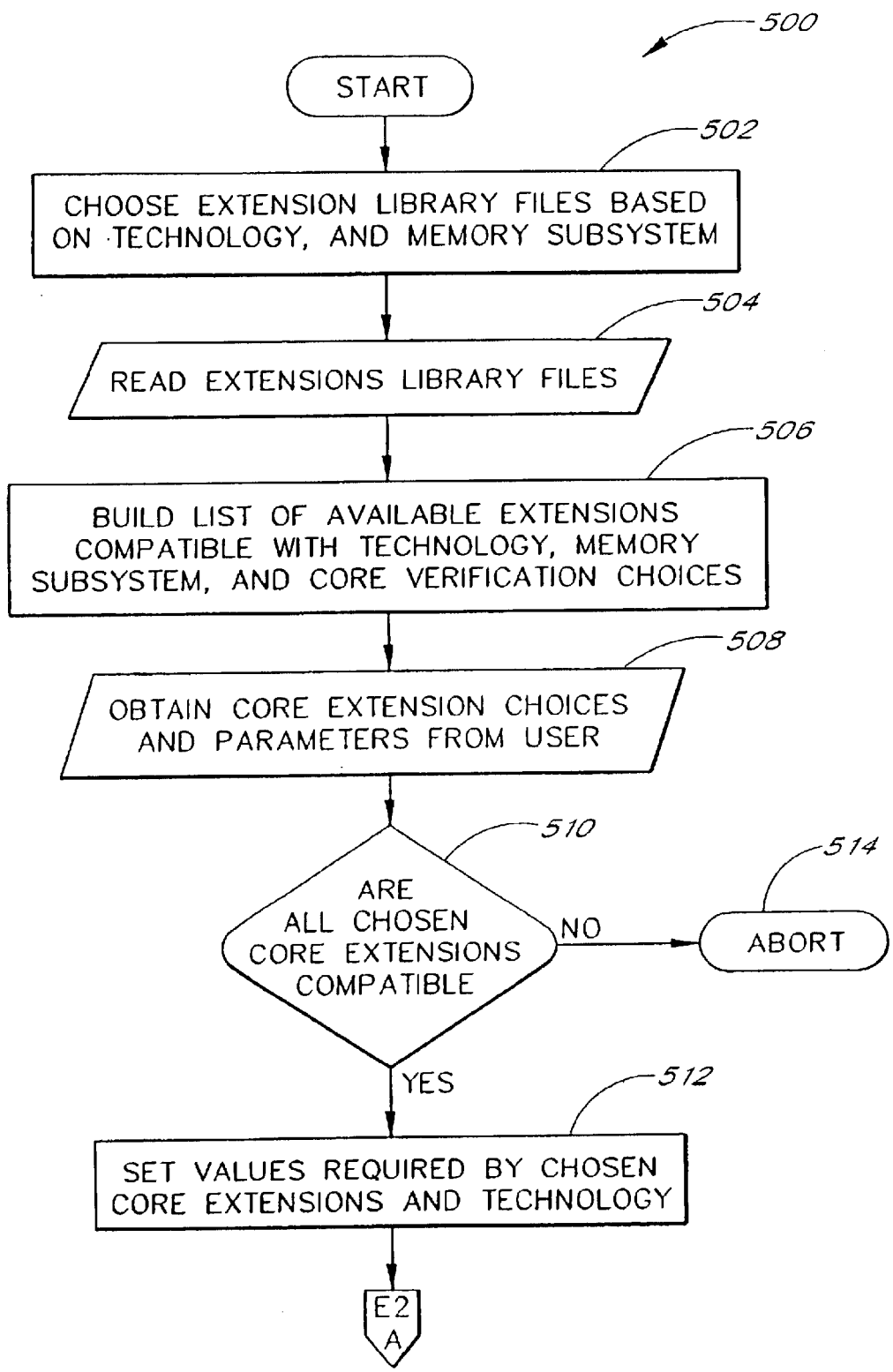
FIGS. 5a–5h collectively comprise a logical flow diagram illustrating one exemplary embodiment of the method of configuring file extensions as shown generally in FIG. 3c herein.

Referring now to FIGS. 5a–5h, one exemplary embodiment of the method of configuring file extensions as shown generally in step 340 of FIG. 3c herein is described. As illustrated in FIG. 5a, the method 500 comprises first choosing one or more extensions library files in step 502 based on the technology initially selected and the memory subsystem configuration previously discussed. In step 504, the chosen extensions library file(s) are read. A list of available extensions compatible with the selected technology, memory subsystem configuration, and core verification choices is then built in step 506. Next, the user is prompted for specific core extension choices and associated parameters in step 508. Specifically, extensions include core registers, ALU extensions that provide more operations, auxiliary registers, condition codes, FIFO (first in-first out memory), increasing the number of pending load/stores that may be issued, and interrupts. After the user input has been received in step 508, each of the user core extension choices is analyzed to determine if it is compatible with the other choices made by the user (step 510). If so, the values required by those user selected core extensions are set in step 512. Note that the selection of some extensions will require the selection of other extensions which are needed for support functions. If not, the extension algorithm 500 is aborted in step 514, and restarted. It will be recognized that step 510 herein may be accomplished interactively, such that when the user is making selections in step 508, they will be immediately apprised of the compatibility of the extensions chosen. Alternatively, the method 500 may be structured such that the system will not allow incompatible choices, either by prompting the user to make another selection, or only presenting the user with compatible choices to choose from. (such as on a display menu). Many other approaches are possible as well.

Figure 5B:
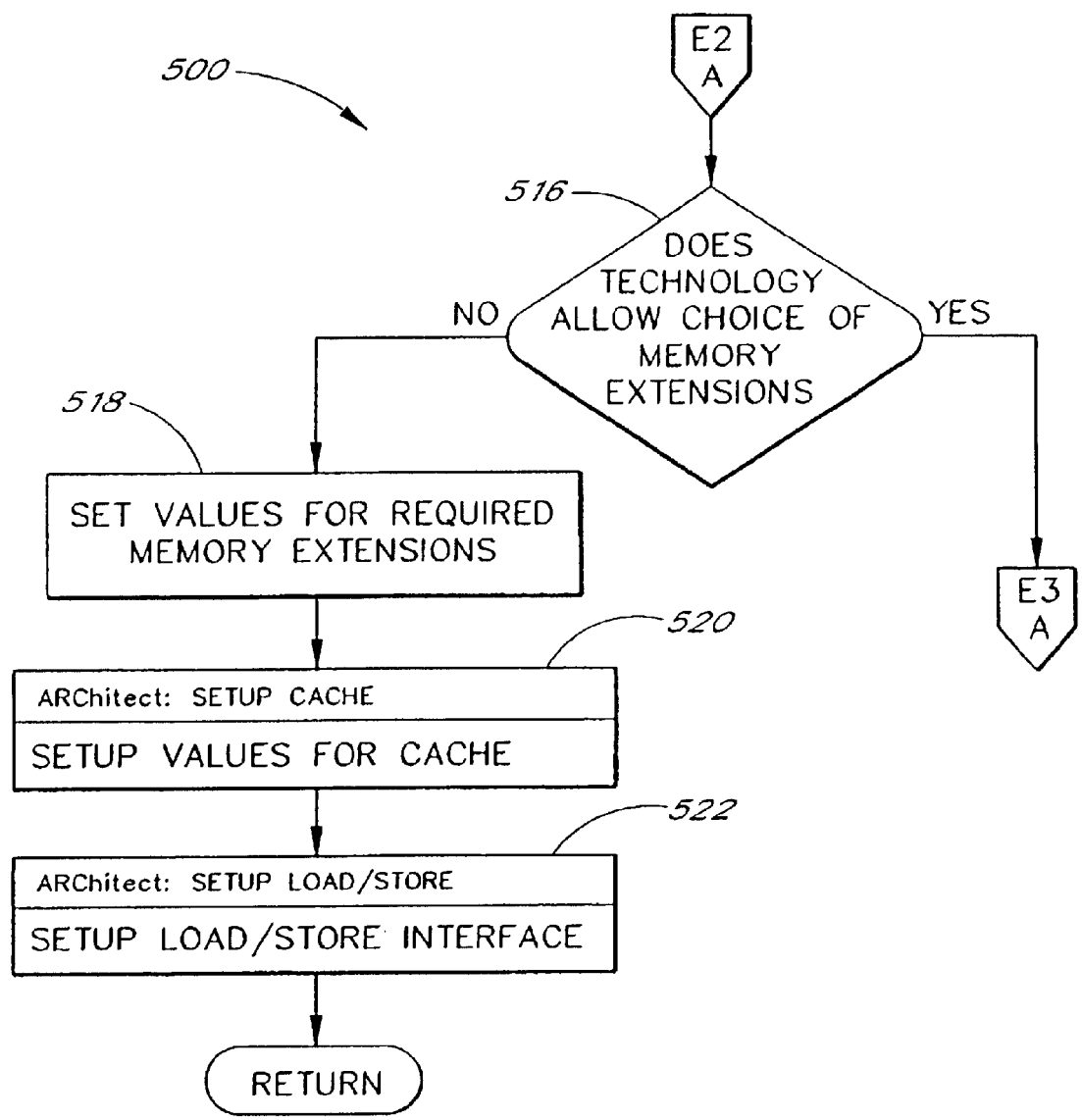

Referring now to FIG. 5b, the method 500 continues with step 516, wherein the user's choice of technology is examined to determine whether it permits the choice of memory extensions (versus core extensions, as previously described). If no choice of memory extensions is allowed, the required memory extension values are set per step 518, the cache values set up per step 520, and the load/store interface configuration set up per step 522.

Figure 5C:
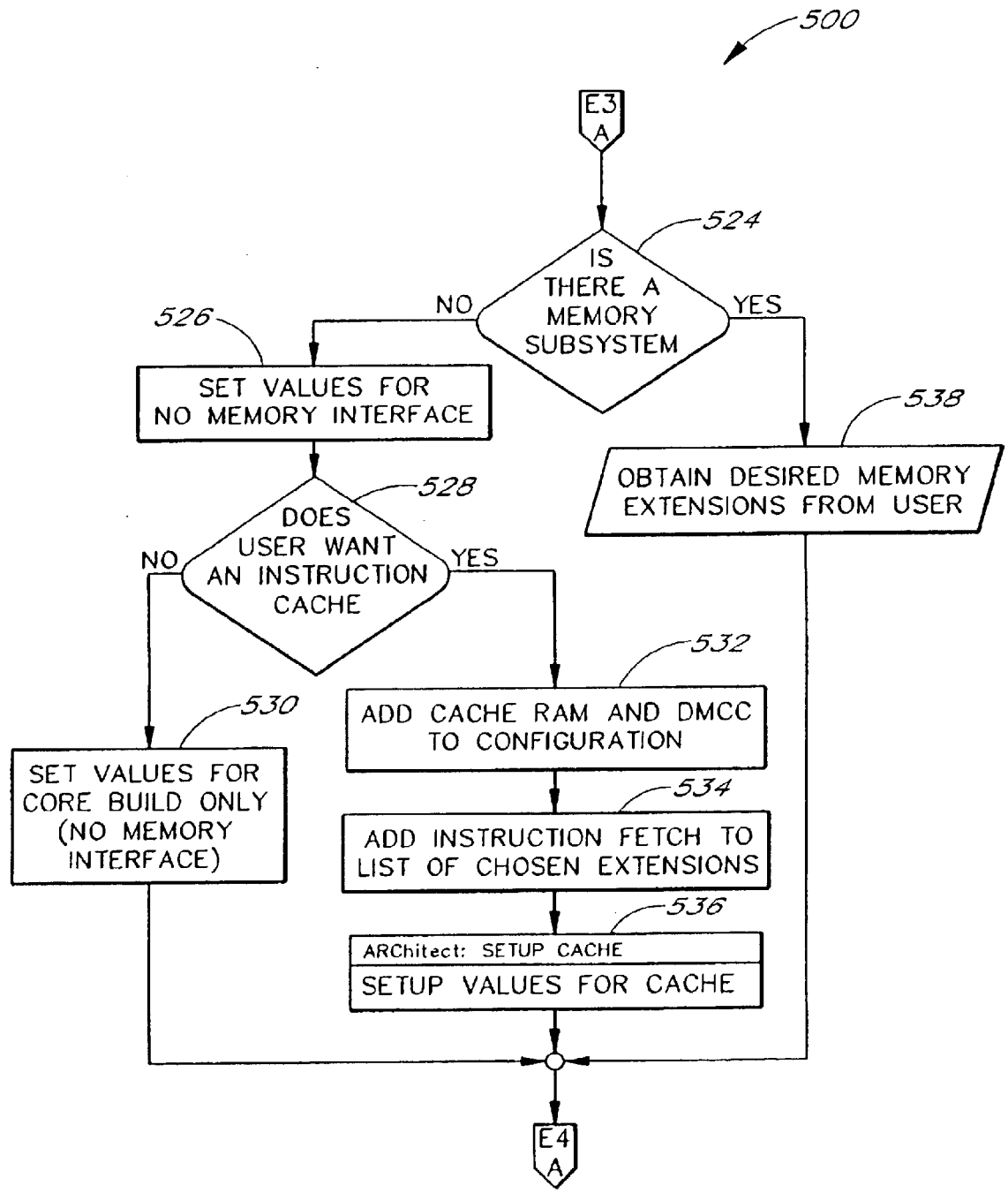

If a choice of memory extensions is allowed per step 516, the method of FIG. 5c is utilized. As shown therein, the existence of a memory subsystem is next determined in step 524. If no memory subsystem exists, values consistent with no memory interface are set in step 526. Next, the user is queried if an instruction cache is desired in step 528; if no, the values for a core build only (i.e., no memory interface) are set in step 530. If yes, a cache random access memory (RAM) and direct mapped cache controller (DMCC) are added (step 532), "instruction fetch" extension is added to list of selected extensions (step 534), and the cache is set up (step 536), as further described with reference to FIG. 6 herein.

If a memory subsystem does exist in step 524, the desired memory extensions are obtained from the user in step 538.

Figure 5D:
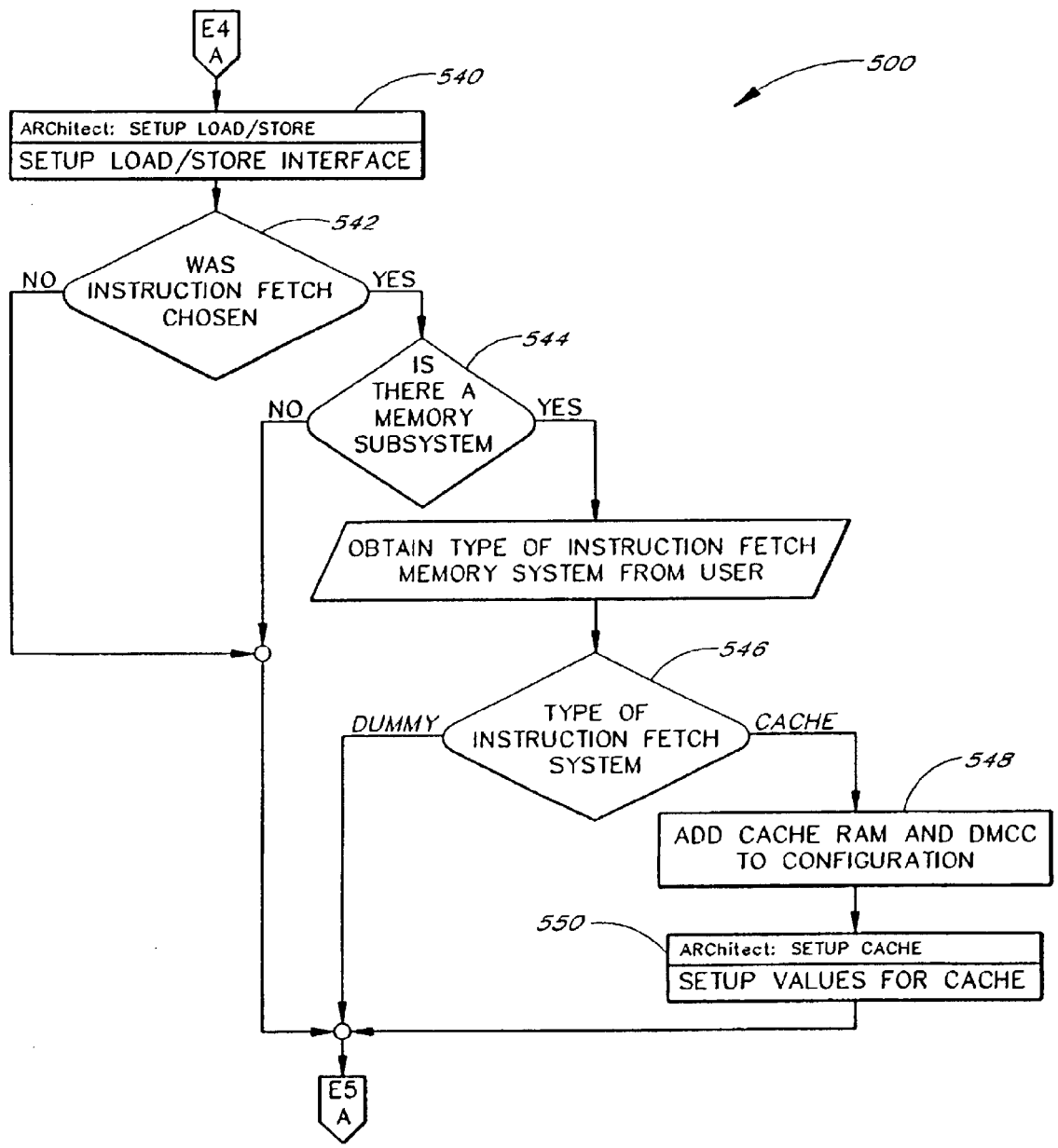

Referring now to FIG. 5d, the method 500 continues by setting up the load/store interface in step 540. The method of step 540 is described in greater detail with respect to FIG. 7 herein. Upon completion of step 540, the algorithm determines in step 542 whether an instruction fetch was selected by the user. If so, the algorithm again determines whether a memory subsystem exists (step 544); if so, the user is queried in step 546 as to the type of instruction fetch system desired. If the type of instruction fetch system is a "cache", the algorithm then adds a cache RAM and DMCC to the configuration per step 548, and sets up the cache in step 550 as in step 536 previously described. If the type of instruction fetch selected in step 546 is a "dummy", then the algorithm proceeds to step 552 of FIG. 5e. Note that if no instruction fetch was selected in step 542, or no memory subsystem exists in step 544, the algorithm proceeds to step 552 as well.

Figure 5E:
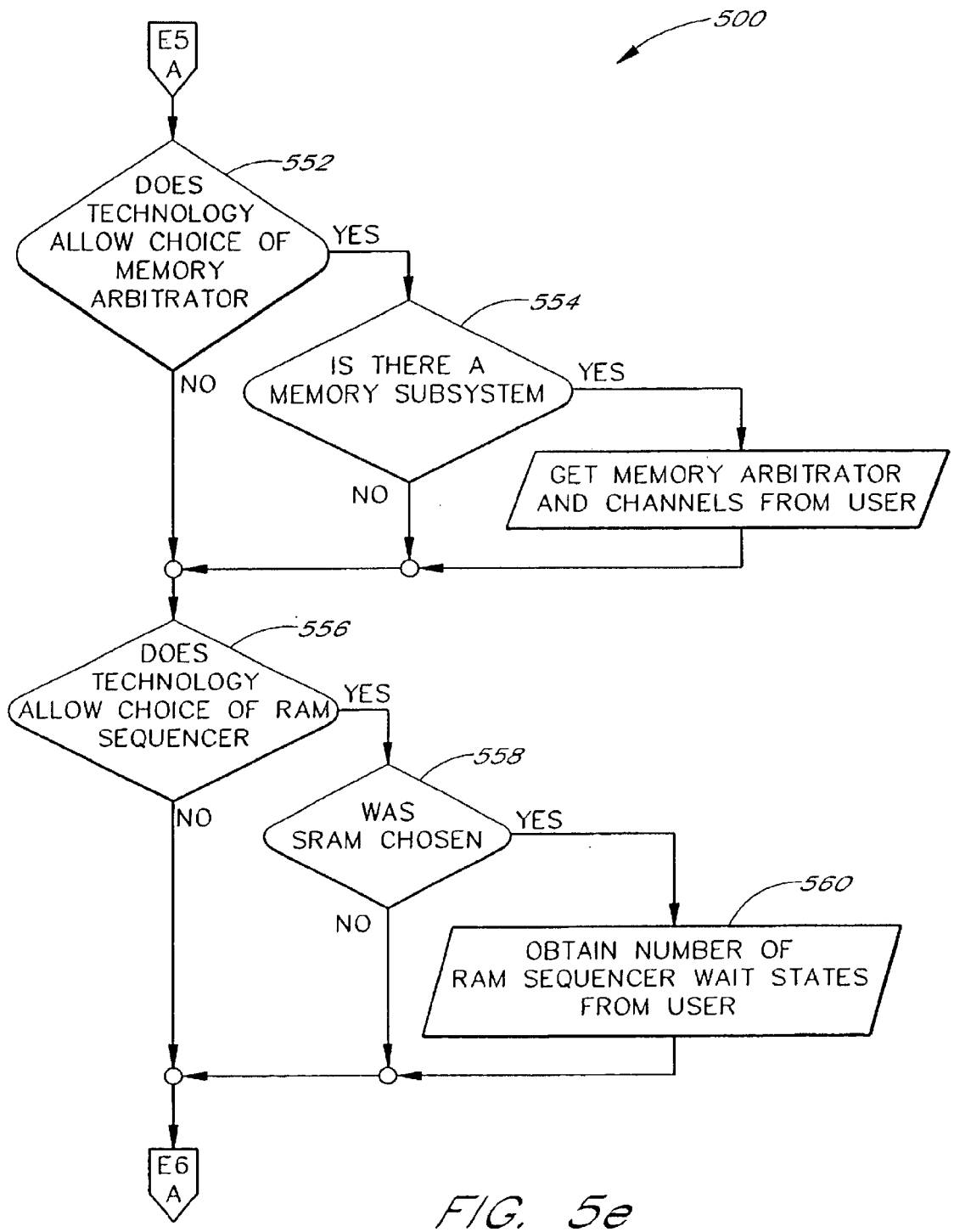

Referring now to FIG. 5e, the method 500 continues with step 552 in which the initial choice of technology by the user (step 306) is examined to determine whether the choice of a memory arbiter is allowed. If yes, the existence of a memory subsystem is then determined in step 554. If no choice of memory arbiter is allowed, or if there is no memory subsystem, the algorithm then determines whether the choice of RAM sequencer is allowed for the chosen technology in step 556. Note that in step 544, if a memory subsystem is allowed, then the algorithm queries the user to specify the memory arbiter and channels desired.

Returning to step 556, if a RAM sequencer choice is permitted, then the algorithm determines in step 558 whether a synchronous RAM (SRAM) was chosen by the user. If so, the user is prompted in step 560 for the number of RAM sequencer wait states associated with the SRAM. Upon obtaining that information, the algorithm proceeds to step 562 of FIG. 5f. Similarly, if no choice of RAM sequencer is permitted by the technology in step 556, the algorithm proceeds to step 562.

Figure 5F:
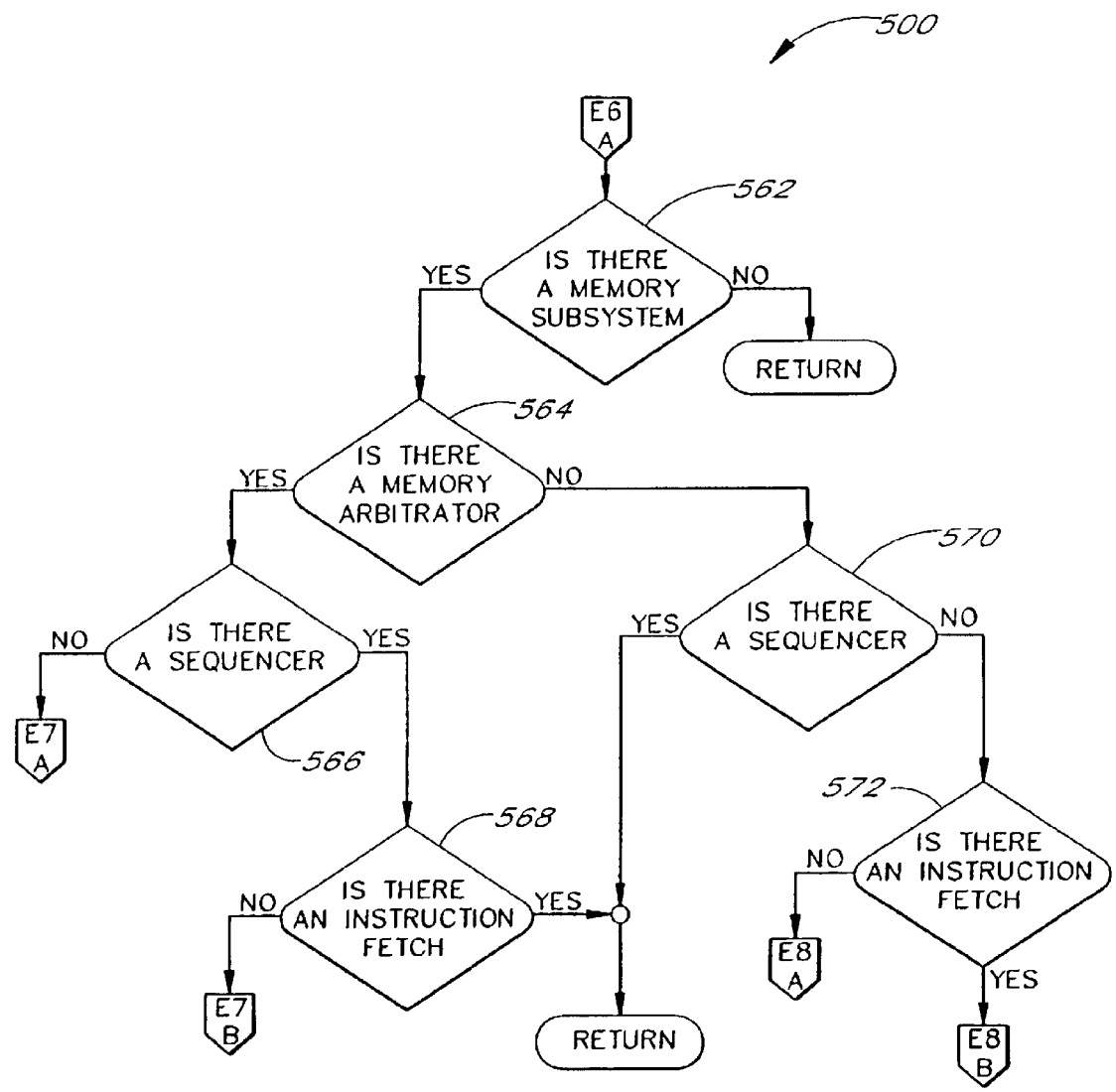

Referring now to FIG. 5f, the extensions selection algorithm continues at step 562, wherein again the existence of a memory subsystem is determined. If a memory subsystem does exist, the existence of a memory arbiter is queried in step 564. If a memory arbiter exists, then the existence of a memory sequencer is determined in step 566. If a memory sequencer exists, the existence of an instruction fetch is determined in step 568. After step 568, the algorithm executes a branch return back to step 342 of FIG. 3c. If no memory subsystem exists per step 562, a branch return to step 336 of FIG. 3c is also executed. If no sequencer exists per step 566, the algorithm proceeds to step 574 of FIG. 5g. If no instruction fetch exists per step 568, then the algorithm proceeds to step 576 of FIG. 5g.

If no memory arbiter exists per step 564, then the existence of a sequencer is again determined per step 570. If a sequencer exists, the aforementioned return is executed. If no sequencer exists, the existence of an instruction fetch is determined in step 572. If an instruction fetch exists per step 572, the algorithm proceeds to step 580 of FIG. 5h. If not, then step 582 of FIG. 5h is selected.

Figure 5G:
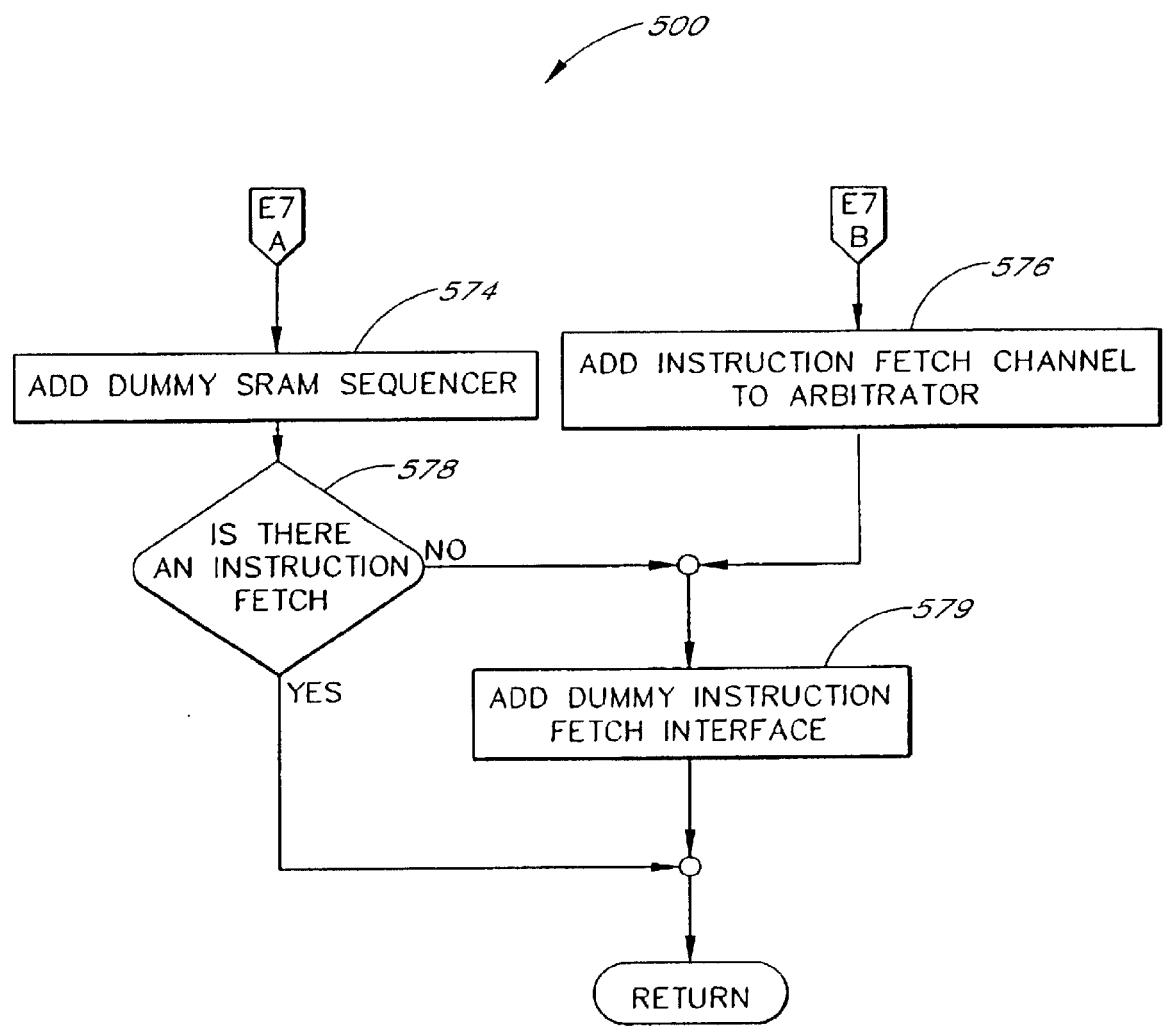

Referring now to FIG. 5g, step 574 comprises adding a dummy SRAM sequencer. After the dummy sequencer has been added, the algorithm determines whether an instruction fetch exists in step 578. If yes, a branch return is executed. If no, a dummy instruction fetch interface is added per step 579. If no instruction fetch exists per step 572 of FIG. 5f, an instruction fetch channel is added to the arbiter per step 576 of FIG. 5g, and a dummy instruction fetch interface added per step 579.

Figure 5H:
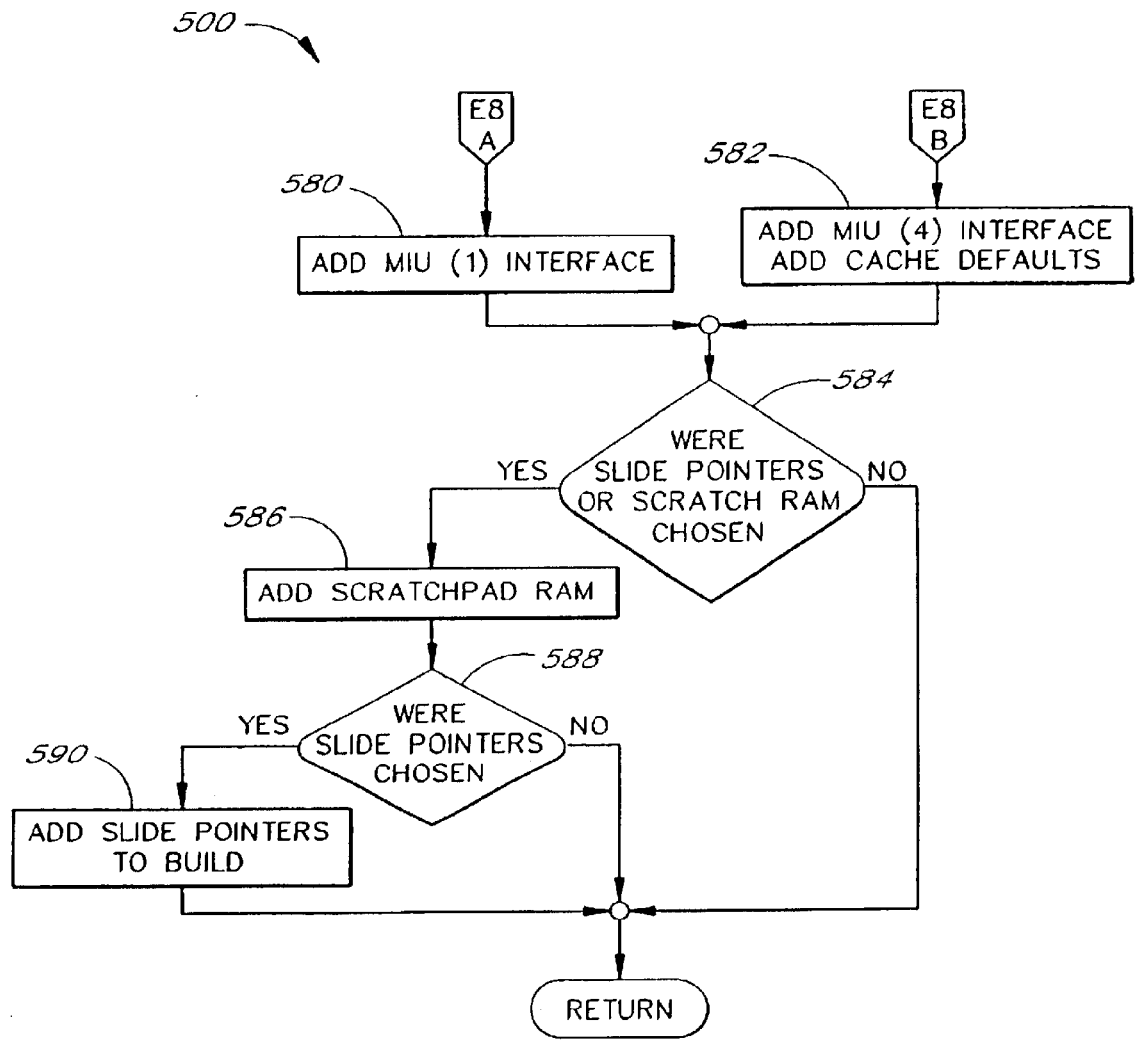

Referring now to FIG. 5h, step 580 comprises adding an miu(1) (external memory instruction fetch) interface for addressing external memory during instruction fetch. Alternatively, in step 582, an miu(4) interface and cache default values are added. Upon completion of step 580 or step 582, the algorithm determines in step 584 whether slide pointers or a scratch RAM was chosen by the user. If either was chosen, a scratchpad RAM is added per step 586, and slide pointers added to the build (as appropriate per steps 588 and 590.

Figure 6:
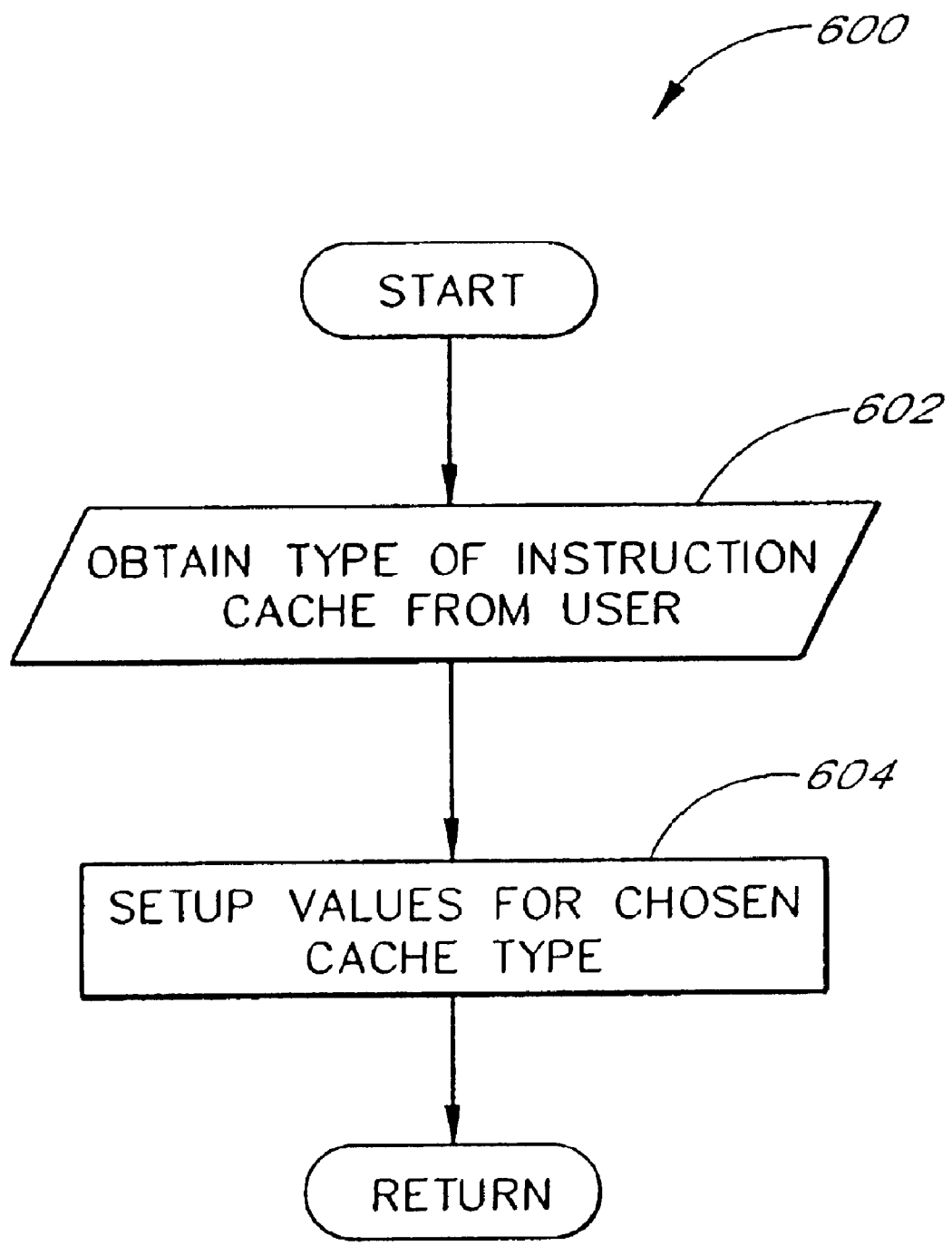
FIG. 6 is a logical flow diagram illustrating one exemplary embodiment of the method of setting up the cache structure as shown generally in —FIGS. 5b, 5c, and 5d herein.

Referring now to FIG. 6, one exemplary embodiment of the method 600 of setting up the cache as previously discussed with respect to FIGS. 5b, 5c, and 5d herein is described. In a first step 602, the type of instruction cache to be used is obtained from the user. In the illustrated embodiment, the user may specify cache size, memory width, line size, and operation mode (such as debug and bypass), although other choices are possible. Next, in step 604, the values for the chosen cache type are read and stored as appropriate for later use.

Figure 7:
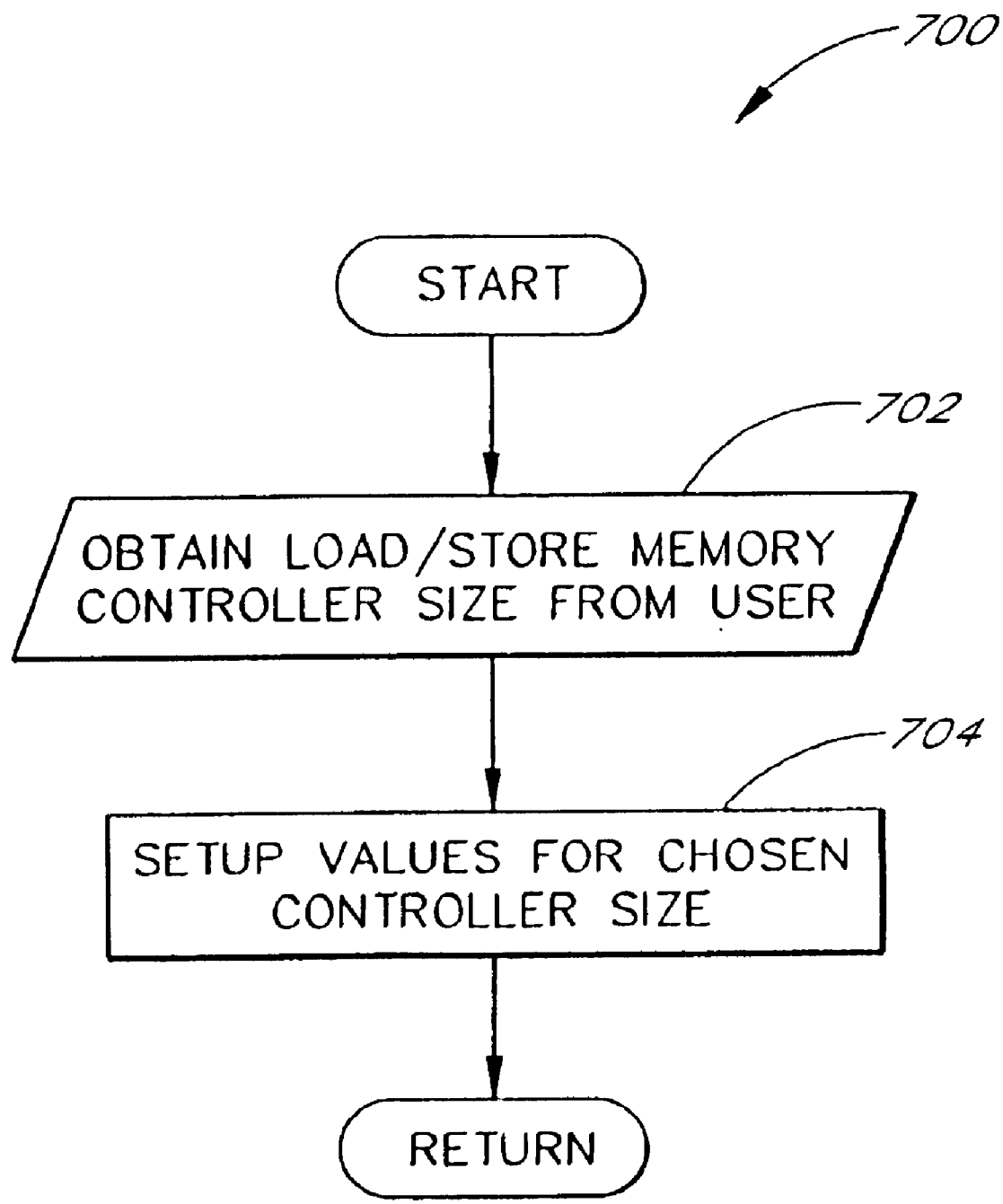
FIG. 7 is a logical flow diagram illustrating one exemplary embodiment of the method of setting up the load/store interface structure as shown generally in FIG. 5d herein.

Referring now to FIG. 7, one embodiment of the method 700 of setting up the load/store interface per FIG. 5d herein is described. First, the load/store memory controller size is obtained from the user per step 702; the values associated with the selected controller size are then obtained from the appropriate file and stored in step 704.

Figure 8:
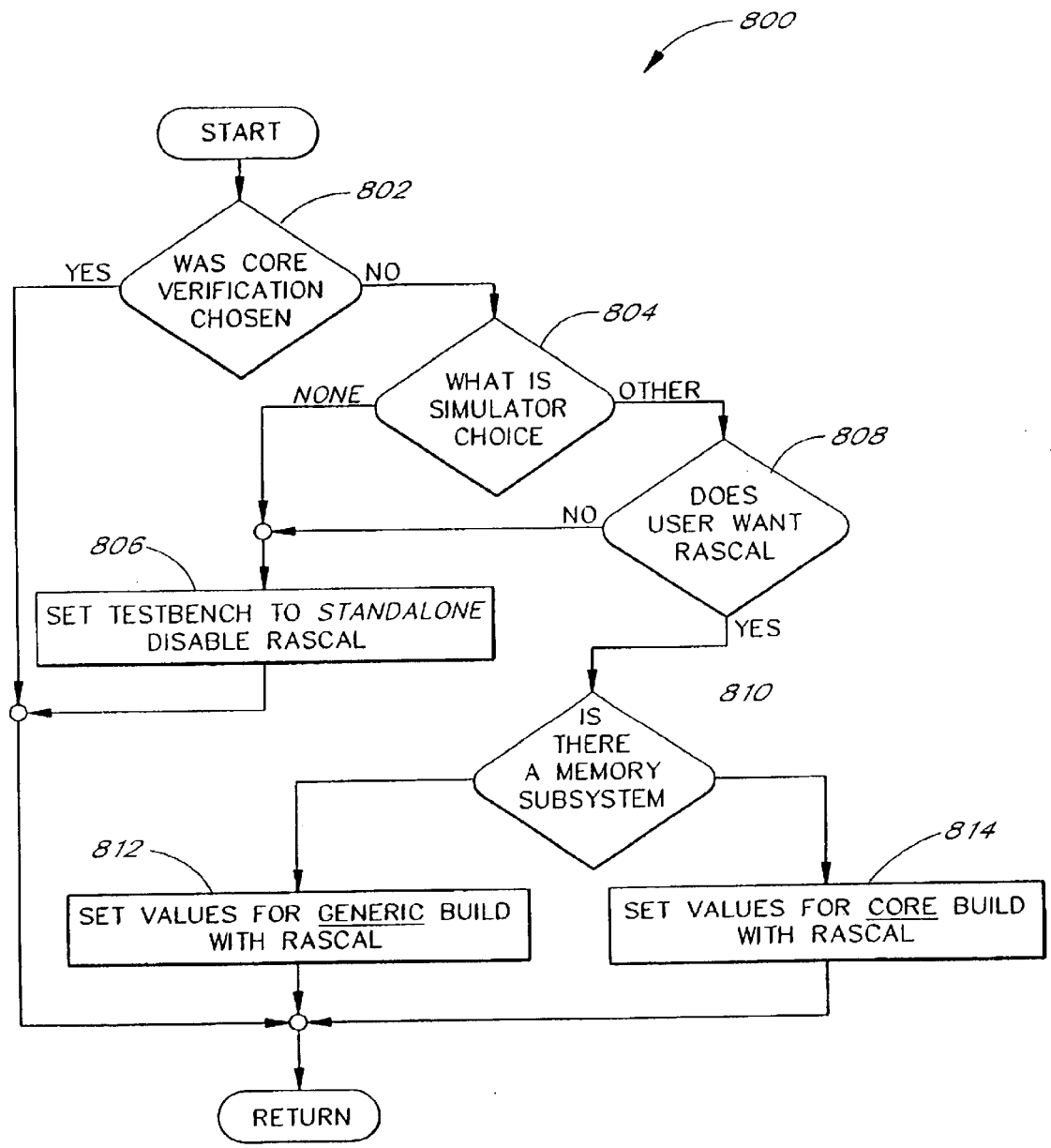
FIG. 8 is a logical flow diagram illustrating one exemplary embodiment of the method of setting up the register transfer language (RTL) link structure as shown generally in FIG. 3d herein.

Referring now to FIG. 8, one exemplary embodiment of the method '800 of setting up the register transfer language structure (e.g., RTL and SeeCode Link, or RASCAL™) as shown generally in FIG. 3d herein is described. The method 800 first determines in step 802 whether a core verification was selected by the user, if a core verification was selected, a branch return to step 354 (FIG. 3d) is executed. If no core verification was selected, the method 800 then determines what simulator choice has been made by the user in step 804. If no choice has been made, the system "testbench" function (a simulation environment with test vectors) is set to "standalone" mode, and the RTL and SeeCode Link disabled per step 806. If some choice (other than "none") has been made, the user is prompted in step 808 to determine whether the aforementioned RTL link is desired; if not, the testbench function is set per step 806. If the RTL link is desired, the existence of a memory subsystem is again determined per step 810, and the values for either a generic build with the RTL link (step 812) or the core build with RTL link (step 814) set as appropriate. Upon completion of the RTL setup method 800, a branch return to step 354 is executed.

Figure 9:
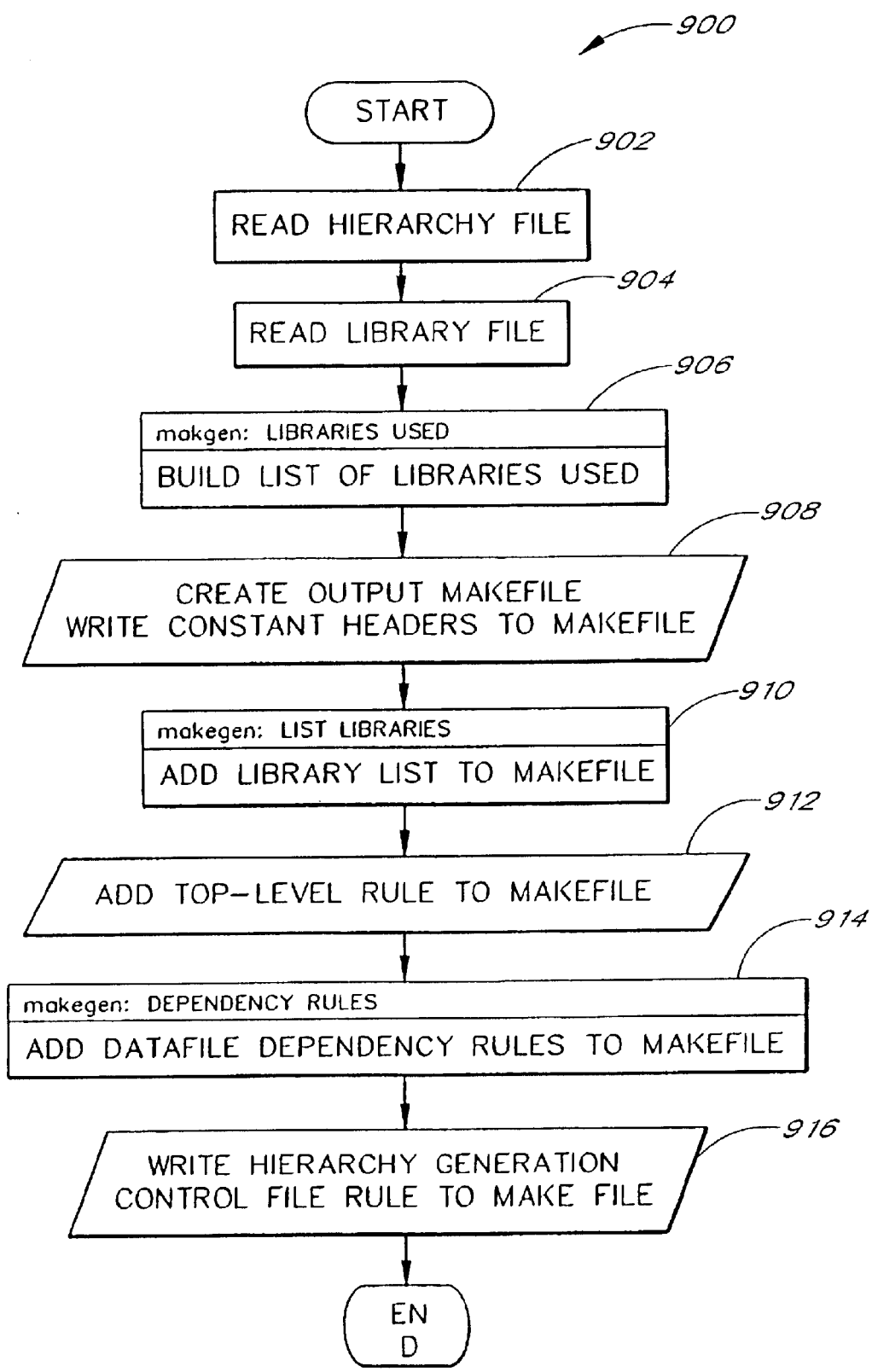
FIG. 9 is a logical flow diagram illustrating one exemplary embodiment of the method of generating a new script according to the invention.

FIG. 9 illustrates one exemplary embodiment of the method 900 of generating a new script according to the invention. First, the hierarchy file representative of the physical hierarchy of the design is read per step 902. Next, the applicable library file is read in step 904. In step 906, a list of the libraries used in conjunction with the design is built, as described in greater detail with reference to FIG. 10 herein. After the libraries list is built, an output makefile is created in step 908, and the constant headers written to the created makefile. In step 910, the aforementioned libraries list is added to the makefile as described in detail with reference to FIG. 11 herein. Next, the "top-level" rule is added to the makefile in step 912. As used herein, the top-level rule relates to those rules specified by the hardware description language (such as VHDL or Verilog), although it will be appreciated that others rule bases may be used.

After the top-level rules have been added, the datafile dependency rules are added to the makefile in step 914. This step 914 is described in greater detail with reference to FIG. 12 herein. Lastly, the physical hierarchy generation control file rule is added to the makefile to complete the latter.

Figure 10:
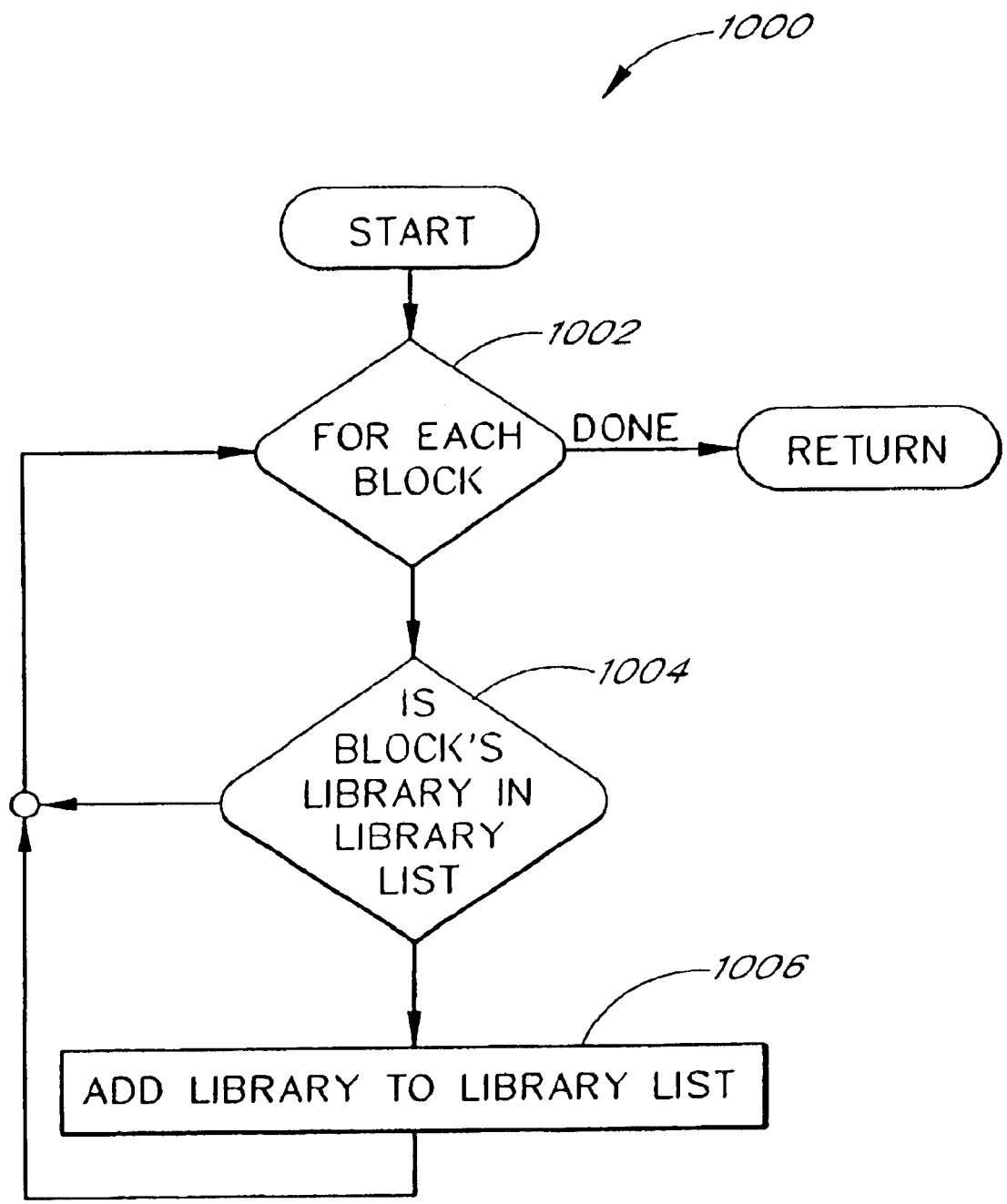
FIG. 10 is a logical flow diagram of one exemplary embodiment of the method of building a libraries list as shown generally in FIG. 9.

Referring now to FIG. 10, one exemplary embodiment of the method 1000 of building a libraries list as shown generally in step 906 of FIG. 9 is described. In a first step 1002, each block present in the design is analyzed; if the read block's library is presently within the libraries list (step 1004), the next block is read and similarly checked. Note that as used herein, the term "block" refers to a logical entity having a particular function, such as an adder or multiplier. If the required block library is not in the list, that library is added per step 1006. This process 1000 is repeated until all blocks have been analyzed and the presence of their required libraries verified in the libraries list.

Figure 11:
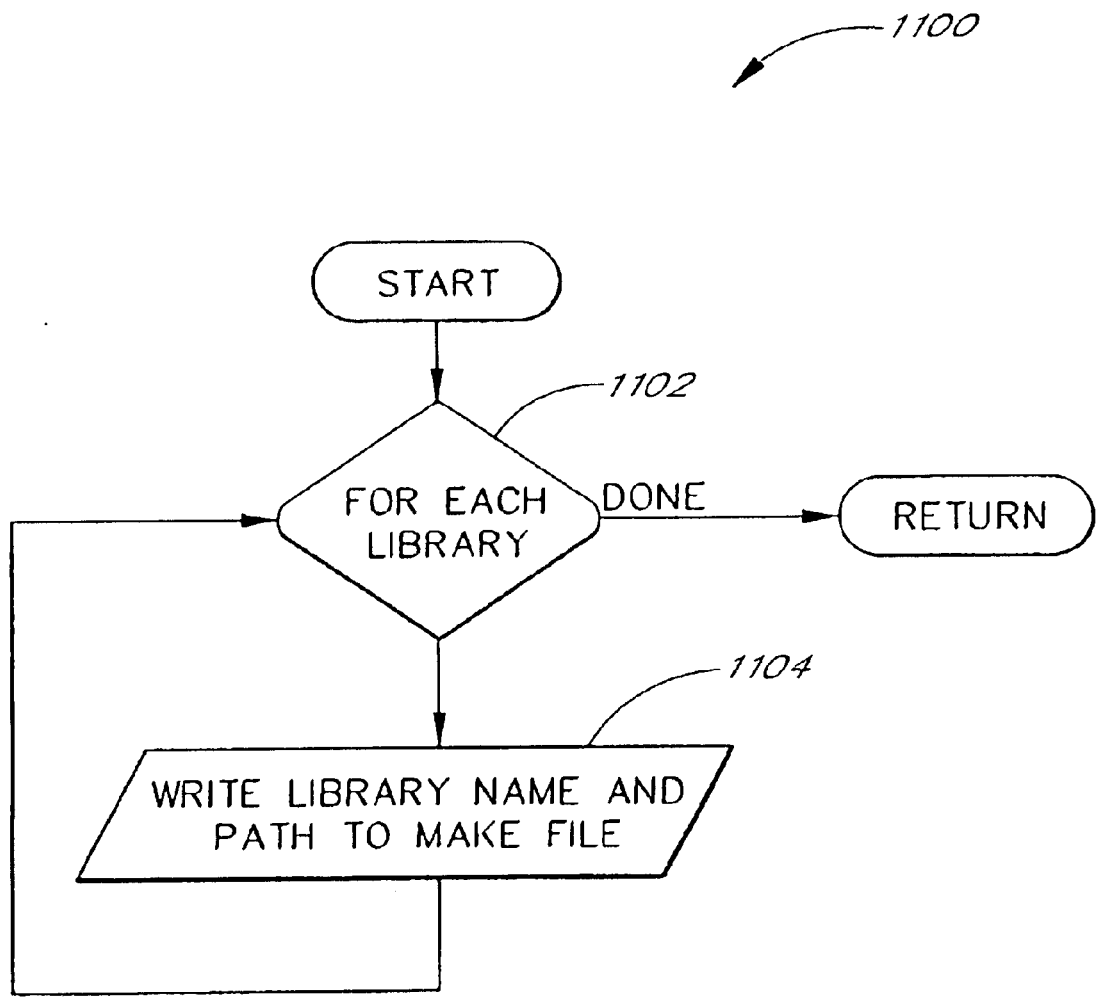
FIG. 11 is a logical flow diagram of one exemplary embodiment of the method of adding the libraries list to the system "makefile" as shown generally in FIG. 9.

Referring now to FIG. 11, one exemplary embodiment of the method 1100 of adding the libraries list to the system "makefile" as shown generally in step 910 of FIG. 9. Specifically, the method 1100 comprises reading each library per step 1102, and writing the library name and path to the aforementioned makefile per step 1104. The algorithm returns to step 912 of FIG. 9 when all of the required library information has been added to the makefile.

Figure 12:
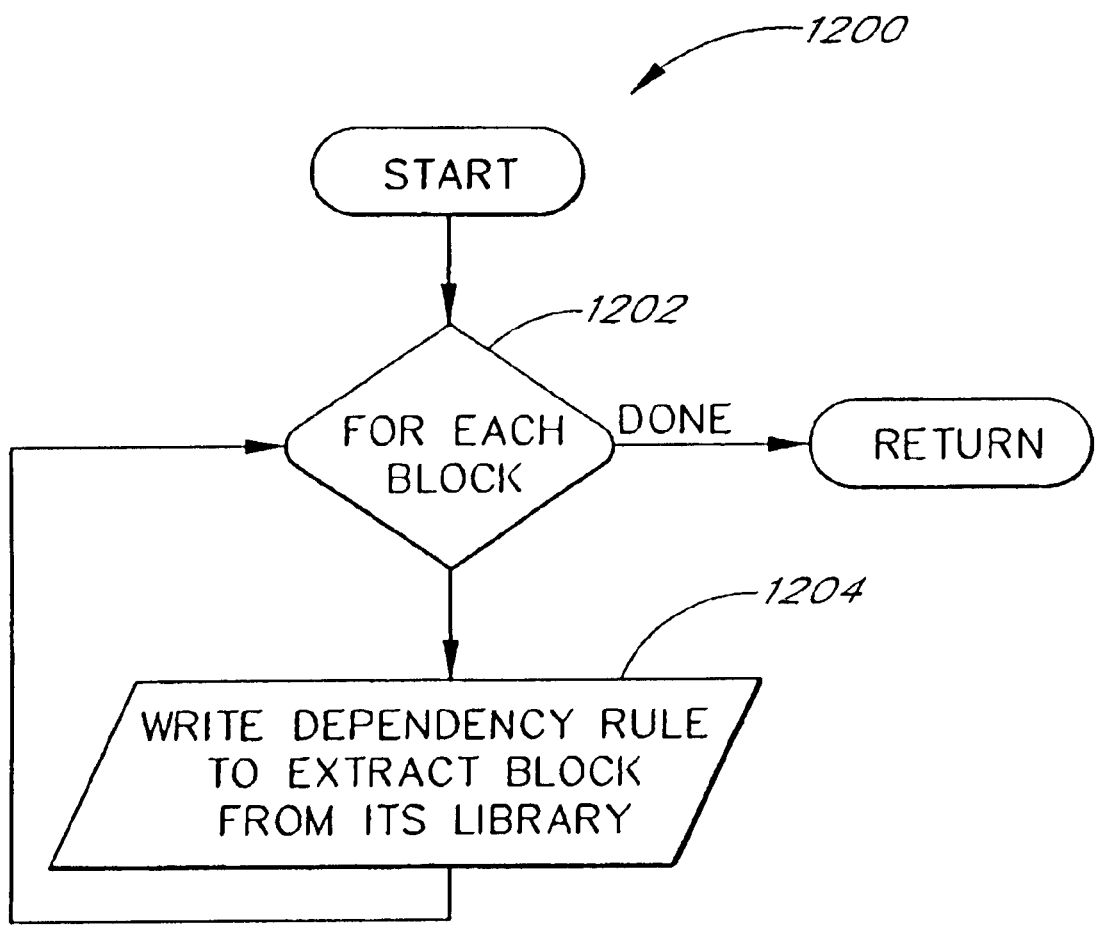
FIG. 12 is a logical flow diagram of one exemplary embodiment of the method of adding datafile dependency rules to the system "makefile" as shown generally in FIG. 9.

FIG. 12 illustrates one embodiment of the method of adding datafile dependency rules to the system "makefile" as shown generally in step 914 of FIG. 9. Specifically, each block is read in step 1202, and the dependency rules are written to a file in step 1204 to extract that block from its library. When all dependency rules have been written, the algorithm returns to step 916 of FIG. 9. This completes the script generation process 900.

Figure 13:
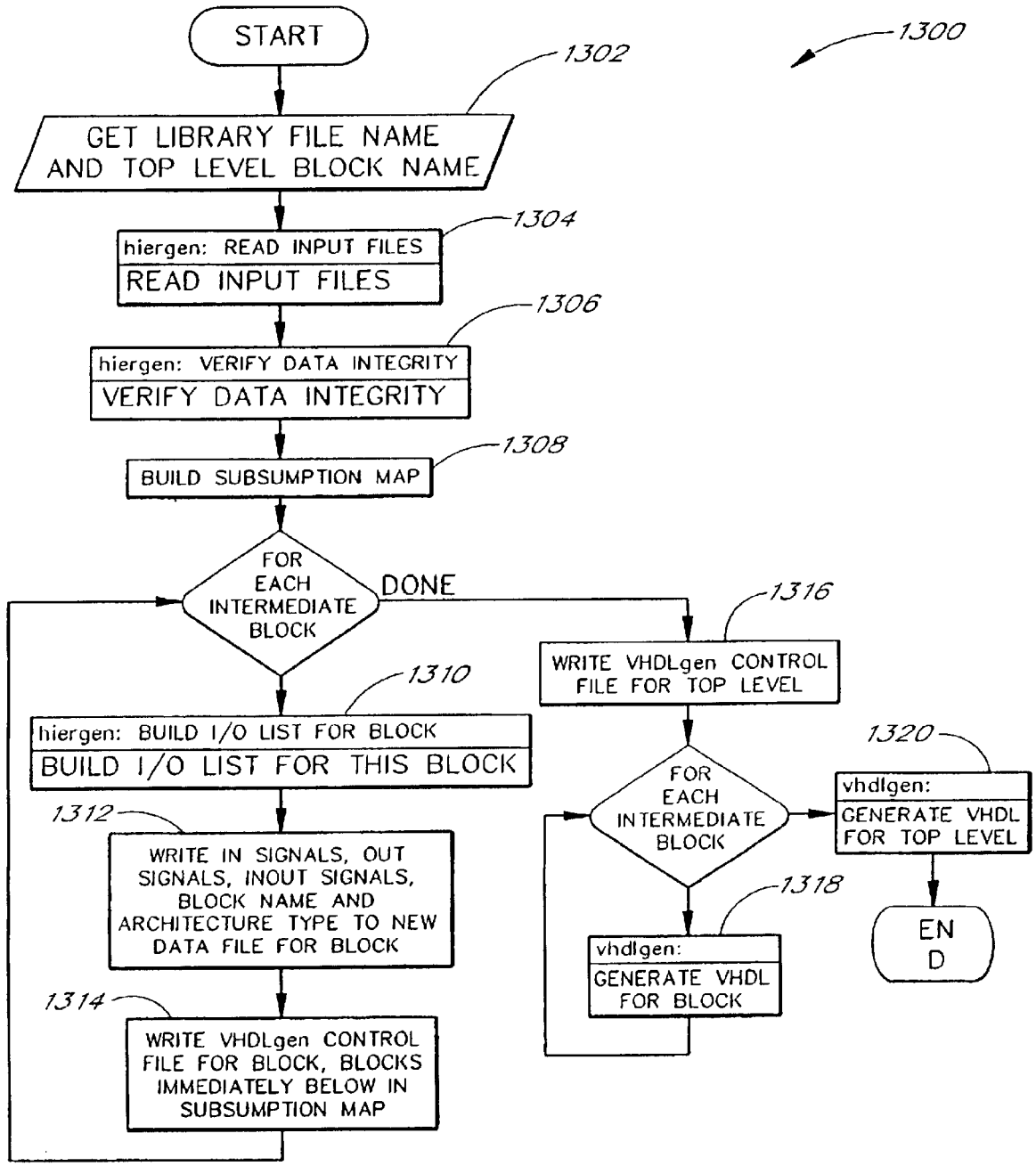
FIG. 13 is a logical flowchart illustrating one exemplary embodiment of the method of hierarchy file generation according to the invention.

Referring now to FIG. 13, one exemplary embodiment of the method 1300 of hierarchy file generation according to the invention is described. In step 1302, the library file name and top level block name are obtained. Next, in step 1304, the input files are read as described in detail with respect to FIG. 14 herein. Next, the integrity of the data read is verified in step 1306; see FIG. 19 for additional detail. Then, for each intermediate block, a subsumption map is built (step 1308). In step 1310, an I/O list is built for each intermediate block as further described with reference to FIG. 20 herein. In step 1312, the "in", "out", and "inout" signals are written to a new data file for each block; the block ID and architecture type are also written thereto. Next, the HDL (e.g., "VHDLgen") control file for each block is written in step 1314. The foregoing three steps 1310, 1312, 1314 are subsequently performed for each intermediate block until all blocks have been processed; at this point, the HDL control file for the top level is written in step 1316.

Next, for each intermediate block, the HDL is generated in step 1318, and when all intermediate blocks have been generated, the HDL for the top level generated in step 1320. This completes the hierarchy file generation method 1300.

Figure 14:
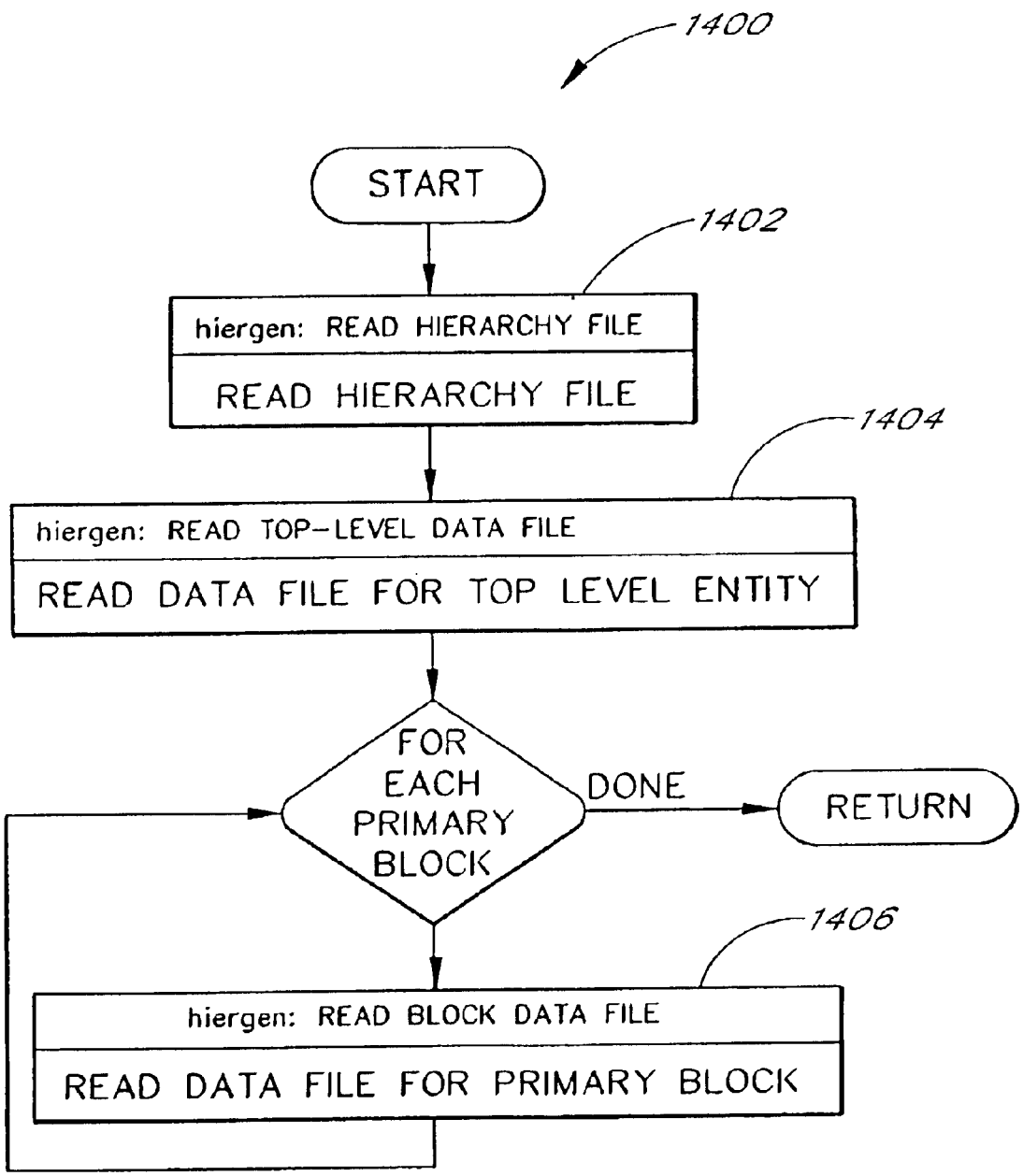
FIG. 14 is a logical flowchart illustrating one exemplary embodiment of the method of reading input files in accordance with the hierarchy file generation method of FIG. 13.
Figure 15:
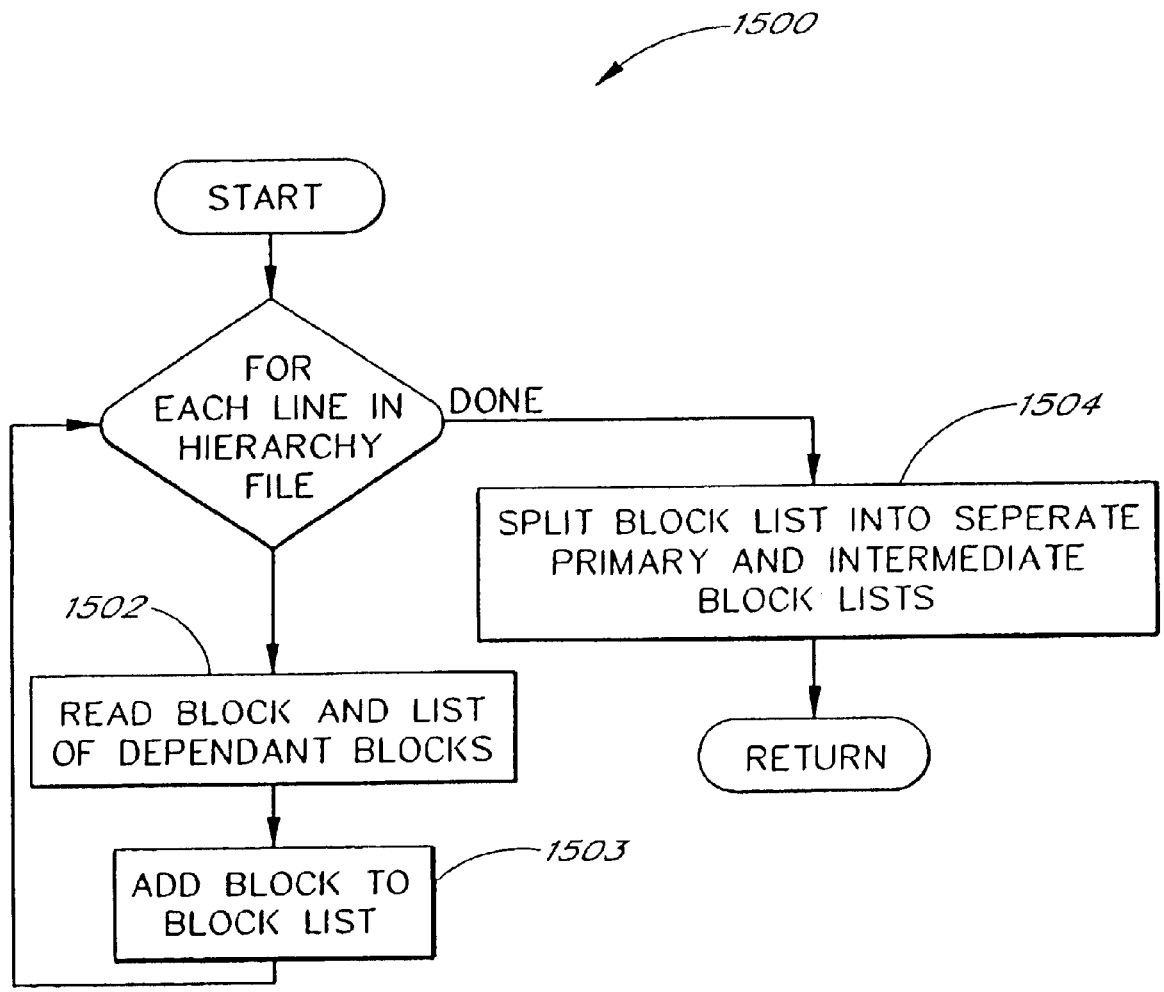
FIG. 15 is a logical flowchart illustrating one exemplary embodiment of the method of reading hierarchy files as shown generally in FIG. 14.
Figure 16:
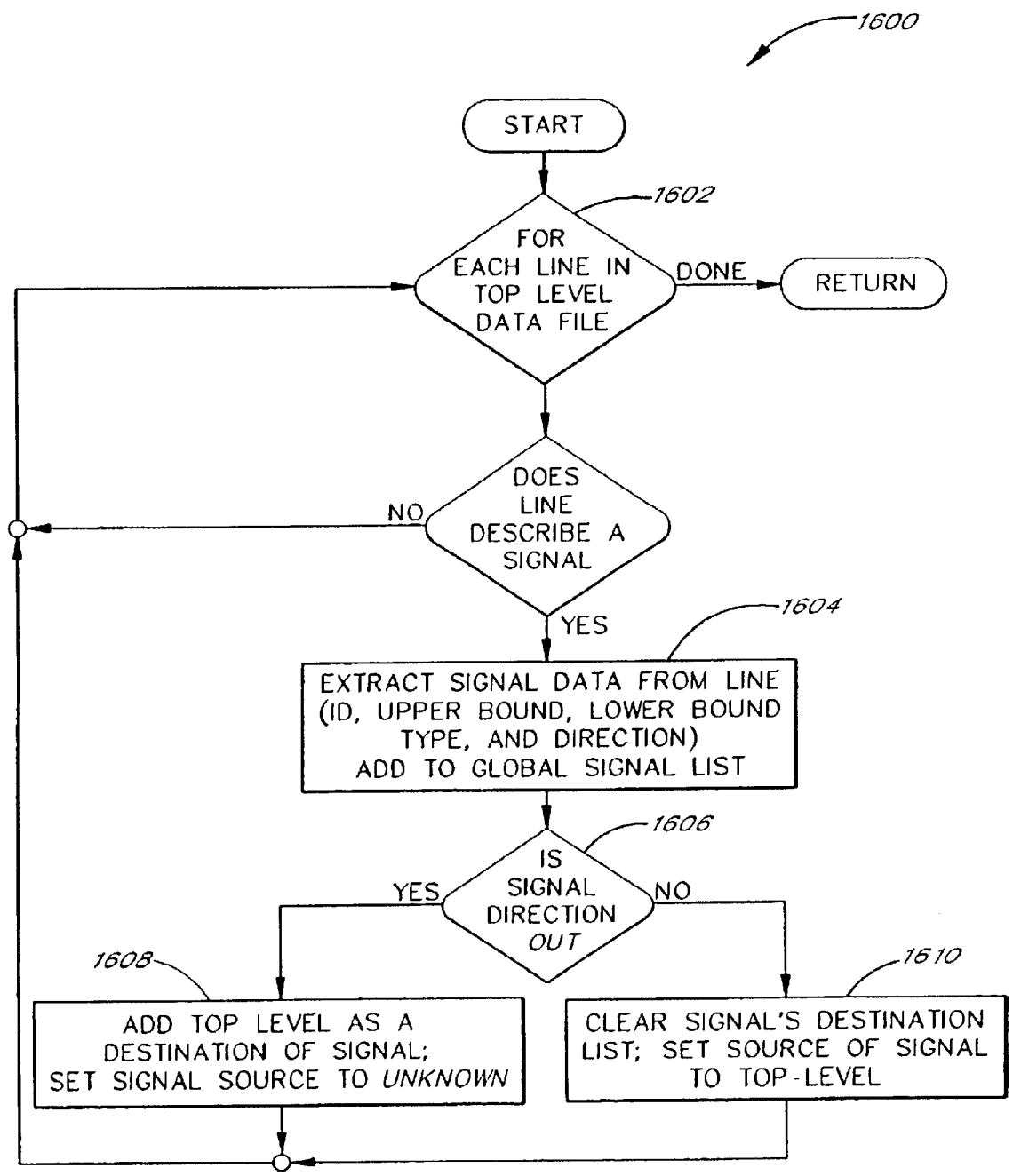
FIG. 16 is a logical flowchart illustrating one exemplary embodiment of the method of reading top level entity data files as shown generally in FIG. 14.
Figure 17:
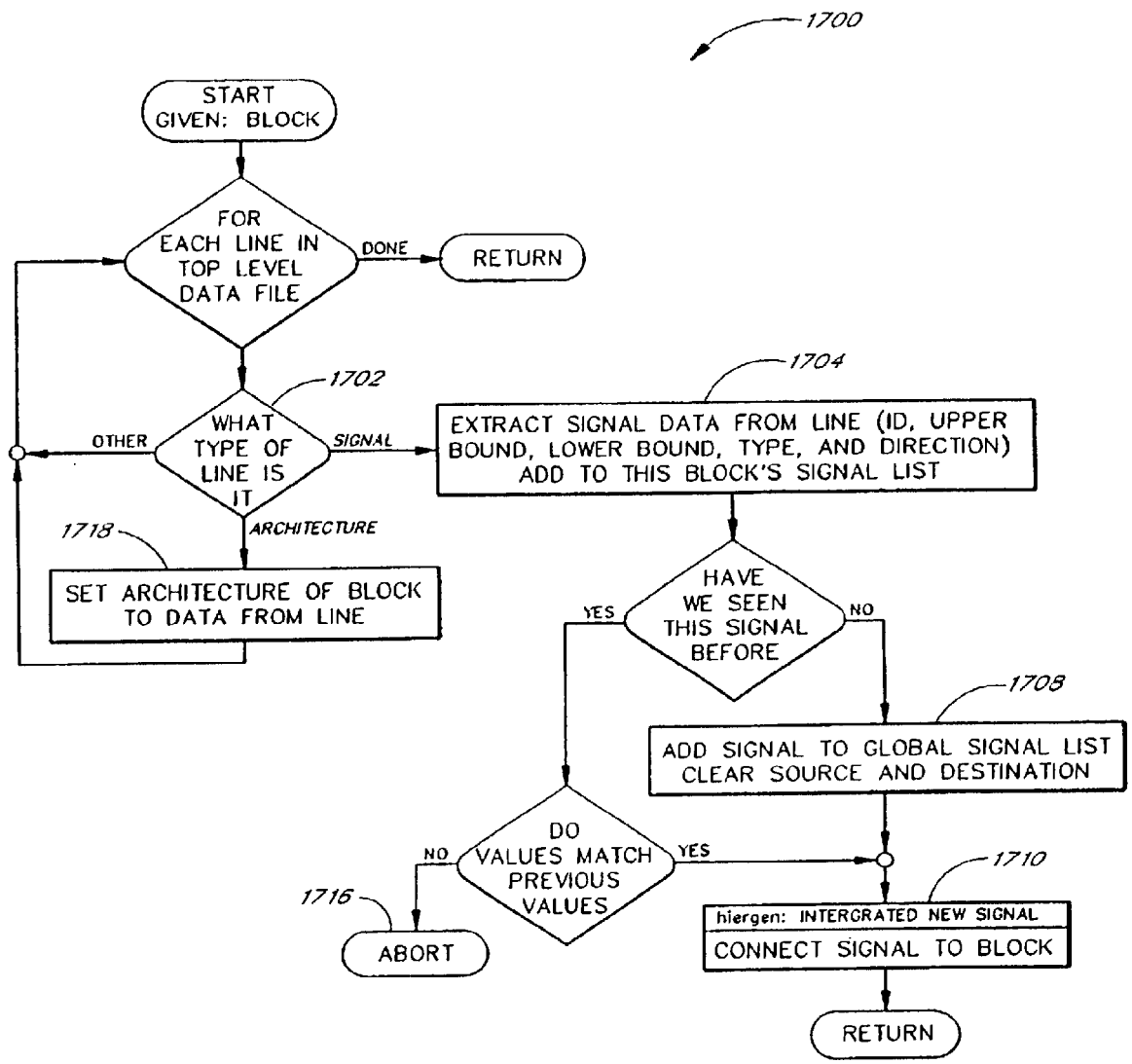
FIG. 17 is a logical flowchart illustrating one exemplary embodiment of the method of reading primary block data files as shown generally in FIG. 14.

FIG. 14 illustrates one embodiment of the method 1400 of reading input files (step 1304) in accordance with the hierarchy file generation method of FIG. 13. First, the hierarchy file is read in step 1402. Next, the data file for the top level entity is read per step 1404. Then, for each primary block, the data file is read per step 1406. FIGS. 15, 16, and 17 illustrate these steps 1402, 1404, 1406 in detail.

FIG. 15 illustrates one exemplary embodiment of the method 1500 of reading hierarchy files as shown generally in step 1402 of FIG. 14. For each line in the hierarchy files, the associated block and list of dependent blocks is read in step 1502 and each added to the block list in step 1503. When all such lines have been read, the block list is then split into a separate (i) primary block list and (ii) intermediate block list, in step 1504.

Referring now to FIG. 16, one exemplary embodiment of the method 1600 of reading top level entity data files as shown generally in step 1404 of FIG. 14 is described. First, each line of the top level data file is analyzed in step 1602 to determine whether it describes a signal. If so, then the signal data is extracted from each line per step 1604. In the illustrated embodiment, signal data includes, without limitation, "id," "upper bound," "lower bound," "type," and "direction" information. Next, in step 1606, the direction of the signal in each line determined to have a signal present is analyzed; if the signal is outbound, the top level of the hierarchy is added as the destination of the signal, and the signal source set to "unknown" per step 1608. If the signal is not outbound, the signal's destination list is cleared, and the source of the signal set to the top level per step 1610. This process 1600 is repeated for each line in the top level data file until all lines have been analyzed.

FIG. 17 illustrates one exemplary embodiment of the method 1700 of reading primary block data files as shown generally in step 1406 of FIG. 14. Initially, for each primary block, each line of the associated top level data file is analyzed in step 1702.

If the line under analysis is classified as a "signal" line, then the signal data is extracted from that line in step 1704 as previously described with reference to FIG. 16. If the signal has been read before by the algorithm, and the values associated with the signal match those previously read, the signal is connected to the primary block per step 1710. If the signal has not been previously read, it is added to the signal list per step 1708, and then connected to the primary block. Note also that if the signal has been read before but the current values do not match those previously read, then the algorithm aborts per step 1716.

If the line under analysis is an "architecture" line, the architecture of the primary block is set to "data" per step 1718, and the next line analyzed.

If the line under analysis is neither an "architecture" or "signal" line, no action is taken, and the next line in the top level data file is read.

Figure 18:
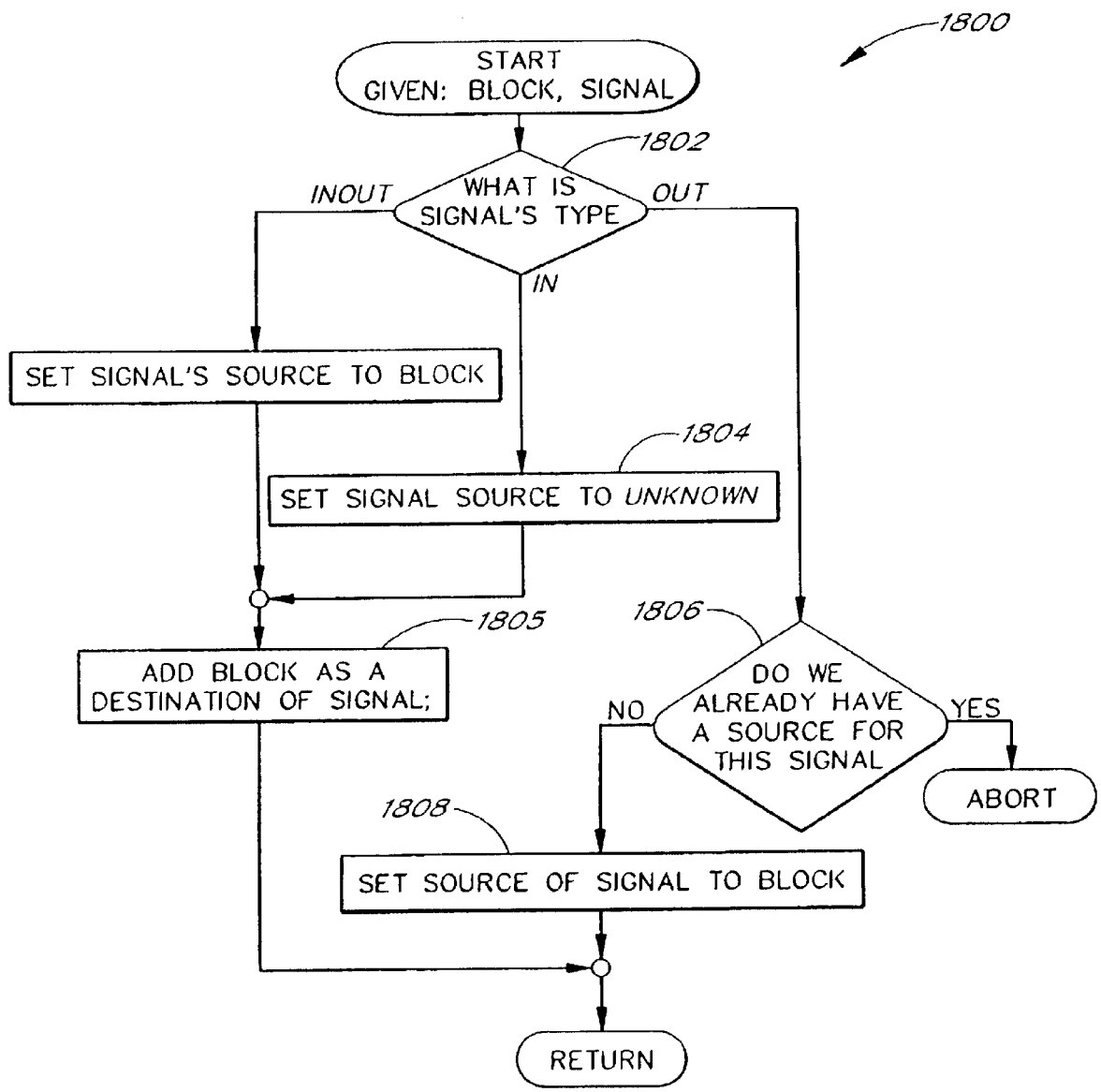
FIG. 18 is a logical flowchart illustrating one exemplary embodiment of the method of identifying and integrating new signals into the block data files as shown generally in FIG. 17.

Referring now to FIG. 18, one embodiment of the method 1800 of identifying and integrating new signals into the block data files as shown generally in FIG. 17 is described. Initially, the signal type is determined in step 1802. Signal types in the present embodiment include "in", "out", and "inout". If the signal is an "in" signal, the signal's source is set to "uknown" in step 1804; the block is then added as the destination of the signal per step 1805. If an "out" signal, the signal is examined to determine if a source already exists (step 1806); if yes, the algorithm 1800 is aborted. If no, the signal's destination list is cleared and the signal's source set to "block" per step 1808. If the signal's type is "inout", then the block is set as the destination in step 1805.

Figure 19:
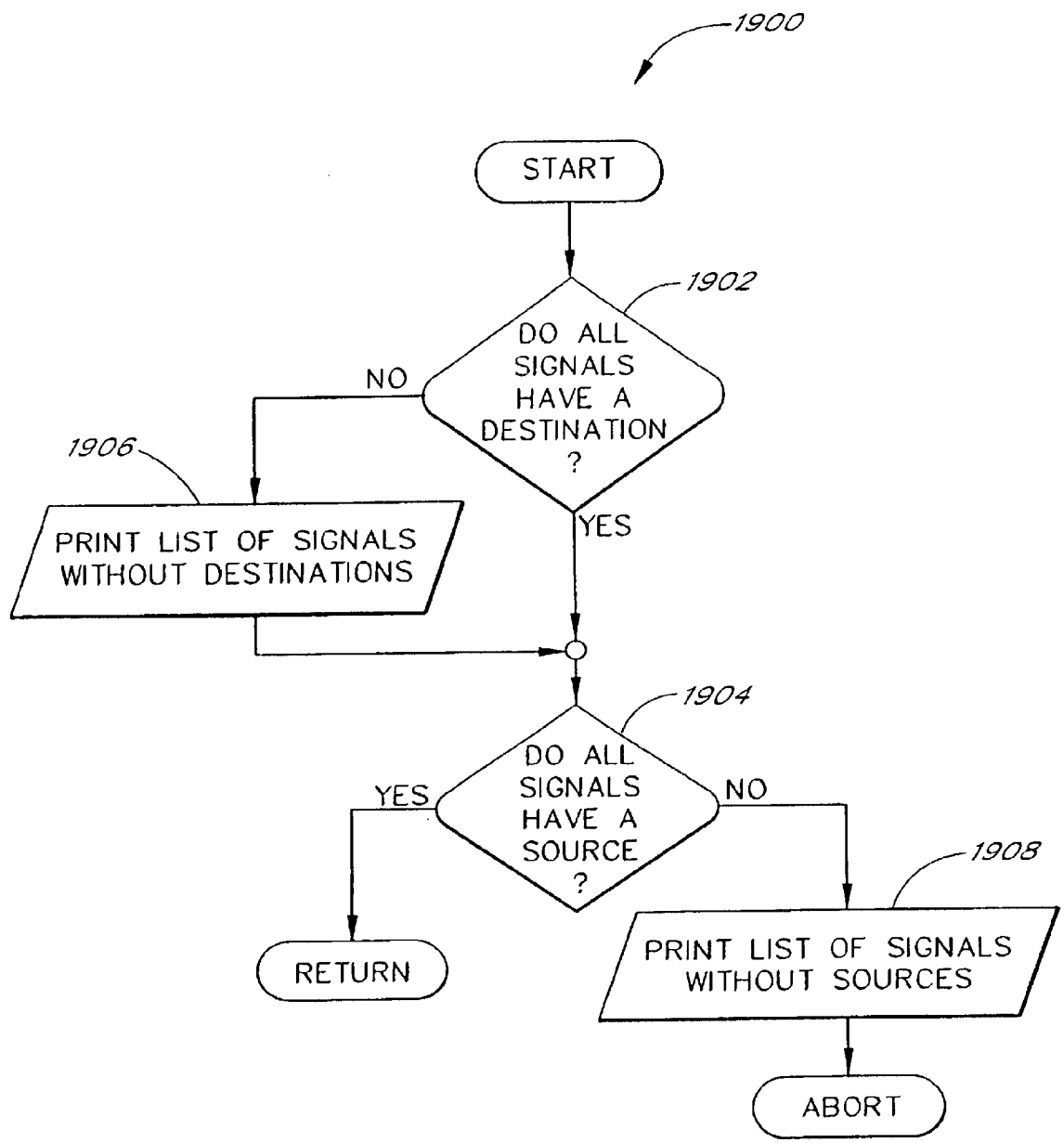
FIG. 19 is a logical flowchart illustrating one exemplary embodiment of the method of verifying data integrity as shown generally in FIG. 13.

Referring now to FIG. 19, one exemplary embodiment of the method 1900 of verifying signal data integrity as shown generally in FIG. 13 is described. First, in step 1902, each signal is examined to determine if it has an associated destination. If so, the existence of an associated source is then checked in step 1904. If both source and destination exist for all signals, the routine is terminated. If no destination is present for one or more signals in step 1902, a list of signals without destinations is printed per step 1906. If all signals have destinations but one or more signals do not have a source, a list of signals without sources is printed per step 1908.

Figure 20:
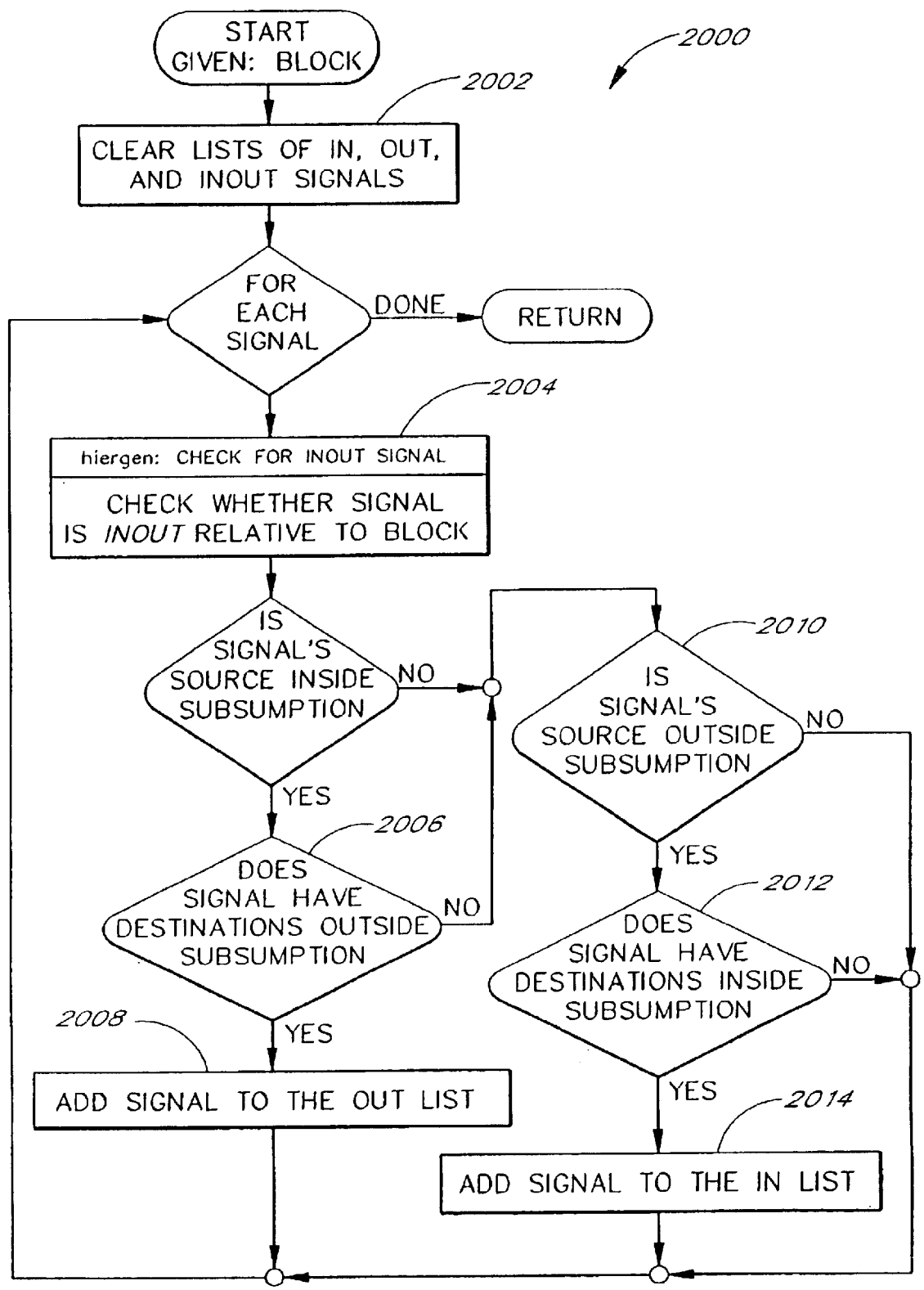
FIG. 20 is a logical flowchart illustrating one exemplary embodiment of the method of adjusting signal types relative to the block data files as shown generally in FIG. 13.

Referring now to FIG. 20, one exemplary embodiment of the method 2000 of building an I/O list relative to the block data files as shown generally in FIG. 13 is described. For a given block, the lists of "in", "out", and "inout" signals are first cleared per step 2002. Each signal is then checked to determine if it is an "inout" signal relative to the block in step 2004, as described in greater detail with reference to FIG. 21 herein. For each signal with a source inside the subsumption, the signal is checked in step 2006 to determine if it has a destination outside the subsumption. If so, the signal is added to the "out" list per step 2008, and the next signal analyzed. If the signal under analysis has no source inside the block, or all of its destinations are inside the subsumption, then the signal is checked to determine if it has an source outside of the subsumption in step 2010. If so, and it has at least one destination inside the subsumption (step 2012), then the signal is added to the "in" list per step 2014, and the next signal subsequently analyzed.

Figure 21:
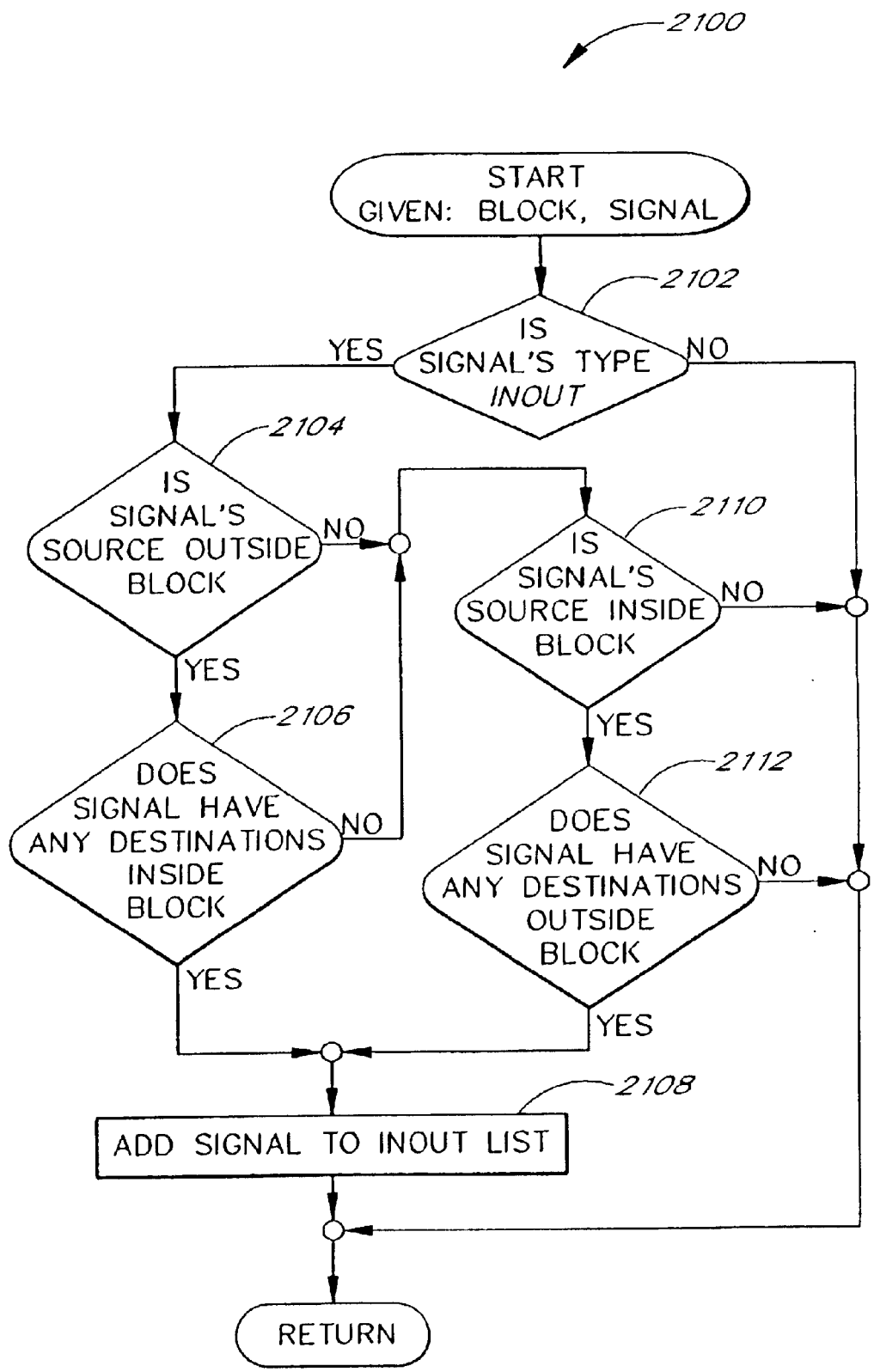
FIG. 21 is a logical flowchart illustrating one exemplary embodiment of the method of checking for "in" or "out" signals as shown generally in FIG. 20.

FIG. 21 is a logical flowchart illustrating one embodiment of the method 2100 of checking for "in" or "out" signals as shown generally in FIG. 20. For a given block and signal, the signal type is checked in step 2102 to determine whether the signal is an "inout" type'; if the signal is not an "inout" type, the algorithm returns to FIG. 20. If it is an "inout type, the signal's source is checked in step 2104 to determine if it is outside of the block, then whether it has destinations inside the block (step 2106). If both conditions are met, the signal is added to the inout list per step 2108. If either one of the conditions is not met, the signal, source is checked in step 2110 to determine if it is inside of the block; if so, then the destination is checked in step 2112 to determine if it is outside of the block.

Figure 22:
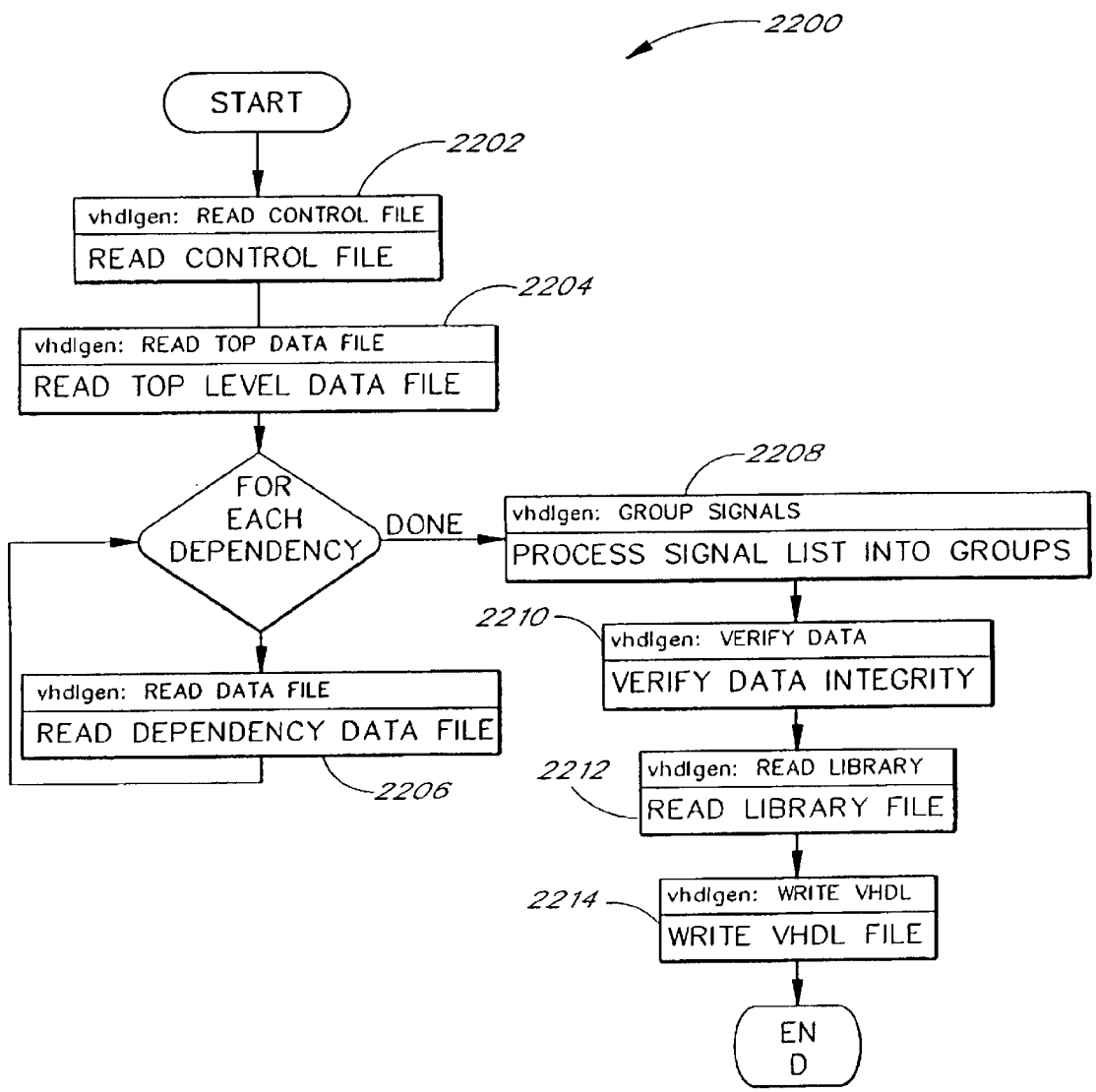
FIG. 22 is a logical flowchart illustrating one exemplary embodiment of the method of generating the merged hardware description language (HDL) file according to the invention.

Referring now to FIG. 22, one exemplary embodiment of the method 2200 of generating the merged hardware description language (HDL) file according to the invention is described.

It is again noted that while the following discussion is cast in terms of VHSIC Hardware description Language (VHDL), other languages may be used to practice the method of the invention with equal success VHDL is chosen for the illustrated examples simply for its comparatively wide-spread recognition and ease of use.

As used herein, the term "vhdlgen" refers to VHDL generation, a process within the invention by which the individual VHDL files relating to various aspects or components of the design are merged together to form a common VHDL file descriptive of the overall design.

As shown in FIG. 22, the vhdlgen method 2200 comprises first reading a control file (step 2202), followed by reading the top level data file (step 2204). These steps 2202, 2204 are described in greater detail with reference to FIGS. 23 and 24, respectively. After the top level data file is read, each dependency present is analyzed by reading the dependency data file (step 2206), as further illustrated in FIG. 25. After each dependency data file has been read, the signal list is processed in step 2208 into a plurality of groups (FIG. 27), the data integrity verified in step 2210 (FIG. 28), the associated library file read in step 2212 (FIG. 29), and the "merged" VHDL file written in step 2214 (FIG. 30).

Figure 23:
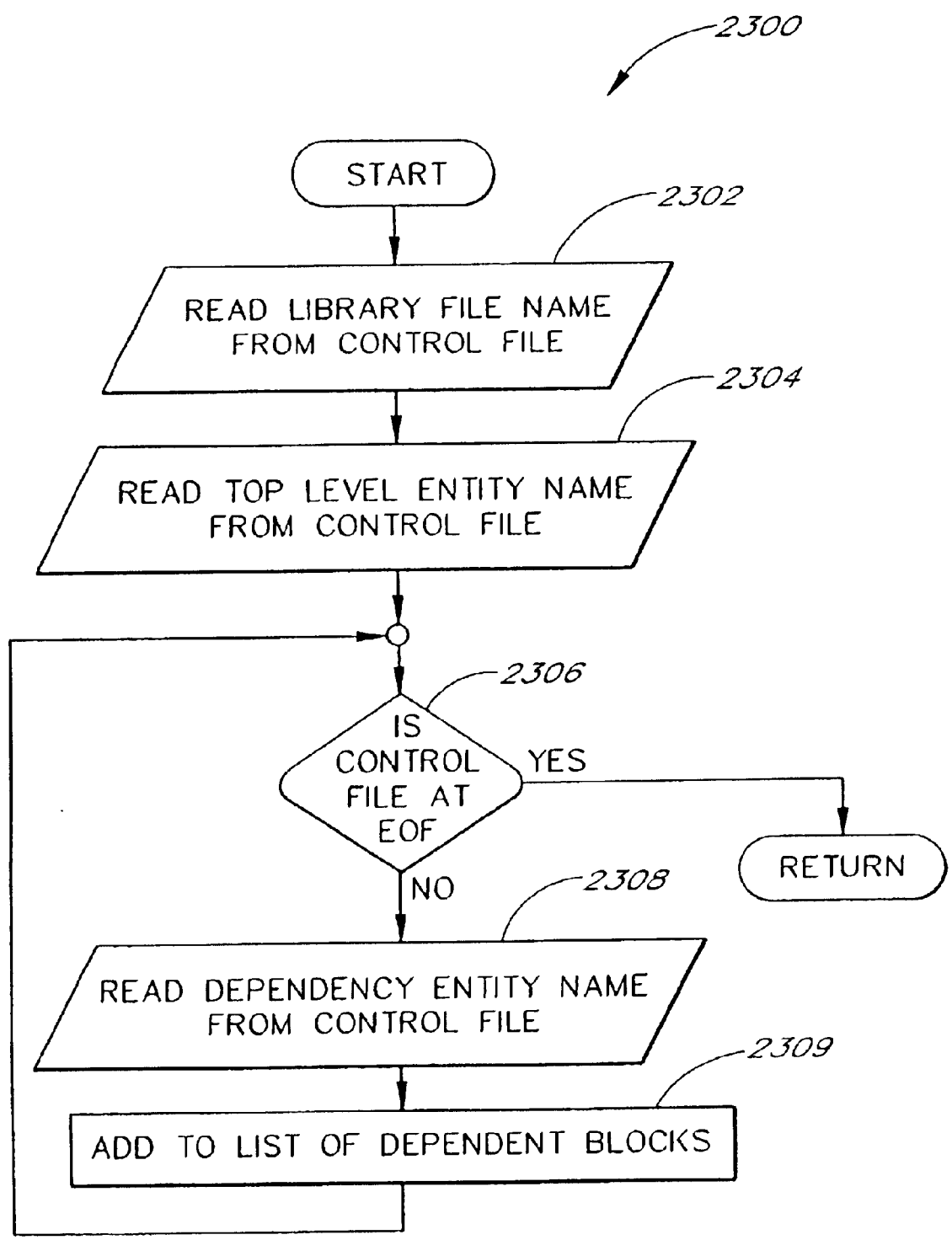
FIG. 23 is a logical flowchart illustrating one exemplary embodiment of the method of reading the HDL control file as shown generally in FIG. 22.

Referring now to FIG. 23, one exemplary embodiment of the method 2300 of reading the HDL control file as shown generally in step 2202 of FIG. 22 is described. Initially, the library file name is read from the control file in step 2302. Next, the top level entity name is read from the control file in step 2304. The control file is then examined in step 2306 to determine if it is at end of file (eof); if so, the routine is terminated and returns to step 2204 of FIG. 22. If not, the first dependency entity name is read from the control file in step 2308 and added to the list of dependent blocks in step 2309. If additional dependencies exist, they are subsequently read and added to the list of dependent blocks until the eof condition is met, at which point the routine returns to step 2204 of FIG. 22.

Figure 24:
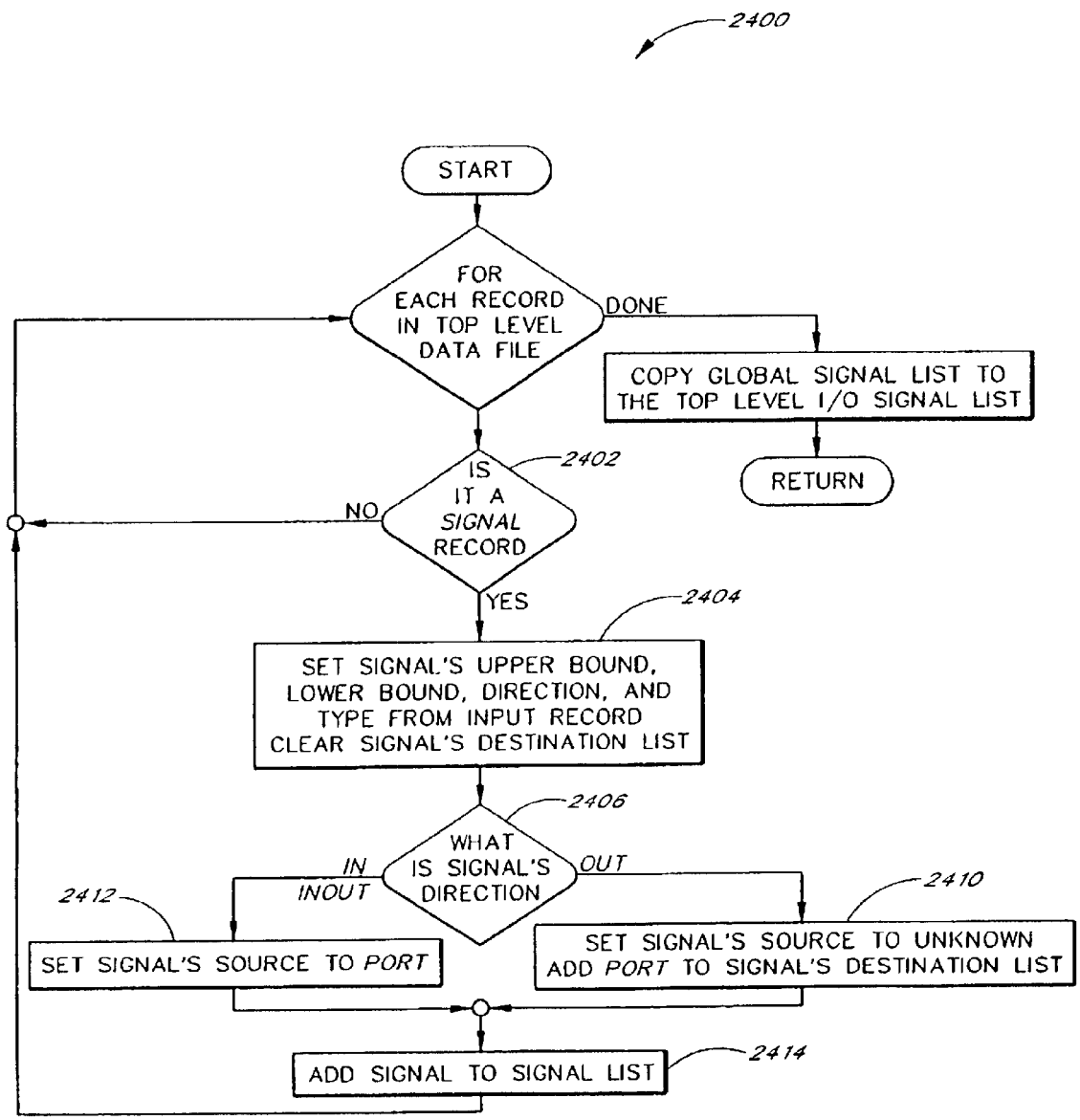
FIG. 24 is a logical flowchart illustrating one exemplary embodiment of the method of reading the HDL top level entity data file as shown generally in FIG. 22.

FIG. 24 illustrates one exemplary embodiment of the method 2400 of reading the HDL top level entity data file as shown generally in step 2204 of FIG. 22. Specifically, each record in the top level data file is examined in step 2402 to determine if it is a "signal" record; if so, the signal's upper bound, lower bound, direction, and type are set from the input record in step 2404. The signal's destination list is also cleared. Next, each signal's direction (i.e., "in", "out", or "inout") is determined in step 2406; if the direction of a given signal is "out", then the signal's source is set to "unknown", and "PORT" is added to the signal's destination list in step 2410. If the signal is "in" or "inout", then the signal's source is set to "PORT" in step 2412. Lastly, in step 2414, the signal is added to the signal list, and the next record in the top level data file subsequently read.

Figure 25:
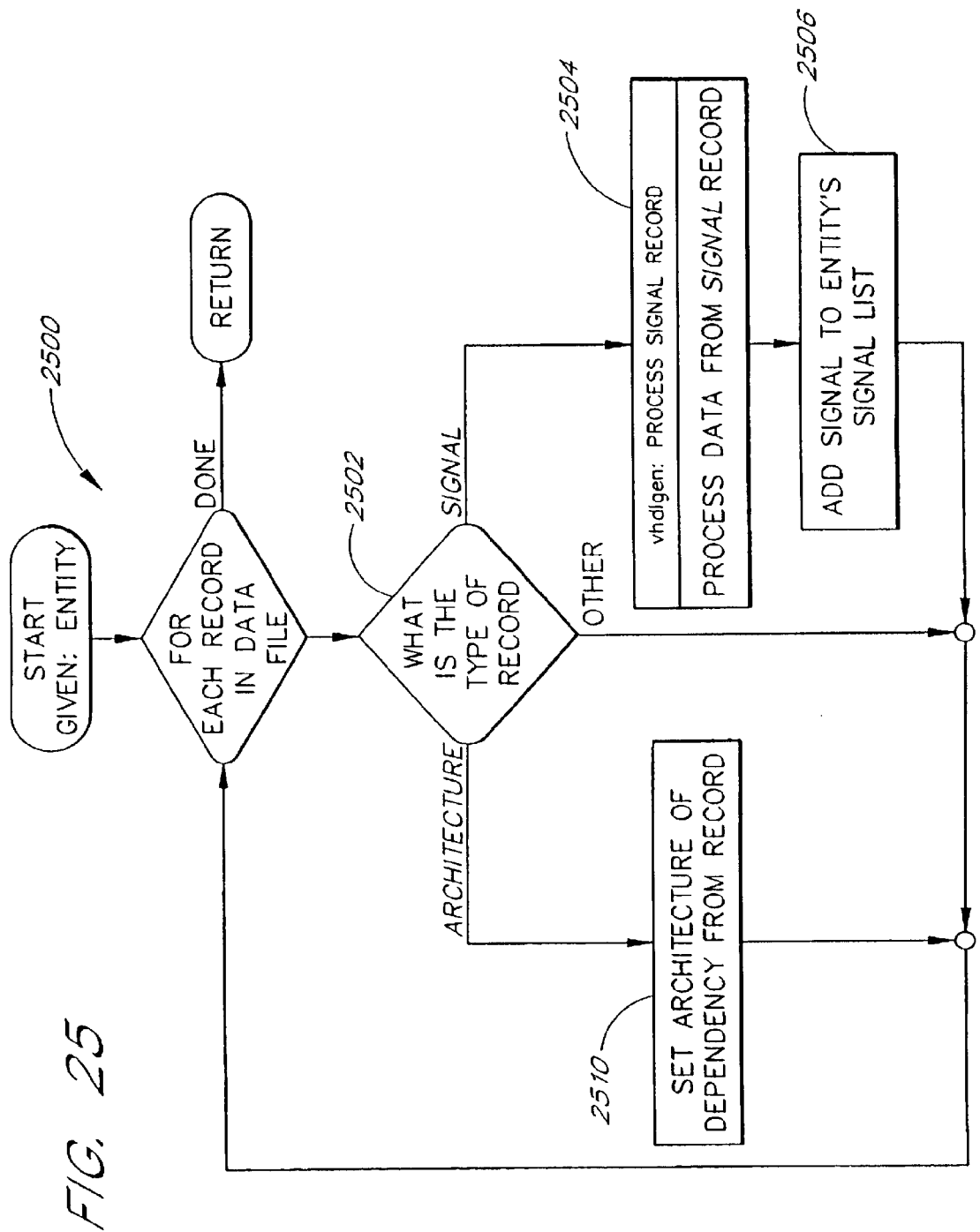
FIG. 25 is a logical flowchart illustrating one exemplary embodiment of the method of reading the HDL dependency data file as shown generally in FIG. 22.

FIG. 25 illustrates one exemplary embodiment of the method 2500 of reading the HDL dependency data file as shown generally in FIG. 22. For a given entity, each record in the data file is read and the type of record determined in step 2502. If the record is a "signal", data from the signal record is then processed in step 2504 (see FIG. 26 for additional detail on this step). After the data has been processed, the signal is added to the entity's signal list in step 2506, and the next record read. Conversely, if the record read is an "architecture" record, then the architecture of the dependency for that record is set per step 2510, and then a subsequent record read. When all records have been read, the routine is terminated in favor of step 2206 of FIG. 25.

Figure 26:
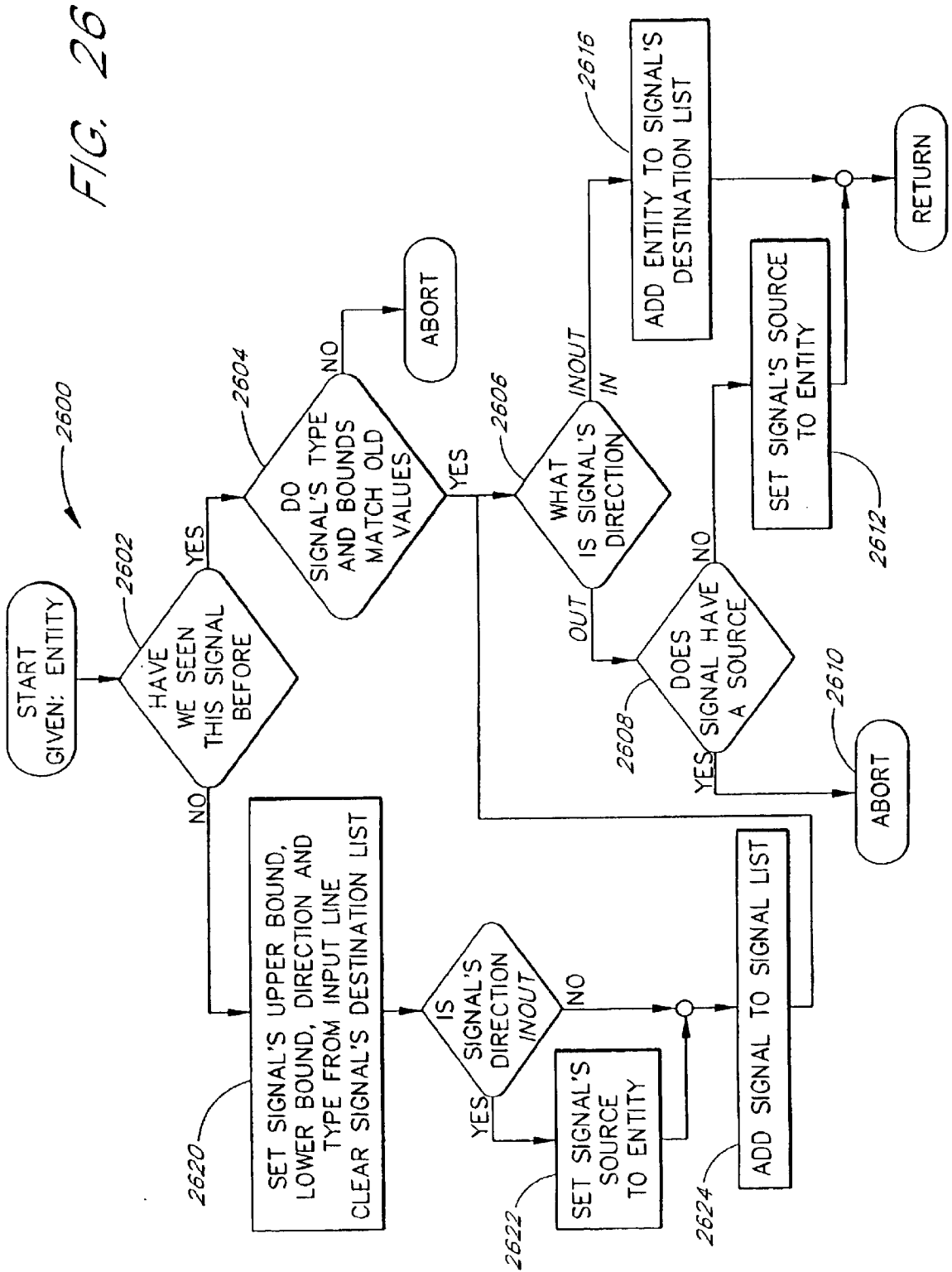
FIG. 26 is a logical flowchart illustrating one exemplary embodiment of the method of processing the signal record as shown generally in FIG. 25.

FIG. 26 illustrates one embodiment of the method 2600 of processing signal record as previously discussed with respect to FIG. 25. For the chosen entity, the algorithm 2600 first determines in step 2602 whether the signal being examined has been read before; if so, the signal's type and bounds are next examined to determine whether they match the previous occurrence of the signal (step 2604). If so, the signal's direction is next analyzed in step 2606 to determine its type. If the signal is an "out" signal, the source of the signal is then analyzed in step 2608 if a source exists, the routine is aborted per step 2610. If not, the signal's source is set to "entity" per step 2612. Conversely, if the signal is an "out" or "inout" signal, then the entity is added to the signal's destination list per step 2616.

In the case where the signal under examination has not been previously read, the signal's upper and lower bounds, direction, and type are set in step 2620 using information from the input line. The signal's destination list is also cleared. If the signal's direction is "inout", then the signal's source is set to "entity" in step 2622, and the signal added to the signal list in step 2624. If not, the signal is added to the signal list directly. After the addition of the signal to the signal list in step 2624, the routine proceeds to step 2606 for analysis of the signal's direction as previously described.

Figure 27:
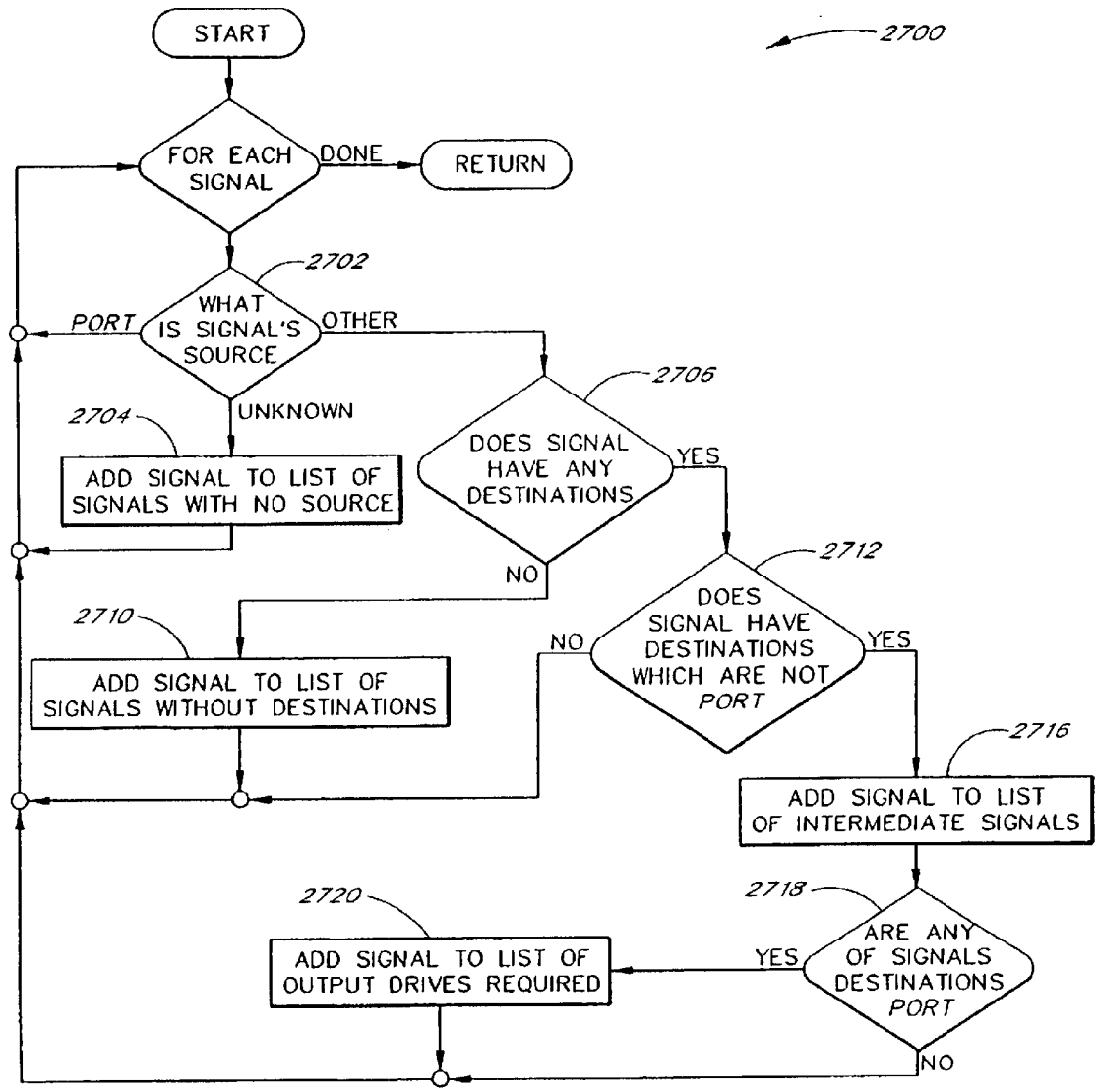
FIG. 27 is a logical flowchart illustrating one exemplary embodiment of the method of processing the signal list into groups as shown generally in FIG. 22.

FIG. 27 illustrates one exemplary embodiment of the method 2700 of processing the signal list into groups as shown generally in FIG. 22. Specifically, for each signal, the signal's source is first determined in step 2702; if the signal source is "PORT", then no further analysis of that signal is required, and the next signal is analyzed. If the signal's source is "unknown", then the signal is added to the list of signals with no source in step 2704, and the next signal analyzed. If the signal source is "other", the signal is then analyzed in step 2706 to determine if any destinations are specified. If there are no destinations specified, the signal is added to the list of signals without destinations per step 2710. If the signal does have one or more destinations, these destinations are then examined in step 2712 to determine if any are destinations other than "PORT". If so, then the signal is added to the list of intermediate signals per step 2716. Next, in step 2718, the destinations of the signal are again examined to determine if any of these destinations are "PORT"; if yes, the signal is further added to the list of signals requiring output drives in step 2720.

Figure 28:
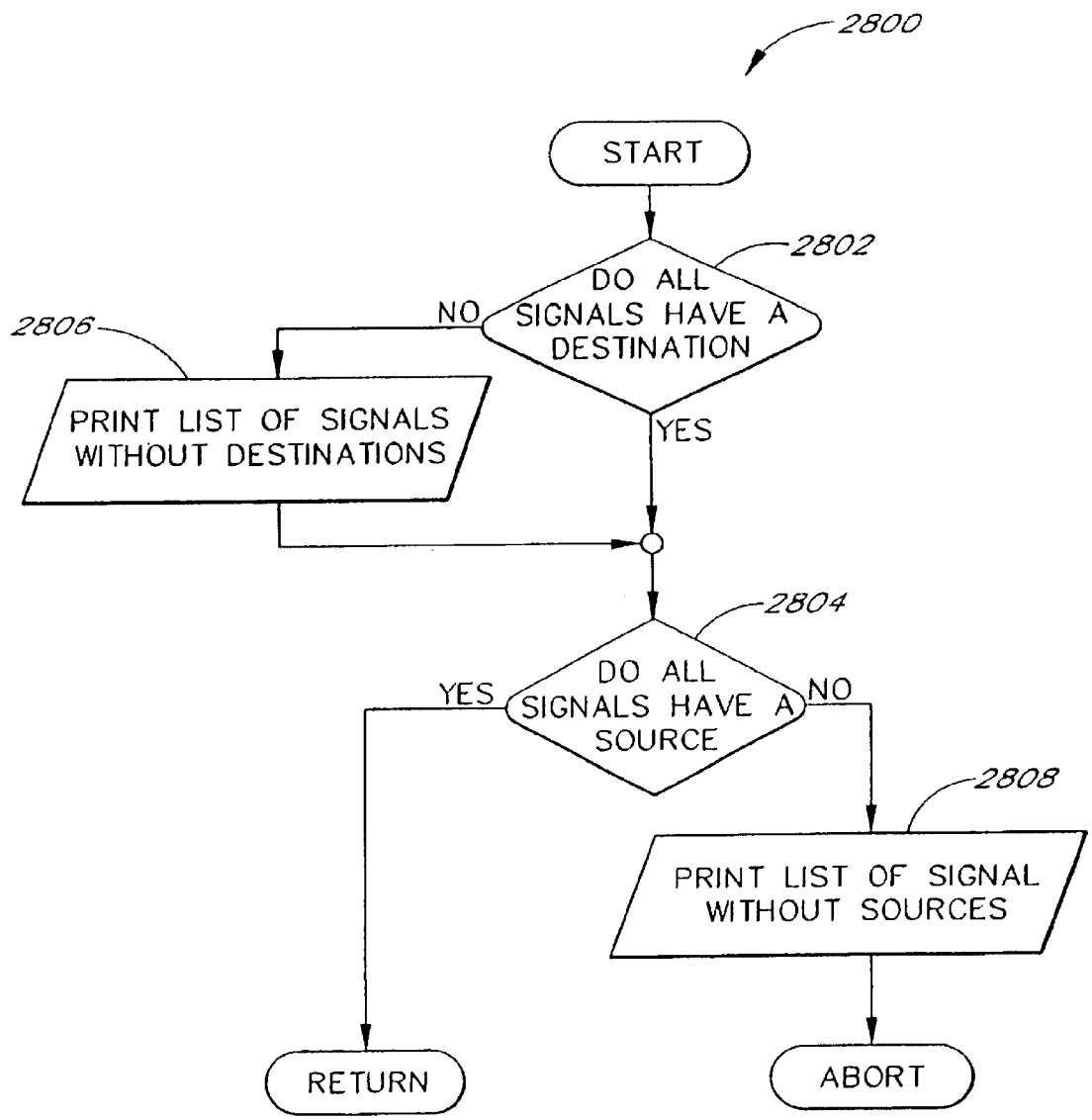
FIG. 28 is a logical flowchart illustrating one exemplary embodiment of the method of verifying data integrity as shown generally in FIG. 22.

Referring now to FIG. 28, one exemplary embodiment of the method 2800 of verifying signal data integrity as shown generally in FIG. 22 is described. First, in step 2802, each signal is examined to determine if it has an associated destination. If so, the existence of an associated source is then checked in step 2804. If both source and destination exist for all signals, the routine is terminated. If no destination is present for one or more signals in step 2802, a list of signals without destinations is printed per step 2806. If all signals have destinations but one or more signals do not have a source, a list of signals without sources is printed per step 2808.

Figure 29:
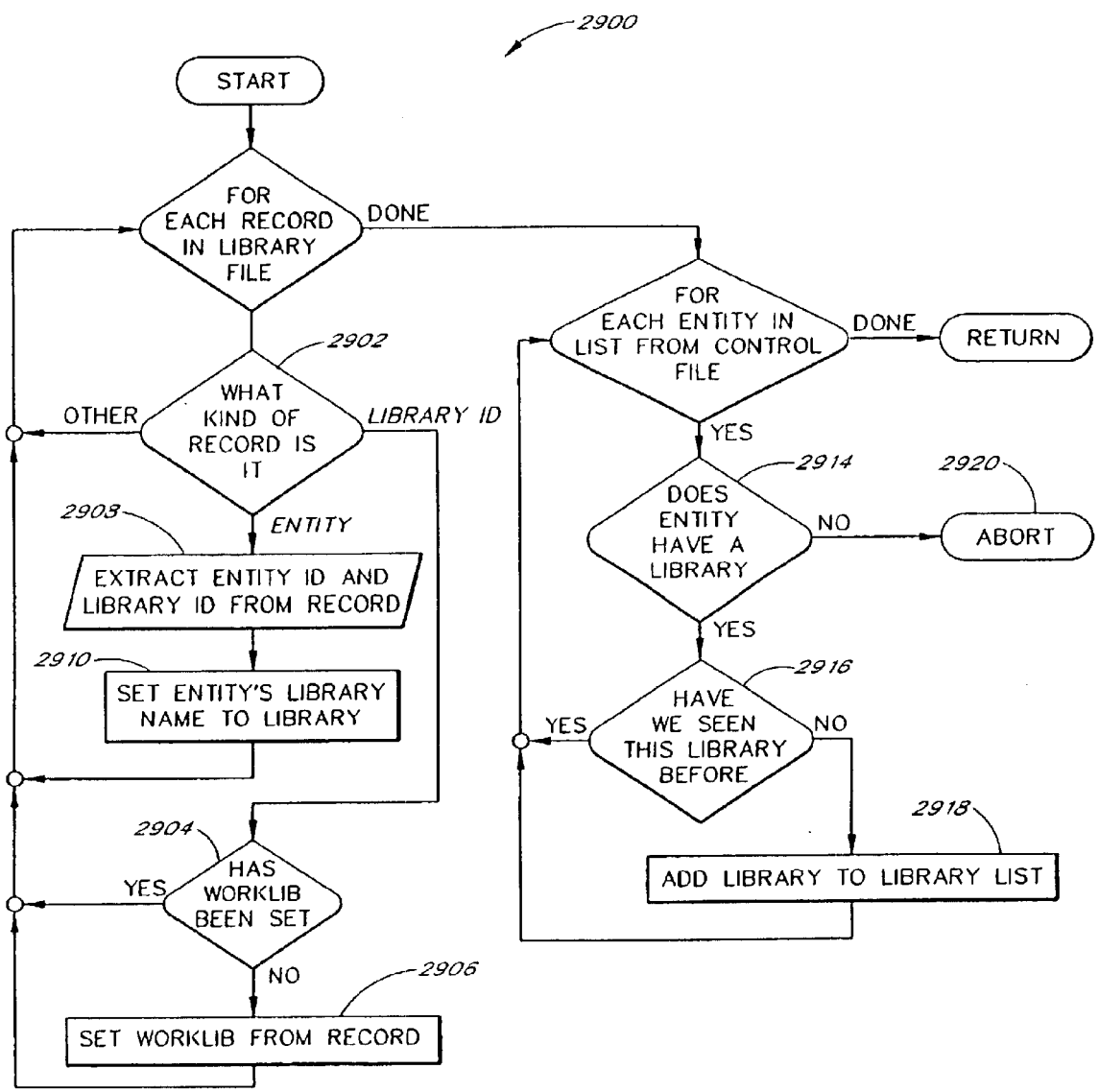
FIG. 29 is a logical flowchart illustrating one exemplary embodiment of the method of reading the library file as shown generally in FIG. 22.
Figure 30:
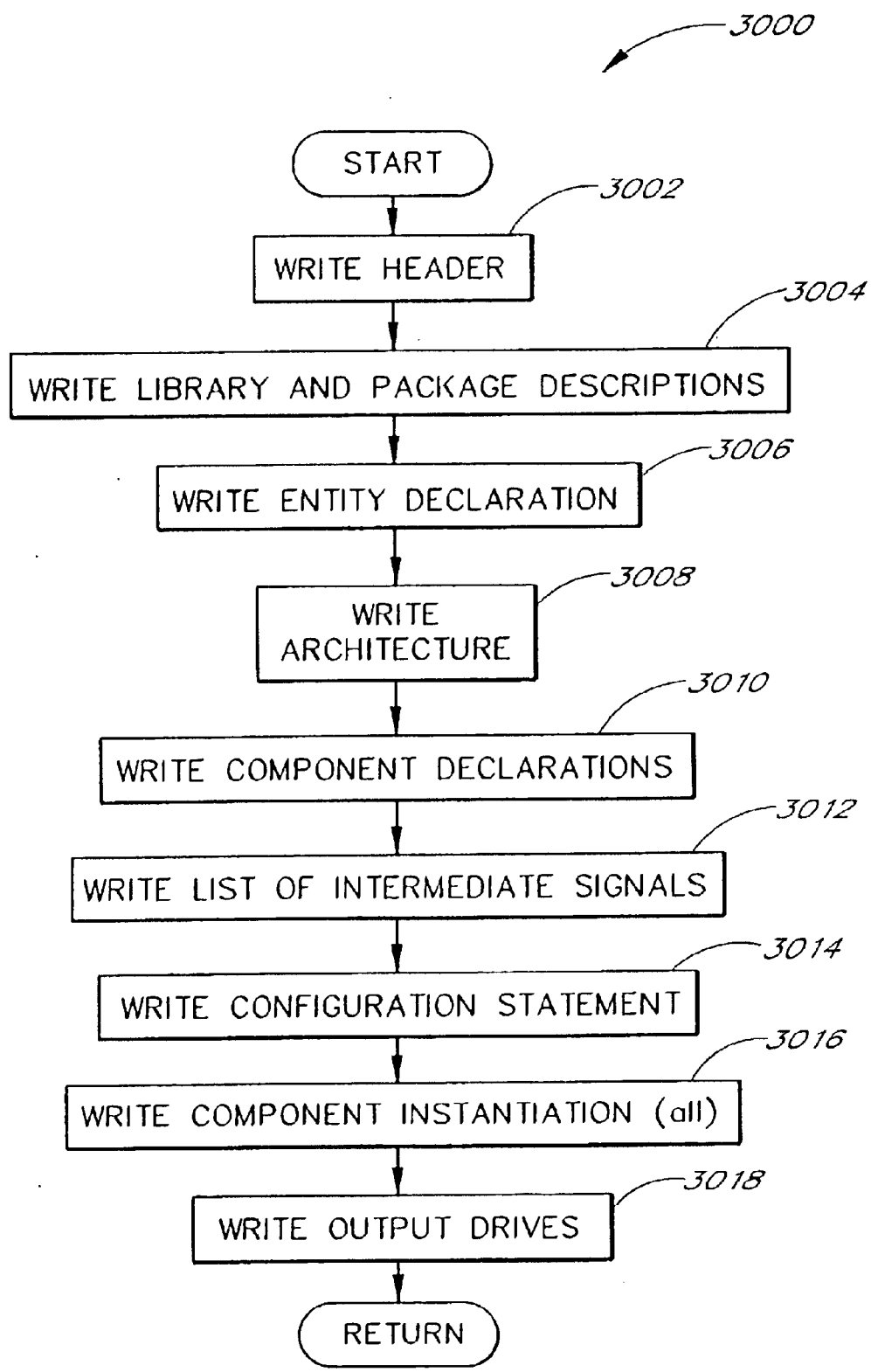
FIG. 30 is a logical flowchart illustrating one exemplary embodiment of the method of writing the HDL file as shown generally in FIG. 22.

FIG. 29 illustrates one embodiment of the method 2900 of reading the library file as shown generally in FIG. 22 herein. For each record present in the given library file, a determination is first made in step 2902 as to what type of record is under analysis; if the record is a "library id", then the status of setting the "worklib" flag is determined in step 2904. If the flag has not been set, it is set from the present record per step 2906. If it has been set, then the next subsequent record is read from the library. If the record is an "entity" record, the "entity id" and "library id" are extracted from the record in step 2908, and the entity's library name is set to "library" in step 2910.

Lastly, if the record is classified as "other" in step 2902, then no action is taken and the next subsequent record is read.

After each record has been read from the selected library and analyzed as to type, each entity is examined to determine whether it has an associated entity library per step 2914. If a given entity does have a library, that library is next analyzed in step 2916 to determine if that library has been read before. If so, the next sequential entity is analyzed. If not, the library is added to the library list in step 2918, and then the next subsequent entity analyzed. If the entity has no associated library in step 2914, then the program is aborted per step 2920.

Referring now to FIG. 30, one exemplary embodiment of the method 3000 of writing one or more HDL files as shown generally in FIG. 22 is described. The VHDL file is written in a sequence of steps that conform to the specification for VHDL format. It is noted that other HDL languages may employ differing formats that result in some information becoming unnecessary, or required in a different order. The first step 3002 of the illustrated method 3000 comprises writing the VHDL file header to a VHDL file. Next the list of libraries and packages used is written to the VHDL file in step 3004. Next the entity declarations are written to the VHDL file in step 3006. Subsequently the architecture information is written to the VHDL file in step 3008. In the next step 3010, VHDL component declarations are written to the VHDL file. The list of intermediate signals is then written to the VHDL file in step 3012, and VHDL configuration statements are written to the VHDL file in step 3014. Then, in step 3016, all component instantiations are written to the VHDL file. Finally, output drives are written to the VHDL file in step 3018. This completes the hardware description language file generation process.

It is noted that while the foregoing description of FIGS. 2–30 refers to specific embodiments of the various aspects of the method of the invention, various substitutions, alterations, permutations, additions, and deletions may be made to the disclosed method. For example, certain routines disclosed herein may be selectively employed, or the order in which they are employed with respect to other routines varied. Similarly, individual steps within each of the routines may be modified as required by the particular application.

Description of the IC Design Apparatus

Figure 31:
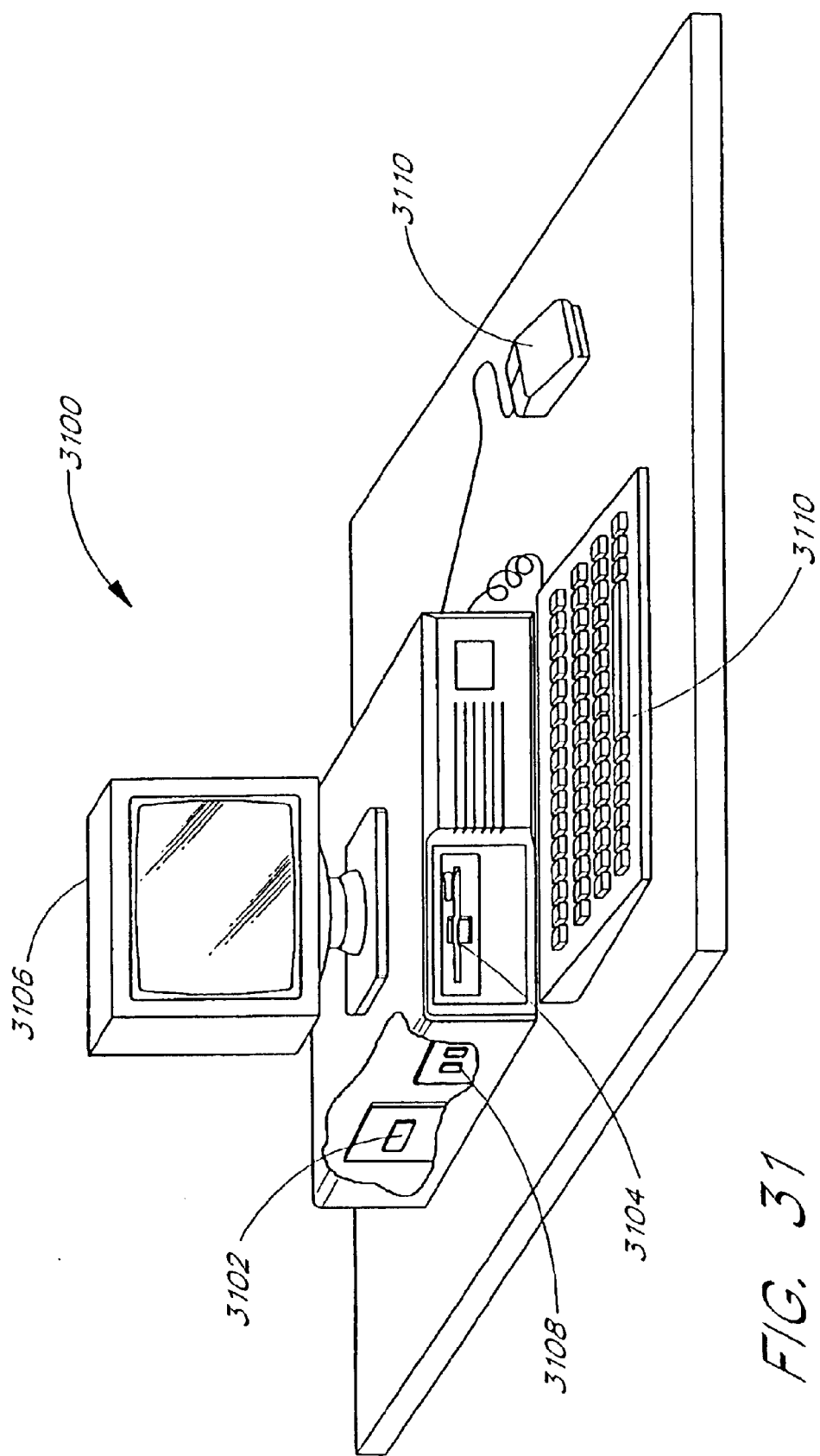
FIG. 31 is a perspective view of one exemplary embodiment of an integrated circuit design apparatus according to the invention.

Referring now to FIG. 31, an exemplary apparatus capable of implementing the method of FIGS. 2–32 is described. A stand-alone microcomputer system 3100 of the type well know in the computer arts, having a processor 3102, internal or external storage device 3104, display device 3106, internal memory 3108, and input device 3110, is used. The algorithm 100 of FIG. 2, embodied in the form of a computer program reduced to machine readable object code as is also well known in the art (not shown), is loaded into the storage device 3104 and memory 3108 of the system 3100 and run on the processor 3102 based on inputs provided by the user via the input device 3110. Alternatively, the computer program may reside on a removable storage device (not shown) such as a floppy disk or magnetic data cartridge of the type well known in the art. The display device 3106, which may comprise for example a cathode ray tube (CRT), liquid crystal display (LCD), thin film transistor (TFT), or plasma display, provides the user with a variety of visual information including representations of the program's menu structure, and the status and output of various routines or modules running within the program. See Appendix I for one exemplary embodiment of the menu structure used in conjunction with the aforementioned computer program. While the illustrated embodiment is a microcomputer, it will be recognized that other computer types and architectures may be used with equal success, For example, a networked minicomputer system or client/server arrangement wherein data or libraries relating to the design are not resident on the local system 3100 may be employed, or alternatively, a plurality of different computers may be used to run parts of the computer program in parallel. Many varying architectures and equipment/software configurations may be substituted, consistent with the general aims of providing an automated, interactive design process.

Description of the Integrated Circuit

Figure 32:
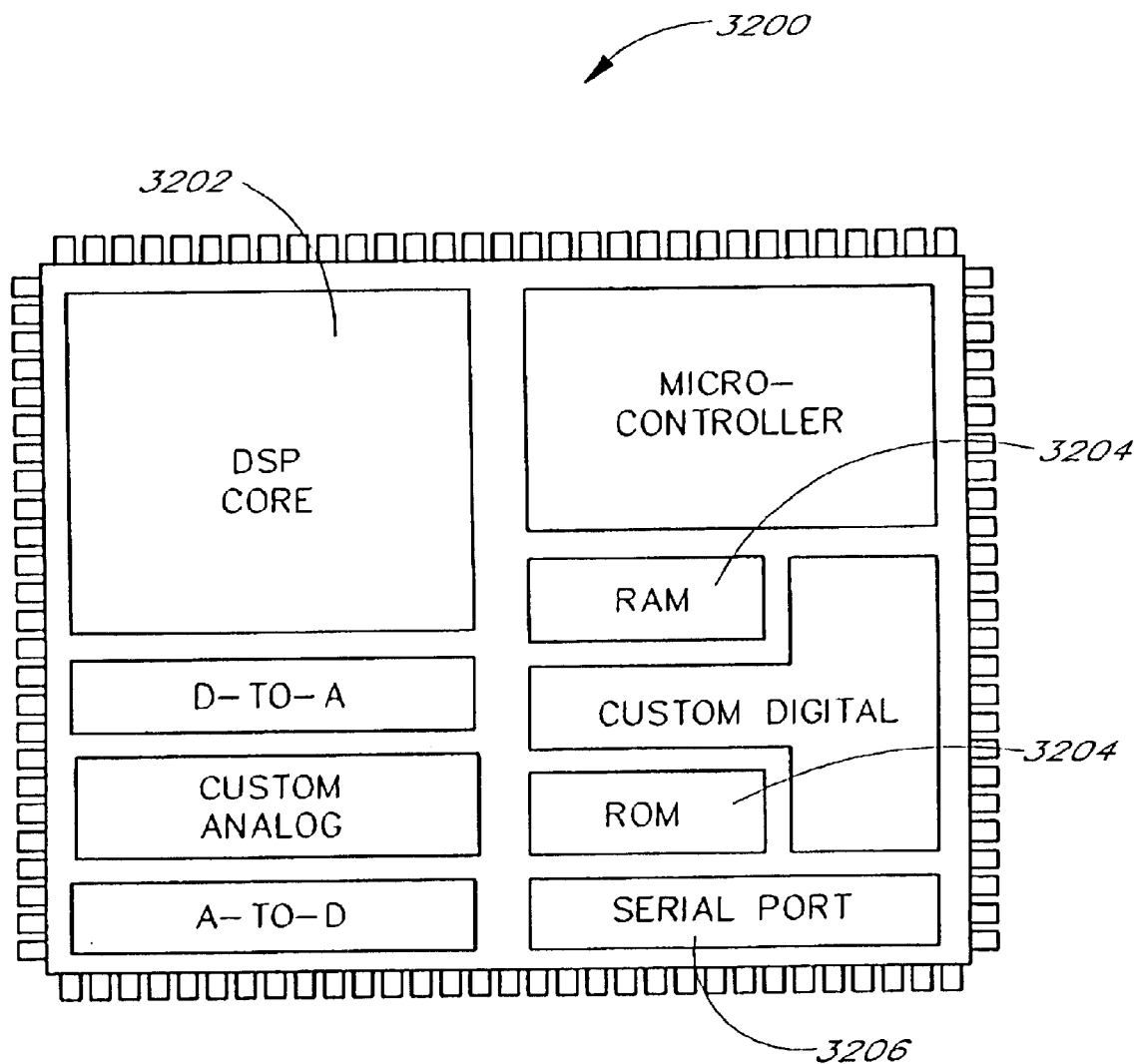
FIG. 32 is a top plan view illustrating the layout of one exemplary embodiment of a processor-based integrated circuit designed using the method of the invention.

Referring now to FIG. 32, an exemplary integrated circuit developed using the above-described method of the present invention is disclosed. As shown in FIG. 32, the integrated circuit 3200 is an ARC microprocessor-like CPU device having, inter alia, a processor core 3202, on-chip memory 3204, and an external interface 3206. The device is fabricated using the customized VHDL design obtained using the present invention (step 108 of FIG. 2) which is subsequently synthesized into a logic level representation, and then reduced to a physical device using compilation, layout and fabrication techniques well known in the semiconductor arts. As previously noted, the designs for a wide variety of other types of integrated circuits (including, for example, ASICs and FPGAs) can be synthesized using the method and apparatus set forth herein. Hence, the CPU-based device of FIG. 32 is merely exemplary of such devices.

It will be appreciated by one skilled in the art that the Integrated Circuit of FIG. 32 may contain any commonly available microcontroller peripheral such as serial communications devices, parallel ports, timers, counters, high current drivers, analog to digital (A/D) converters, digital to analog converters (D/A), interrupt processors, LCD drivers, memories and other related peripherals. Further, the Integrated Circuit may also include custom or application specific circuitry that is specifically developed to solve a specific applications problem or meet the needs of a single application. The present invention is not limited to the type, number or complexity of peripherals and other circuitry that may be combined using the method and apparatus. Rather, any limitations are imposed by the physical capacity of the extant semiconductor processes which improve over time. Therefore it is anticipated that the complexity and degree of integration possible employing the present invention will further increase as semiconductor processes improve.

It is noted that power consumption of devices such as that shown in FIG. 32 is significantly reduced due in part to a lower gate count resulting from better block and signal integration. Furthermore, the above-described method provides the user with the option to optimize for low power (or use a low power silicon process such as Xemics for example). The system may also be run at a lower clock speed, thereby further reducing power consumption; the use of one or more custom instructions and/or interfaces allows performance targets to be met at lower clock speeds.

It is also noted that many IC designs currently use a microprocessor core and a DSP core. The DSP however, might only be required for a limited number of DSP functions, or for the IC's fast DMA architecture. The invention disclosed herein can support many DSP instruction functions, and its fast local RAM system gives immediate access to data. Appreciable cost savings may be realized by using the methods disclosed herein for both the CPU & DSP functions of the IC.

Additionally, it will be noted that the computer program as previously described herein can readily be adapted to newer manufacturing technologies, such as 0.18 or 0.1 micron processes, with a comparatively simple re-synthesis instead of the lengthy and expensive process typically required to adapt such technologies using "hard" macro prior art systems.

While the above detailed description and Appendices have shown, described, and pointed out novel features of the invention as applied to various embodiments, it will be understood that various omissions, substitutions, and changes in the form and details of the device or process illustrated may be made by those skilled in the art without departing from the spirit of the invention. The foregoing description is of the best mode presently contemplated of carrying out the invention. This description is in no way meant to be limiting, but rather should be taken as illustrative of the general principles of the invention. The scope of the invention should be determined with reference to the claims.

APPENDIX I

© Copyright 1998-2002 ARC International plc. All rights reserved.
The following describes and illustrates the operation of the ARC System Builder Program:

Installation Script
Installation script allowing the following ARC features to be selected:
- ?Extensions required
- ?Cache size
- ?Cache line length
- ?Size of external memory space that is to be cached.
- ?Clock period
- ?Clock skew
- ?Synthesized d-latches or 3-port RAM for register file
- ?Type of technology being used.
- ?Manufacturer code and version number information
-

The script creates a working directory for the user, and in it creates the following:
- VHDL for the extensions selected
- VHDL for a direct mapped I-cache configured to user's specification
- VHDL test-bench for testing basecase operation and external interfaces
- VHDL structure to link together all required modules
- Configuration files for Synopsys Design Compiler
- Memory image file containing basecase test code
- Synthesis script for Synopsys Design Compiler v3.4b or above
- Makefile - set up for the Model Technologies VSystem/VHDL simulator, but can be altered for use with other simulation environments.

The user can select from 4 different types of build:
- Core Build
- Generic System Build
- Altera Build (for ARCAngel™ development board)
- Core Verification System After setting up his ARC area, before the user can use the *ARC system builder*, several environment variables need to be set.

In .cshrc:

Set ARCHOME environment variable, base of the arc install tree. Add bin directories to path. Set other environment variables such as ARC_MANCODE and ARC_MANVER and ARCASIC. (If these variables are not set the build script will ask for them at run time.)
e.g.
setenv ARCHOME /apps/ARC Cores

```
setenv ARC_MANCODE <Users Manufacturer code>
setenv ARC_MANVER <Users selected version number>
set path = ($ARCHOME/arc/bin $path)
```

ARC_MANCODE is the unique manufacturer code that ARC Cores gives to each ARC licensee, and the ARC_MANVER is that manufacturers additional identity number. Both numbers go on to be stored as part of the identity register.

After setting up the environment, the ARC system builder can be run just by typing system_builder, which is an executable script. A log file (sys_bld.log), which keeps a record of the build selections the user make, is created in the directory that the user specify for the user working directory.

The ARC System builder script when run produces a series of text menus/questions.

Example MENU 1
1. Continue.
2. Valid selection.
3. * Mutually exclusive.
4. Mutually inclusive.
- * Permanently selected.
N/A Invalid selection.
7. * Valid selection
Please select :

The above menu shows an example menu. The '*' next to a menu entry indicates that it is selected.

Continue
On all the menus that allow multiple selections 1 is always continue.

Valid selections
In this example menu entry 2 is a valid selection which is currently unselected. Menu entry 7 is also a valid selection, which is selected. Valid selections can be selected and deselected by entering their corresponding menu number. (When menus are initially displayed some valid selections may be pre-selected; these are just recommended selections for this build.)

Mutually exclusive selections (On the same menu)
Selections are mutually exclusive, for example two *types* of the same extension cannot be selected at the same time. If one menu entry, of a mutually exclusive set, is already selected and the user then selects the another, the first is deselected.

Mutually inclusive selections (Between menus)

Mutually inclusive relationships can exists between menu entries on two separate menus. If this is so, the entry on the second menu is either permanently selected or invalid depending on the state of the first entry.

Permanent selections
In certain circumstances menu entries usually valid select/deselect are permanently selected, e.g. Example menu entry 5. This usually because on a previous menu the user selected a menu entry to which this one is mutually inclusive. Permanent selections can also be active due to the build type.

Invalid selections
As with permanent selections, invalid selections are normal valid select/deselect menu entries, however in this case these options are not available. This is usually due to either mutually inclusive selections on previous menus that were not selected, or this selection is not available on this type of build. Menu entry 6 is an example of an invalid selection.

Example MENU 2
1. Selection 1.
2. Selection 2.
3. Selection 3.
4. Selection 4.
Please select(3) :

Menu Default
Some menus in the *ARC system builder* have default selections. On such menus entering nothing, i.e. just pressing enter, will select the default. The default menu entry number is specified next to the requestor. Menu defaults can be more than just numbers, on some questions they can be file paths, y/n etc.

The following describes examples for each of the four types of build available, Base case, Generic, ARCAngel and Core verification.
The first menu the user will encounter for all installations is the one below:

ARC System Build Tool - ARC System install.
(c) 1998 ARC Cores Technologies Ltd.
Generic install
This program is capable of creating a basecase ARC or a complete ASIC for simulation, using MTI and synthesis using Synopsys Design Compiler/Design Expert.
We're going to make :
1. The directory structure
2. The structural VHDL levels
3. A personalized version of the cache config package
4. An optional external memory interface
5. Synopsys RAM models for the cache RAMs
6. Synthesis scripts 7. A simulation makefile
But first, you must answer some questions :
Please select the type of system you wish to build.
1. Core build with selected extensions
2. Generic System Build with selected core/memory extensions
3. Altera Build for ARCAngel Development Board
4. Core Verification System.
Please select (1) :

This menu allows the user to select from four types of build Core (Base case) build, Generic, ARCAngel and Core Verification. We will now example an install of all four types, showing the menus the user will encounter and 'typical' responses.

1. Base case

From the first menu we select 1, which is also the default. The ARC system builder will then prompt the user for details about the Core build, i.e. Standard extensions (not including any scratchpad extensions), Direct mapped instruction cache, Load/ST interface to external memory, Host interface and model of external memory.

=-=-=-=-=-=-=-= Instruction/Data byte Address selections =-=-=-=-=-=-=-=-=-
Instruction
Fetch memory system byte address bus width
1. 22 bit (4Mb)
2. 23 bit (8Mb)
3. 24 bit (16Mb)
4. 25 bit (32Mb)
5. 26 bit (64Mb)
Please select (3) :

This menu asks for the number of bits for the instruction fetch address. For the purpose of this example we will select the default of 24 bit (16Mb), by pressing ENTER.

The external memory system data bus width is 32 bits wide

The external data bus on the ARC is 32-bits wide.

External memory system address bus width (22 < address < 32)(24) :

The external memory system data bus width can range from 22 to 32 bits, 4Mb to 4Gb address range, the default on this menu is set to the value of the I-fetch address bus width. We are going to select 29 bits, an address range of 512 Mb. NOTE: Even though the bus width is set to an arbitrary value the memory model for a core build simulation is 128Kbytes.

=-=-=-=-=-=-=-=-=-=-= Core Register File Selection =-=-=-=-=-=-=-=-=-=-=
The 32x32 register file can be implemented using a synthesized array of d-latches, or by using a three-port (2 read, 1 write) synchronous
RAM cell.
Use a synchronous 2r1w RAM for the register file? (y) :

For the 32 general purpose registers r0-r31 the user can either use : Synchronous 3-port
(2r1w) RAM, (a fast write-through is not required).
Synthesized arrays of d-latches that require a write pulse to be generated.
Standard synthesis script assumes a 90°-delayed clock signal, for the synthesized array
of d-latches.

We will use a synchronous 3-port RAM and so we select y.

=.=.=.=.=.=.=.=.=.=.=.=.=.=.=.= Fast Load Returns .=.=.=.=.=.=.=.=.=.=.=.=.=.
Enable Fast load returns? (n) :
Fast Load returns, if the current instruction does not use register write back then the
pipeline is not stalled.

=.=.=.=.=.=.=.=.=.=.=.=.=.=.= Extensions Builder =.=.=.=.=.=.=.=.=.=.=.=.=.=
Select the extensions to be added to the ARC
1. Continue
2. 32x32 Barrel shifter - rotate, arithmetic and logical shifts - 1 cycle
3. 32x32 Barrel shifter - rotate, arithmetic and logical shifts - Multi-cycle
4. Small multi-cycle 32x32 Multiply
5. Faster (& larger) 32x32 Multiply
6. 16x16 Multiply/Multiply Accumulate function with 36 bit accumulator - Fast
7. 16x16 Multiply/Multiply Accumulate function with 36 bit accumulator - Slow
8. Swap function - swaps upper and lower 16 bits of 32 bit word
9. MIN/MAX function - 32 bit precision
10. Normalize function - finds first bit set in 32 bit word
11. 24-bit Timer which counts to limit and then generates an interrupt
N/A A Scratchpad RAM
N/A A Scratchpad RAM with Sliding Pointers
Please select :

The above menu shows all the standard extensions, the user can select different
combinations depending on his needs.

We will select the single cycle barrel shifter and the 32x32 multiply. Entering 2 and
then entering 4 does this. If we wanted to disable the multiply we could do this by
entering 4 again.

Note the user cannot select both types of barrel shifters, in an install, selecting one
automatically deselects the other. This also applies to both instances of the 32x32
multiplier, the MAC and both instances of the Scratchpad RAM.
We will now enter 1 to continue.

-47-

=.=.=.=.=.=.=.=.=.=.=.=.=.=.=.= Technology Selection =.=.=.=.=.=.=.=.=.=.=.=.=.=.=.=

Feature size (drawn) of technology in use
1. 0.35um
2. 0.5um
3. 0.65um
4. 0.8um
5. 1.0um
Please select (5) :

The feature size provides timings for DATA / TAG ram and the core registers. Our chosen technology is 1.0?m so we press ENTER to continue.

The default synthesis script is set-up for the 1.0?m LSI_10K library supplied with the Synopsys synthesis tool.

These values are only used to set the timings for the synthesis of RAM models. If an unsupported feature size required the user can select an arbitrary value and following the build change the clock period for the simulation of the VHDL and synthesis scripts to support the new feature size, timings of RAM etc.

Target clock speed in MHz (20)

We will use the default of 20MHz as we have specified 1.0 ?m technology. Clock speed has a minimum of 1 MHz and a Maximum of 150 MHz.

Clock skew for synthesis (+/-1.5ns) :

The default of 1.5ns will be used for this example. Clock Skew has a minimum of 0 and a maximum less than the clock period.

Library for extensions logic? (user) :

Here the user can specify a name for his user's library. This name will be used as the VHDL library names and also during the install when creating directories and copying subsequent files to these directories (The directories created are in upper case). The name entered is arbitrary so we will enter 'Alex'.

=.=.=.=.=.=.=.=.=.=.=.=.=.=.= Memory Extensions =.=.=.=.=.=.=.=.=.=.=.=.=.=.=
Do you wish to include a Direct-Mapped Instruction Cache? (y) :

If the user enters "no" here the user will build an ARC with no cache, if the user enters "Yes" he will be prompted to for further information about the cache he wants. We will enter "Yes" the default.

-48-

=-=-=-=-=-=-=-=-=-=-=-=-=-= Ifetch Modes =-=-=-=-=-=-=-=-=-=-=-=-=-=
Select the instruction Cache Modes.
1. Continue
2. Standard Cache with debug and cache bypass capability.
3. Virtual Cache
4. Mixed Code RAM / Icache space & Cache line lock The first thing the script needs to know is what kind of cache do the user want. It's possible to have a :
1. Standard Cache
2. Virtual cache allows a user to dynamically resize the cache in software.
3. Mixed Code RAM / Icache space with Line locking
NOTE: Standard Cache and Virtual Cache are mutually exclusive, and Mixed Code RAM is a superset of Standard Cache. We want to try a range of cache sizes to see what cache size best suits our application, therefore we are selecting Virtual Cache Please select the max size of the Direct Mapped Instruction Cache.
1. 0.5k bytes, 128 words
2. 1k bytes, 256 words
3. 2k bytes, 512 words
4. 4k bytes, 1024 words
5. 8k bytes, 2048 words
6. 16k bytes, 4096 words
7. Other size
Please select (3) :

The Direct Mapped Instruction cache is user definable, using the script the user can select sizes from 4 bytes (1 word), up to 512k bytes (128k words). There are shortcuts for 512 bytes to 16K bytes, but other sizes (larger or smaller) can be entered manually using option 7. For our test 4K bytes (selection 4) is sufficient.

Please select the min size of the Direct Mapped Instruction Cache.
1. 0.5k bytes, 128 words
2. 1k bytes, 256 words
3. 2k bytes, 512 words
4. 4k bytes, 1024 words
- 8k bytes, 2048 words
- 16k bytes, 4096 words
7. Other size
Please select (3) :

Virtual Cache requires a range of possible caches and line lengths so a minimum cache size is required. We will enter 2 512 bytes.

Select a max Cache line length

```
1. 2 instruction words
2. 4 instruction words
3. 8 instruction words
4. 16 instruction words
5. 32 instruction words
6. Other
Please select (3) :
```

The cache line length is the number of words fetched when a cache miss occurs. The script has options for 2, 4, 8, 16, or 32 word lines, the default being 8 words. Selecting 4, will give a cache line length of 16 words, suitable for our test.

```
Select a max Cache line length
1. 2 instruction words
2. 4 instruction words
3. 8 instruction words
4. 16 instruction words
- 32 instruction words
6. Other
Please select (3) :
```

Virtual Cache requires a range of possible caches and line lengths so a minimum cache line length is required. Entering 1, selects two instruction words. Cache size, line length and external address all determine the size of the tag RAM. Larger cache means more tag words and fewer tag bits. Longer line length means fewer tag words and more tag bits.

=.=.=.=.=.=.=.=.=.=.=.=.=.==.=.= Simulation =.=.=.=.=.=.=.=.=.=.=.=.=.=.=.=

Selection of the state of the ARC on reset is important since it is preferable to have the system build start on reset while the core build should halt on reset since the host effectively clears the halt bit during simulation.
Do you wish to halt the ARC at address location 0 on reset (y) :

We have entered 'y' here, that means the ARC is halted immediately on reset. Had we selected 'n' the ARC starts running the code at address 0 on reset.
The default for this is Y on core build and N on generic and ARCAngel builds.

Note you will have to set the status register to the appropriate start address and clear the halt bit through the host interface before running the simulation.
You can manually edit "arc_start" in xaux_regs.vhdl so that the ARC is running following a reset.

Having selected 'y' the above information message is displayed.

Is your VHDL simulator Model Technologies VSystem? (y) :

At ARC Cores we enter 'y' as we use MTI VSystem to simulate our VHDL. If the user use a different simulator, select no. The user may set his environment up for his simulator by editing the makefile and other support files, after the install has completed.

Do you wish to use the R.T.L. And SeeCode Application Link (RASCAL)? (n) :

RTL And See-Code Application Link, otherwise known as RASCAL™, is an extra utility that connects the Metaware debugger to connect to the Modeltech simulator. This allows the debugger to control the simulation of code on the ARC system model in the MTI simulator for hardware/software co-verification. The default is no which is what we want for this build.

=.=.=.=.=.=.=.=.=.=.=.=.=.= Install Directory =.=.=.=.=.=.=.=.=.=.=.=.=.=
Full path to ARC user working directory (/home/someone/basearc) :

At this prompt the user have to specify a destination directory name (with full path).
The path must not include /tmp_mnt/ etc.
We will select the default, a directory named "basearc" created where we launched the ARC system builder.

What we have built:
I-fetch address bus width 24-bit
external address bus width 29-bit
register file 3-port RAM
Fast Load returns 'no'
Extensions Single Cycle Barrel shifter
Small multi-cycle 32x32 multiply
Clock speed 20 MHz
Clock skew 1.5 ns
Technology size 1.0 ?m
Users library name 'alex'
Direct mapped instruction Virtual
Max/ Min instruction cache size 4K bytes 512 bytes
Max/ Min Cache line length 16 instruction words 2 instruction words
Halt ARC on Reset? 'yes'
Destination directory /home/user/basearc
Simulator = MTI? 'yes'
RASCAL 'no'

2. Generic
The second selection from the first menu is the generic build. This is similar to the base case build however it allows the selection of memory extensions. As described in the generic build certain selections determine which menus the user will see, we are going to make selections in this example that will give access to all menus.

=-=-=-=-=-=-=-=-= Instruction/Data byte Address selections =-=-=-=-=-=-=-=-=-=-
Instruction
Fetch memory system byte address bus width
1. 22 bit (4Mb)
2. 23 bit (8Mb)
3. 24 bit (16Mb)
4. 25 bit (32Mb)
5. 26 bit (64Mb)
NOTE: If you intend to use the PC parallel communications host port do not exceed 24-bits
Please select (3) :

This menu asks for the number of bits for the instruction fetch address. For the purpose of this example we will select 22 bit (4Mb), by entering 1.
NOTE: Later in the build the user will be asked to select a host port for communications with the ARC. The SUN/PC parallel communications host port has maximum of 24-bits, if the user select a value greater than 24-bits in this menu the PC host port will no longer be available.

The external memory system data bus width is 32 bits wide

The external data bus on the ARC is set to 32 bits wide.

External memory system byte address bus width (22 < address < 32)(22) :

The external memory system data bus width can range from 22 to 32 bits, 4Mb to 4Gb address range, the default on this menu is set to the value of the I-fetch address bus width. We are going to select 24 bits, 16Mb address range, which is the maximum valid selection that can be used with the PC/SUN host port. NOTE: Even though the bus width is set to an arbitrary value the memory model for a generic build simulation is 512Kbytes.

=-=-=-=-=-=-=-=-=-=-= Core Register File Selection =-=-=-=-=-=-=-=-=-=-=-
The 32x32 register file can be implemented using a synthesized array of d-latches, or by using a three-port (2 read, 1 write) synchronous RAM cell.
Use a synchronous 2r1w RAM for the register file? (y) :

For the 32 general purpose registers r0-r31 the user can either use : Synchronous 3-port (2r1w) RAM, where a fast write-through not required, or Synthesized arrays of d-latches that require a write pulse to be generated.
Standard synthesis script assumes a 90°-delayed clock signal.
We desire a synchronous 3-port RAM and so we select y.

=-=-=-=-=-=-=-=-=-=-=-=-=-= Fast Load Returns -=-=-=-=-=-=-=-=-=-=-=-
Enable Fast load returns? (n) :

-52-

Fast Load returns, if the current instruction does not use register write back then the pipeline is not stalled. Our design allows us to take advantage of fast return loads and therefore we enter 'yes'.

=_=_=_=_=_=_=_=_=_=_=_=_=_=_= Extensions Builder =_=_=_=_=_=_=_=_=_=_=_=_=_=_=
Select the extensions to be added to the ARC
1. Continue
2. 32x32 Barrel shifter - rotate, arithmetic and logical shifts - 1 cycle
3. 32x32 Barrel shifter - rotate, arithmetic and logical shifts - Multi-cycle
4. Small multi-cycle 32x32 Multiply
5. Faster (& larger) 32x32 Multiply
6. 16x16 Multiply/Multiply Accumulate function with 36 bit accumulator - Fast
7. 16x16 Multiply/Multiply Accumulate function with 36 bit accumulator - Slow
8. Swap function - swaps upper and lower 16 bits of 32 bit word
9. MIN/MAX function - 32 bit precision
10. Normalize function - finds first bit set in 32 bit word
11. 24-bit Timer which counts to limit and then generates an interrupt
12. A Scratchpad RAM
13. A Scratchpad RAM with Sliding Pointers
Please select :

The above menu shows all the standard extensions, the user can select lots of different combinations depending on his needs.

We will select multi-cycle barrel shifter, Fast Mul/MAC, scratchpad RAM with sliding pointers and swap. Entering 3,7,12 and 8 does this. We really wanted a Normalize extension rather than Swap. We disable Swap by entering 8 again and then enter 10 to select normalize.

Note that the user cannot select both types of barrel shifters, in an install, selecting one automatically deselects the other. This also applies to both instances of the 32x32 multiplier, the MAC and both instances of the Scratchpad RAM.

We will now enter 1 to continue.
=_=_=_=_=_=_=_=_=_=_=_=_=_=_= Technology Selection =_=_=_=_=_=_=_=_=_=_=_=_=_=_=

Feature size (drawn) of technology in use
1. 0.35um
2. 0.5um
3. 0.65um
4. 0.8um
5. 1.0um
Please select (5) :

The feature size provides timings for DATA / TAG ram simulation & synthesis models and the core registers. Our chosen technology is 0.35?m so press 1 to continue. If vendor models are to be used the timings these settings produce are not used.

These values are only used to set the timings for the synthesis of RAM models. If an unsupported feature size required the user can select an arbitrary value and following the build change the clock period for the simulation of the VHDL and synthesis scripts to support the new feature size, timings of RAM etc.

Target clock speed in MHz (100)
We will use the default of 100Mhz as we have specified 0.35 ?m technology.

Clock skew for synthesis (+/-0.4ns) :

The default of 0.4ns will be used for this example.

Library for extensions logic? (user) :

Here the user can specify a name for his user library. This name will be used as the VHDL library names and during the install when creating directories and copying subsequent files to these directories. The name entered is arbitrary so we will enter 'sam'.

=.=.=.=.=.=.=.=.=.=.=.=.=.= Memory Extensions =.=.=.=.=.=.=.=.=.=.=.=.=.=
Select the memory extensions to be added to the ARC interface
1. Continue
- * Load/Store memory controller
3. * Instruction fetch memory controller
4. * Host interface for communications with ARC
5. * Arbitration unit for memory accesses
6. * RAM Sequencer
Please select :

Here the memory extensions for off chip memory are selected. The LD/ST memory controller is not optional, and is therefore permanently selected. To show the full use of the build script we are selecting all memory extensions. To do this there must a '*' next to each number, if not type that number (and pressing enter) , finally enter 1 to continue.

The queue depth for the Load/Store Memory Controller is fixed, i.e. 4 deep with a max of 2 stores.

Having continued the above information message is displayed.

================ Ld/St Memory Controller ==============-Select RAM for local load/store operations.
1. No Local RAM

```
         2. 512 x 32 bit of Local RAM
         3. 1024 x 32 bit of Local RAM
         4. 2048 x 32 bit of Local RAM
         5. 4096 x 32 bit of Local RAM
  5      Please select (3) :

The size of RAM to be used for local memory can be specified. We want 8 Kbytes of
         32 bit local ram and so enter 4. The local RAM is situated at the top of memory by
         default (determined by the external address width) and therefore has a base address of
 10      [Maximum RAM size - Local RAM size].

.=============== I-Fetch Memory Controller ==============-Select
         type of Instruction Fetch memory system
         1. Dummy I-fetch unit for User Definition
 15      2. Direct Mapped Cache
         Please select (2) :

There are several different ways in which the instruction fetch memory system can be
         defined.
 20      1. Dummy I-fetch, creates a template VHDL file for the user to edit.
         2. Direct mapped cache.
         We are using the default, 2, Direct Mapped Cache.

=.=.=.=.=.=.=.=.=.=.=.=.=.= Ifetch Modes =-=-=.=.=.=.-=.=.=.=.=.=.=
 25      Select the instruction Cache Modes.
         1. Continue
         2. Standard Cache with debug and cache bypass capability.
         3. Virtual Cache
         4. Mixed Code RAM / Icache space & Cache line lock
 30      Please select :

The first thing the script needs to know is what kind of cache do the user want. It's
         possible to have a :
         1. Standard Cache
 35      2. Virtual cache allows a user to dynamically resize the cache in software.
         3. Mixed Code RAM / Icache space with Line locking
         We have previously looked at using Virtual Cache to experiment with a range of cache
         configurations. Using this method we have found a standard cache configuration that
         gives the required performance to cost ratio for our application. We are therefore
 40      selecting Standard Cache.

Please select the max size of the Direct Mapped Instruction Cache.
         1. 0.5k bytes, 128 words
         2. 1k bytes, 256 words
 45      3. 2k bytes, 512 words
         4. 4k bytes, 1024 words
```

5. 8k bytes, 2048 words
6. 16k bytes, 4096 words
7. Other size
Please select (6) :

The Direct Mapped Instruction cache is user definable, using the script the user can input select sized from 512 bytes (128 words), up to 16k bytes (4k words). Other sizes (larger or smaller) can be manually input using option 7. For our test 8K bytes (selection 5) is sufficient.

Please select the min size of the Direct Mapped Instruction Cache.
1. 0.5k bytes, 128 words
2. 1k bytes, 256 words
3. 2k bytes, 512 words
4. 4k bytes, 1024 words
5. 8k bytes, 2048 words
-- 16k bytes, 4096 words
7. Other size
Please select (1) :

As we are using a virtual cache, it is necessary to specify a lower limit for the cache size. When using a virtual cache it is possible to artificially set the cache to any size between the maximum and minimum using software. For this test we want to test a large range of cache sizes down to the very small, therefore we select 7.

Please enter the min size of the Direct Mapped Instruction Cache in bytes.
NOTE: Size must be a power of two also 4 <= Size <= 16384
Enter Size :

As we are testing a large range of caches we have decided to choose 128 bytes as our minimum cache size. Entering 128 and pressing enter sets this constant. At this menu we can use abbreviations, 16k for example is the same as entering 16384.

Select a max Cache line length
1. 2 instruction words
2. 4 instruction words
3. 8 instruction words
4. 16 instruction words
5. 32 instruction words
6. Other size
Please select (3) :

The cache line length is the number of words fetched when a cache miss occurs. The script has options for 2, 4, 8, 16, or 32 word lines, the default being 8 words. Typing ENTER here, like all other menus, selects the default, 3, giving a cache line length of 8 words.

-56-

```
Select a min Cache line length
1. 2 instruction words
2. 4 instruction words
3. 8 instruction words
-- 16 instruction words
-- 32 instruction words
6. Other size
Please select (3) :
```

When using a virtual cache, as with the cache size, the user must also specify a minimum cache line length. 1 will give a minimum line length of 2 instruction words, which is the choice we have made.

Cache size, line length and external address, all go to determine the size of the tag RAM. Larger cache means more tag words and fewer tag bits. Longer line length means fewer tag words and more tag bits.

```
.=========== Host Interface Communications ==============-Select
from available host communications ports.
1. Dummy Host Communications Port
2. Standard PC/SUN Parallel Communications Port
3. JTAG Communications Port
Please select (2) :
```

Host port for I/O communications can be either a dummy VHDL file, which the user can edit to create a user defined communications port, standard PC/SUN or JTAG communications ports. We are selecting 2, PC/SUN, as we are not using our ARC with custom hardware.

```
.==================== Memory Arbitrator ==============-Select
the channels that you would like the memory arbitrator to service.
1. Continue
- * Load/Store channel for external memory accesses.
- * Host Interface channel for debugging and data downloading.
- * Instruction fetch channel for I-cache.
- * Local Scratch-pad RAM channel for burst reads/writes.
6. Additional Channels
Please select :
```

How this menu looks is very dependent on the selections that have been made before, as most options are mutually inclusive with other selections. For test purposes we are adding some additional channels 6.

How many additional channels do you want? (1 – 10) :

The user can select from between 1 and 10 extra channels. Enter 5 to give 5 additional channels.

1. Continue
- * Load/Store channel for external memory accesses.
- * Host Interface channel for debugging and data downloading.
- * Instruction fetch channel for I-cache.
- * Local Scratch-pad RAM channel for burst reads/writes.
6. * Additional Channels(5)
Please select :

The number of additional channels is now displayed next to the option. We enter 1 to continue to the next menu.

============================ RAM Sequencer ============================
Select
the number of wait states for the RAM Sequencer. The
script does not allow the user to enter a value greater than
31. If you wish use more than 31 wait states then you will have
to edit the appropriate files manually.
How many wait states? (31) :

Choose from 0 – 31 RAM sequencer wait states. The default and the value we are using is 31. This is a good default, as it will produce an ARC that will run with almost any speed memory. For simulation purposes, or if the user know that the ARC the user are building will always use a certain speed RAM, it may be useful to set the default value for the wait states to a smaller number than the maximum 31.

=-=-=-=-=-=-=-=-=-=-=-=-==-=-= Simulation =-=-=-=-=-=-=-=-=-=-=-=-=-=
Selection of the state of the ARC on reset is important since it is preferable to have the system build start on reset while the core build should halt on reset since the host effectively clears the halt bit during simulation.
Do you wish to halt the ARC at address location 0 on reset (n) :

We have entered 'n' here, that means the ARC starts running the code at address 0 on reset. Had we selected 'y' the ARC is halted immediately on reset.
The default for this Y on core build and N on generic and ARCAngel builds.

Is your VHDL simulator Model Technologies VSystem? (y) :

ARC Cores Technologies we enter 'y' as we use MTI VSystem to simulate our VHDL If the user use a different simulator, select no. The user may set his environment up for his simulator by editing the makefile and other support files, after the install has completed.

Do you wish to use the R.T.L. And SeeCode Application Link (RASCAL)? (n) :

RTL And See-Code Application Link, otherwise known as RASCAL™, is extra utility that connects the Metaware debugger to connect to the Modeltech simulator. This allows the debugger to control the simulation of code on the ARC system model in the MTI simulator for Hardware/Software Co-Verification.

5   To include RASCAL we enter y and press enter.

=.=.=.=.=.=.=.=.=.=.=.=.=.=.=.= Install Directory =.=.=.=.=.=.=.=.=.=.=.=.=.=.=
Full path to ARC user working directory (/home/someone/systemarc) :

10  At this prompt the user have to specify a destination directory name (with full path).
The path must not include /tmp_mnt/ etc.
We will select the default, a directory named "systemarc" created where we launched the ARC system builder.

15  What we have built
I-fetch address bus width 22-bit
External address bus width 24-bit
Register file 3-port RAM
Fast load returns 'yes'
20  Extensions Multi-cycle barrel shifter.
Fast Mul/MAC.
Scratchpad RAM with sliding pointers.
Technology size 0.35 ?m
Clock speed 100 MHz
25  Clock skew 0.4 ns
Users library name 'sam'
Memory Extensions Load/Store memory controller
Instruction fetch memory controller
Host interface for communications with ARC
30  Arbitration unit for memory accesses
RAM Sequencer
Ld/St memory size 8 Kbytes.
Type of I-Cache Direct Mapped Cache
I-Cache mode Virtual Cache
35  I-cache size, Max / Min 8K bytes 128 bytes
Cache line length Max / Min 8 instruction words 2 instruction words
Host communication port Standard Sun/PC
Arbitration Channels Load/Store channel for external memory accesses
Host I/f channel for debugging and data downloading
40  Instruction fetch channel for I-cache
Local Scratch-pad RAM channel for burst
reads/writes
Additional Channels (5)
Ram Sequencer Wait states 31
45  Halt ARC on Reset? 'no'
Destination directory /home/user/systemarc

-59-

Simulator = MTI? 'yes'
RASCAL? 'yes'

3. ARCAngel
The final build is the ARCAngel. A large number of the selections on the ARCAngel build are chosen automatically due to the nature of the ARCAngel development board. The ARC Angel development board is described in detail in
"_____", which is incorporated herein by reference in its entirety.

=.=.=.=.=.=.=.=.=.=.=.=.=.=.=.= Fast Load Returns =.=.=.=.=.=.=.=.=.=.=.=.=.=.=.
Enable Fast load returns? (n) :

Fast Load returns, if the current instruction does not use register write back then the pipeline is not stalled.

ARCAngel development allows the use of fast return loads and so will our final design, therefore we enter 'yes'.

=.=.=.=.=.=.=.=.=.=.=.=.=.=.=.= Extensions Builder =.=.=.=.=.=.=.=.=.=.=.=.=.=.=.
Select the extensions to be added to the ARC
1. Continue
2. 32x32 Barrel shifter - rotate, arithmetic and logical shifts - 1 cycle
3. 32x32 Barrel shifter - rotate, arithmetic and logical shifts - Multi-cycle
4. Small multi-cycle 32x32 Multiply
N/A Faster (& Larger) 32x32 Multiply
N/A 16x16 Multiply/Multiply Accumulate function with 36 bit accumulator - Fast
7. 16x16 Multiply/Multiply Accumulate function with 36 bit accumulator - Slow
8. Swap function - swaps upper and lower 16 bits of 32 bit word
9. MIN/MAX function - 32 bit precision
10. Normalize function - finds first bit set in 32 bit word
11. * 24-bit Timer which counts to limit and then generates an interrupt
N/A A Scratchpad RAM
N/A A Scratchpad RAM with Sliding Pointers
Note the multi-cycle barrel shifter has been selected along with the 24-bit timer.
These have been selected as part of the standard Altera configuration, however,
the system will still function correctly without them.
Please select :

The above menu shows all the standard extensions, the user can select different combinations depending on his needs.

Note: The scratchpad RAM and the single cycle barrel shifter are too large to fit on the current ARCAngel FPGA, as are the fast 32x32 multiplier and the fast MUL/MAC. Also a build with all extensions selected will not fit on the current FPGA.

The 24-bit Timer is automatically selected, as it is a common selection on an ARCAngel build. We are using this extension however the user can deselect it by entering the corresponding number. We will also select the Multi-Cycle Barrel shifter and the Small 32x32 multiply. Entering 3 then 4 does this.

Note the user cannot select the fast type of Mul/MAC, in an install, if the user attempt to select it the ARC system builder prompts the user for another response.

We will now enter 1 to continue.

=.=.=.=.=.=.=.=.=.=.=.=.=.= Ifetch Modes =.=.=.=.=.=.=.=.=.=.=.=.=.=
Select the instruction Cache Modes.
1. Continue
2. *Standard Cache with debug and cache bypass capability.
3. Virtual Cache
4. Mixed Code RAM / Icache space & Cache line lock
Please select :

The first thing the script needs to know is what kind of cache do the user want. It is possible to have a :

1. Standard Cache
    2. Virtual cache allows a user to dynamically resize the cache in software.
    3. Mixed Code RAM / Icache space with Line locking Selecting 3 allows standard Cache with the extra features of Code RAM and Line locking.

Please select the norm size of the Direct Mapped Instruction Cache.
1. 0.5k bytes, 128 words
2. 1k bytes, 256 words
3. 2k bytes, 512 words
4. 4k bytes, 1024 words
5. 8k bytes, 2048 words
6. 16k bytes, 4096 words
Please select (3) :

The Direct Mapped Instruction cache is user definable, using the script the user can input select sized from 512 bytes (128 words), up to 16k bytes (4k words). Other sizes (larger or smaller) can be manually instantiated but for our test 4K bytes (selection 4) is sufficient.

The ARCAngel has onboard tag-RAM but uses external memory for the cache data-RAMS, so selecting larger cache sizes does not drastically affect the amount of RAM resources available on the Altera device.

Cache line length
1. 2 instruction words

```
           2. 4 instruction words
           3. 8 instruction words
           4. 16 instruction words
           5. 32 instruction words
    5      Please select (3) :

The cache line length is the number of words fetched when a cache miss occurs. The
           script has options for 2, 4, 8, 16, or 32 word lines, the default being 8 words. Entering 2
           will give a cache line length of 4 words, suitable for our test.
    10
           .================ Host Interface Communications ================-Select
           from available host communications ports.
           1. Standard PC/SUN Parallel Communications Port
           2. JTAG Communications Port
    15     Please select (1) :

Host port for I/O communications can be either a standard PC/SUN or a JTAG
           communications port. We are selecting 2, JTAG, as we wish to have an ARCAngel that
           can communicate to a range of host machines via the industry standard JTAG.
    20
           =.=.=.=.=.=.=.=.=.=.=.=.=.= Simulation =.=.=.=.=.=.=.=.=.=.=.=.=.=
           Selection of the state of the ARC on reset is important since it is preferable
           to have the system build start on reset while the core build should halt on
           reset since the host effectively clears the halt bit during simulation.
    25     Do you wish to halt the ARC at address location 0 on reset (n) :

We have entered 'n' here, that means the ARC starts running the code at address 0 on
           reset. Had we selected 'y' the ARC is halted immediately on reset.
           The default for this Y on core build and N on generic and ARCAngel builds.
    30
           Is your VHDL simulator Model Technologies VSystem? (y) :

At ARC Cores we enter 'y' as we use MTI VSystem to simulate our VHDL If the user
           use a different simulator, select no. The user may set his environment up for his
    35     simulator by editing the makefile and other support files, after the install has completed.

Do you wish to use the R.T.L. And SeeCode Application Link (RASCAL)? (n) :

RTL And See-Code Application Link, otherwise known as RASCAL™, is extra utility
    40     that connects the Metaware debugger to connect to the Modeltech simulator. This
           allows the debugger to control the simulation of code on the ARC system model in the
           MTI simulator for Hardware/Software Co-Verification.
           The default of n is selected by simply pressing enter.

45     =.=.=.=.=.=.=.=.=.=.=.=.=.= Install Directory =.=.=.=.=.=.=.=.=.=.=.=.=.=
           Full path to ARC user working directory (/home/someone/arcangel) :
```

At this prompt the user have to specify a destination directory name (with full path).
The path must not include /tmp_mnt/ etc.
We will select the default; a directory named "arcangel" created where we launched the
ARC build script.

NOTE: Even though the bus width is set to 26-bits, the memory model for a ARCAngel build simulation is 512Kbytes.

What we have built
Fast Load returns? 'yes'
Extensions Multi-cycle barrel shifter.
24-bit timer.
Small 32x32 multiplier
Direct mapped instruction cache size 4K bytes
Cache line length 4 instruction words
Host interface controller JTAG
Ram Sequencer SRAM 0 Wait states
Halt ARC on Reset? 'no'
Destination directory /home/user/systemarc
Simulator = MTI? 'yes'
RASCAL? 'no'

4. Core Verification system
The Core verification is a build which creates an ARC system and appropriate test files to verify that the ARC VHDL behaves as described in the ARC Programmers Reference manual.

=-=-=-=-=-=-=-=-=-=-=-= Core Register File Selection =-=-=-=-=-=-=-=-=-=-=-=-

The 32x32 register file can be implemented using a synthesized array
of d-latches, or by using a three-port (2 read, 1 write) synchronous
RAM cell.
Use a synchronous 2r1w RAM for the register file? (y) :

For the 32 general purpose registers r0-r31 the user can either use : Synchronous 3-port (2r1w) RAM, where a fast write-through not required, or Synthesized arrays of d-latches that require a write pulse to be generated.
Standard synthesis script assumes a 90°-delayed clock signal.
We selected a synchronous 3-port RAM and so we select y.

=-=-=-=-=-=-=-=-=-=-=-=-= Technology Selection =-=-=-=-=-=-=-=-=-=-=-=-=-=

Feature size (drawn) of technology in use
1. 0.35um
2. 0.5um
3. 0.65um 4. 0.8um
5. 1.0um
Please select (5) :

5   The feature size provides timings for DATA / TAG ram simulation & synthesis models
    and the core registers. Our chosen technology is 0.65?m so press 3 to continue.

Target clock speed in MHz (50)

10  We will use the default of 50Mhz as we have specified 0.65 ?m technology.

Clock skew for synthesis (+/-0.4ns) :

The default of +/- 0.7ns will be used for this example.
15
    Library for extensions logic? (user) :

Here the user can specify a name for his user's library. This name will be used during
    the install when creating two directories and copying subsequent files to these
20  directories. The string entered is arbitrary so we will enter 'tom'.

=-=-=-=-=-=-=-=-=-=-=-=-=-= Simulation =-=-=-=-=-=-=-=-=-=-=-=-=-=
    Selection of the state of the ARC on reset is important since it is preferable
    to have the system build start on reset while the core build should halt on
25  reset since the host effectively clears the halt bit during simulation.
    Do you wish to halt the ARC at address location 0 on reset (y) :

We have entered 'y' here, that means the ARC is halted immediately on reset. Had we
    selected 'n' the ARC starts running the code at address 0 on reset.
30
    The defaults are 'Y' for a core build and 'N' for generic and ARCAngel builds.

Note you will have to set the status register to the appropriate start address
    and clear the halt bit through the host interface before running the simulation.
35  You can manually edit "arc_start" in xaux_regs.vhdl so that the ARC is running
    following a reset.

Having selected 'y' the above information message is displayed.

40  Is your VHDL simulator Model Technologies VSystem? (y) :

At ARC Cores we enter 'y' as we use MTI VSystem to simulate our VHDL If the user
    use a different simulator, select no. The user may set his environment up for his
    simulator by editing the makefile and other support files, after the install has completed.
45
    =-=-=-=-=-=-=-=-=-=-=-=-=-= Install Directory =-=-=-=-=-=-=-=-=-=-=-=-=-=

Full path to ARC user working directory (/home/someone/verifyarc) :
At this prompt the user have to specify a destination directory name (with full path).
The path must not include /tmp_mnt/ etc.
We will select the default, a directory named "verifyarc" created where we launched the
ARC system builder.

What we have built:
Technology
Feature Size 0.65um
Clock Speed in MHz 50 MHz
Clock Skew in ns +/- 0.7 ns
Halt ARC on Reset? 'yes'
Destination directory /home/user/verifyarc
Simulator = MTI? 'yes'

Once the script has completed the install, the base case / ARCAngel build generates
files for simulation and synthesis. The Generic builder can generate files for simulation
provided all the required memory extensions are selected. For all types of build the
VHDL that the user can modify has been included in the directory './vhdl'

As default the test code is linked to the tests: -Core/
Generic & ARCAngel builds : init_mem.hex
Core Verification build : testscript.hcs*
Type of Tests Hex Directories
ALU and
interrupts
Core_b
Extension Core
Interfaces
Core_x
Extension
interfaces
Ext_x
Host interface hm
Auxiliary logic Aux_x

Base Case
For simulation a makefile is auto-generated to compile all the selected VHDL for the
MTI VSystem simulator. Type 'make' to build database, see makefile header for
information on using the makefile with other simulators. To simulate, simply type
'coretest'. This runs the Model Technologies simulator from the command line. The
behavior of the ARC core is displayed in the form of a pipeline diagram (SEE FIGURE
3) that shows the state of the processor as it processes each instruction. The user is
made aware when host interface accesses are taking place, in addition to Load/Store
from external memory. NOTE: The code will be executed twice for the default set-up
since it is run in normal mode and also in single step mode where each instruction is single stepped through the pipeline. The single step feature is only executed upon successful conclusion of the test code in normal operational mode.
Upon conclusion the user is made aware whether the test being simulated passed or failed.

To synthesize, type 'syn_arc', which runs the synthesis scripts for Synopsys Design Compiler.

Simulation Display

Example of Pipeline diagram.

```
# 12975ns : Z 000001A0 7FFFFFFF ---------- ---------- ---------- --
# 13025ns : Z 000001A0 7FFFFFFF ---------- ---------- ---------- --
# 13075ns : Z 000001A0 601F7C00 mov ---------- ---------- --
# 13125ns : Z 000001A4 80000000 80000000 mov ---------- --
# 13175ns : Z 000001A8 48000100 rlc.f ---------- mov --
# 13225ns : Z 000001AC 601FFE00 mov rlc.f ---------- wb : r0 <- 80000000
# 13275ns : Z 000001B0 48000100 rlc.f mov rlc.f --
# 13325ns : Z CV 000001B4 57E07A01 sub.f rlc.f mov wb : r0 <- 00000000
# 13375ns : Z CV 000001B8 7FFFFFFF nop sub.f rlc.f wb : r0 <- 00000000
# 13425ns : 000001BC 7FFFFFFF nop nop sub.f wb : r0 <- 00000001
# 13475ns : Z 000001C0 FFFFFFFF ---------- nop nop --
# 13525ns : Z 000001C0 FFFFFFFF ---------- ---------- nop --
```

Empty slots Long Immediate
Stage 4 - Writeback
to
core register
Condition
Code
Flags
Data Word
Program
Counter
Opcodes in pipeline stages1 - 3 Simulation
Time Stage 4

Generic build & ARCAngel builds

The ARCAngel build allows the designer to simulate and synthesize an ARC to the FPGA on the ARCAngel development board so that extensions and other features that have been added can be debugged. The generic build is similar however memory extensions can be added in addition to the core extensions. This build allows the designer to simulate most variations although certain combinations provide 'Dummy' blocks for the designer to add their own functionality. The generic system can be

-66- synthesized from auto-generated scripts for the Synopsys Design Compiler. To simulate, simply type 'asictest'.

To run code in the Generic or ARCAngel builds

First - we need to have produced a Mentor-quicksim format HEX file from the Metaware tools - This has already been done for basecase and extensions test code, since the basecase memory models read these files. The system builds are also capable of reading hex files, however, the user must be aware that test code generated must Upon conclusion (when the ARC has been halted) the user is made aware whether the test being simulated passed or failed. This is accomplished by reading the contents of the Status register via the host port to check whether the Zero flag has been set.

Core Verification system build

The Core verification system defaults to settings that allow the user to simulate, synthesize and verify the ARC core. For more information see the ARC core verification overview document.

4.2 Running Extensions test code

When an installation has been completed, the simulation is set up to run the basecase test code. The VHDL reads a file 'init_mem.hex' from the working directory that contains a memory image of the test program. Compiling the extensions test source code (testxalu.s) with the script mw.bat created these files.

Memory image Tests x_bshift.hex 32 bit barrel shift/rotate block
x_minmax.hex MIN and MAX instructions
x_mul64.hex 32 x 32 scoreboard multiplier with 64-bit result
x_mulmac.hex 16-bit Multiply/Multiply-accumulate function with 36-bit accumulator
x_norm.hex Normalize (find-first-bit) instruction
x_swap.hex SWAP instruction
x_ldstram.hex Local LD/ST RAM
x_timer.hex 24-bit timer counter
x_scratch.hex Scratch Pad RAM.
x_slide.hex Scratch Pad RAM with sliding pointers.
x_all.hex All extensions together.

For example, to test an ARC configured with the barrel shifter block, do the following from the working directory:

rm init_mem.hex ln -s $ARCHOME/exts/src/metaware/x_bshift.hex init_mem.hex

Now run the VHDL simulation. To replace the link to the basecase test code:

rm init_mem.hex ln -s $ARCHOME/arc/src/coretest.hex init_mem.hex

-67-

Single step tests (For Core build)
The standard testbench runs the code provided in init_mem.hex, and then runs it again, single stepping each of the instructions. Editing the file vhdl/memcon2.vhdl can disable this. Altering the signal assignment of no_step_test to supply the value '1' does this.

Tests (For Generic/ARCAngel build)
The standard testbench runs code provided in init_mem.hex. Modifying the variable do_pc_test to '1' in glue.vhdl can also set the PC test, provided that the hex file $ARCHOME/exts/src/metaware/aa.hex is used. Note that single step instruction mode for test code can be enabled by modifying the variable no_step_test to '0' in glue.vhdl. The single stepping feature is executed only when the test code has been successfully run in normal operation mode.

To create further additions to the test the user can use the METAWARE HighC compiler. The core build can read the output from the METAWARE tool set directly, i.e. HEX format files. The ARCAngel/generic builds also read the HEX format files output by HighC.

Cache test code
Test code has been provided to allow the cache logic to be tested. It must be edited by the user to set the cache size which is in use. Make a subdirectory under his working area, and copy the appropriate files into it:

```
llama> mkdir src
llama> cd src
llama> cp $ARCHOME/exts/src/metaware/cache.* .
llama> cp $ARCHOME/exts/src/metaware/macros.s .
llama> chmod +w cache.s
```

Now edit the test code file cache.s to set the CACHESIZE variable to the appropriate value, and recompile the code. This will require a certain amount of copying files between PC and Sun systems if the Metaware tools are not available on the Sun system.

```
llama> cache.bat
```

The user may now either link cache.hex to init_mem.hex for his specific build, i.e. core or system. The designer can edit the files in the VHDL directory to modify or add features to the extension core logic:

-xalu. vhdl Extension alu functions.
xdefs.vhdl Extension instruction opcodes, auxiliary registers and other constants.
xrctl.vhdl Extension control logic for pipeline flow.
xaugs_regs.vhdl Auxiliary registers.
xcore_regs.vhdl Core registers.

There are memory extension files that can be edited. Depending on the user's selection, files that can be edited are as follow:
-sram_seq.vhdl RAM sequencer.
mc_sys.vhdl Memory arbitration unit.
mc_arc.vhdl Ld/st memory controller.
dmcc.vhdl Direct mapped cache controller.
i_fetch.vhdl Dummy instruction fetch.
miu.vhdl External memory i/f unit.

The synthesis scripts and support files can also be edited: - synopsys-dc.setup Technology-specific setup
user_synopsys_dc.setup ARC-specific setup. Included by above
scripts/elaborate.dc Elaboration of VHDL.
scripts/analyse.dc Analysis of VHDL.
scripts/do_all.dc Complete synthesis of design.

Hierarchy Generation
If additional files are added to the hierarchy then the makefile must be modified to reflect this.

Command line parameters :

NAME
    system_builder - builds ARC VHDL files for simulation & synthesis.

SYNOPSYS
    system_builder ARCgui [-parameters]

DESCRIPTION
    The system builder

REQUIRED PARAMETERS
    -build_type [value] core, generic, altera, core_verification
    -ifetch_addr [value] 19 - 26
    -ext_addr [value] 19 - 32
    -tech [value] Feature size. e.g. 0.35um
    -ck_speed [value] Clock speed in MHz e.g. 100
    -ck_skew [value] Clock Skew +/- value in ns.
    -ext_lib [value] Name to be used for ext. library.
    -local_ram [value] Amount of Local load/st RAM
    -ifetch_system [value] dummy, Direct Mapped Cache
    -cache_size [value] Cache size
    -cache_line_length [value] Cache Line length
    -add_chan [value] Additional channels
    -wait_states [value] Ram sequencer wait states -install_dir [path] Where destination dir is to be created
-install_name [dir name] Name of the destination directory OPTIONAL PARAMETERS
-register_file Use synchronous RAM cell register file.
-cache Cache enabled
-ldst_cont load/store controller
-hostif_cont host interface controller
-host_port [value] PC,dummy
-ifetch_cont I-fetch memory controller
-arbitrator Memory Arbitrator
-ram_seq Ram sequencer
-sram_chan Ram Sequencer Memory Arbitrator channel
-halt Halt the ARC on reset
-mti Compile for use with MTI Vsystem.

APPENDIX II

©Copyright 1998-2002 ARC International plc. All rights reserved.

List of Script files

| | |
|---|---|
| system_builder | |
| anARChy.awk | The main script. Called by system_builder |
| arc_mti_inst | Installation for ModelTech VHDL simulator |
| xentity | |
| entity.awk | Extract inputs + outputs from a VHDL file. |
| extant | Does a file exist already? |
| header.vhdl | VHDL header. Used by vhdlgen.awk. |
| hiergen | Generate a hierarchy. Calls vhdlgen. |
| hiergen.awk | called by makefile (makegen) |
| make_arc_sys_struct | Specific script for generating a hierarchy. |
| makegen | Generate makefile for building hierarchy |
| makegen.awk | calls hiergen, vhdlgen etc. |
| mti_make | Generate VHDL compilation makefiles |
| mti_make.awk | |
| synopsys_make | Generates Synopsys synthesis scripts |
| synopsys_make.awk | |
| up_xent | Update entity datafile. (makegen makefile). |
| vhdlcopy | Copies generated VHDL to user's vhdl/ dir |
| vhdlgen | Generate a structural vhdl file based on a hierarchy definition. |
| vhdlgen.awk | |
| vhdlmerge.awk | Merge extension data into a placeholder. |
| dat/apex.hier | Sample hierarchy file. (Ignore %%..%% keywords) |
| dat/apex.mg | Control file for hierarchy builder |
| dat/library.list | Sample library definition file. |
| sample/placeholder/xalu.vhdl | |
| sample/placeholder/xaux_regs.vhdl | Standard ARC extension placeholder files. Note -- ARCPRAGMA's |
| sample/placeholder/xcoreregs.vhdl | |
| sample/placeholder/xrctl.vhdl | |
| sample/extension/xalu.vhdl | Extension files for SWAP instr. |
| sample/extension/xrctl.vhdl | Merged into placeholders. |

What is claimed is:

1. An integrated circuit, fabricated using the method comprising:

creating a customized description language model of an integrated circuit design by:

receiving one or more inputs from a user for at least one customized parameter of the integrated circuit;

receiving an identification of a location of one or more library files that provide at least one prototype description and at least one extension logic description for the integrated circuit for which a model is being generated; and generating through an automated process a customized description language model based on at least one customized parameter, the at least one prototype description, and the at least one extension logic description, the automated process including the acts of reading at least one prototype description and modifying the at least one prototype description by substituting values in the at least one prototype description or merging additional descriptions based on the at least one customized parameter;

generating a netlist which is descriptive of the circuitry of said integrated circuit;

compiling said netlist and said hardware description model to produce a compiled integrated circuit design;

fabricating at least one mask or FPGA configuration file representing said compiled integrated circuit design; and fabricating said integrated circuit using said at least one mask or FPGA configuration file;

wherein said act of creating is performed at a high level of abstraction.

2. The integrated circuit of claim 1, wherein the act of receiving one or more inputs comprises receiving input of one or more parameters by a user selecting at least one of a plurality of input parameters associated with said design, said at least one parameter being selected from the group comprising:

(i) custom instruction sets;
(ii) cache configurations;
(iii) memory interface configurations; and
(iv) system architecture configurations.

3. The integrated circuit of claim 1, wherein the act of generating a netlist comprises generating a list of logic devices and their interconnections.

4. The integrated circuit of claim 1, wherein the act of fabricating said integrated circuit comprises defining physical features on a semi-conductive substrate via a lithographic process.

5. The integrated circuit of claim 1, further comprising synthesizing said design based on said description language model.

6. The integrated circuit of claim 2, wherein the act of receiving inputs is performed interactively with the user using a display.

7. An apparatus adapted to generate integrated circuit designs, comprising:

a processor capable of running a computer program;

a storage device operatively coupled to said processor, said storage device being capable of storing at least a portion of a computer program;

an input device, operatively coupled to said processor capable of receiving input from a user and transmitting said input to said processor; and a computer program resident at least in part on said storage device, said computer program adapted perform the following acts;

receiving one or more inputs from a user for at least one customized parameter of the integrated circuit;

receiving an identification of a location of one or more library files that provide at least one prototype description and at least one extension logic description for the integrated circuit for which a model is being generated; and generating a customized description language model based on at least one customized parameter, the at least one prototype description, and the at least one extension logic description including the acts of reading at least one prototype description and modifying the at least one prototype description by substituting values in the at least one prototype description or merging additional descriptions based on the at least one customized parameter.

8. The apparatus of claim 7, wherein said description language model is a hardware description language (HDL).

9. The apparatus of claim 7, wherein said computer program is further adapted to perform the acts comprising:

generating a file based on said description language model for use with a simulation; and simulating said design using said file.

10. The apparatus of claim 9, wherein said computer program is further adapted to perform the act comprising running synthesis scripts based on said description language model in order to synthesize said integrated circuit design.

11. The apparatus of claim 7, wherein said processor comprises a digital microprocessor, and said storage device comprises magnetic media.

12. A system for generating integrated circuit designs at a high level of abstraction comprising:

a processor;

a storage device in data communication with said processor, said storage device being capable of storing and retrieving a computer program; and a computer program stored within said storage device and adapted to run on said processor, said computer program comprising:

an input receiving module that receives one or more inputs from a user for at least one customized parameter of an integrated circuit device, the at least one customized parameter comprising a parameter selected from the group comprising a custom instruction, a cache configuration, a memory interface configuration and a system architecture configuration;

a library file receiving module that receives an identification of a location of one or more library files that provide at least one prototype description and at least one extension logic description for the integrated circuit device for which a model is being generated; and a generation module that generates a customized description language model based on at least one customized parameter, the at least one prototype description, and the at least one extension logic description through acts including reading at least one prototype description and modifying the at least one prototype description by substituting values in the at least one prototype description or merging additional descriptions based on the at least one customized parameter.

13. The system of claim 12, wherein said computer program further comprises a user-selectable element, said user-selectable element allowing said user to select one of a plurality of process technology options.

14. The system of claim 12, wherein the input receiving module receives input by the act of reading a pre-configured data file.

15. A method of generating the design of an integrated circuit rendered in a hardware description language, said method being performed at a high level of abstraction and comprising the acts of:

selecting a process technology;

receiving one or more inputs from a user for at least one customized parameter of the integrated circuit, including at least one parameter selected from the group comprising:
(i) processor instructions;
(ii) cache configuration;
(iii) memory interface configuration; and
(iv) system architecture configuration;

receiving an identification of a location of at least one library file that provides at least one prototype description and at least one extension logic description for the integrated circuit for which a model is being generated; and generating through an automated process a customized description language model based on at least one customized parameter, the at least one prototype description, and the at least one extension logic description, the automated process including the acts of reading at least one prototype description and modifying the at least one prototype description by substituting values in the at least one prototype description or merging additional descriptions based on the at least one customized parameter.

16. A system for generating integrated circuit designs at a high level of abstraction, comprising:

means for processing digital data;

means for data storage in data communication with said processor means, said means for data storage being capable of storing and retrieving a computer program; and a computer program stored within said means for data storage and adapted to run on said processor means, said computer program comprising:
means for selecting a process technology;
an input receiving module that receives one or more inputs from a user for at least one customized parameter of the integrated circuit device, including at least one parameter selected from the group comprising a cache configuration, a memory interface configuration, and a system architecture configuration;
a library file receiving module that receives an identification of a location of one or more library files that provide at least one prototype description and at least one extension logic description for the integrated circuit device for which a model is being generated; and
a generation module that generates a customized description language model based on at least one customized parameter, the at least one prototype description, and the at least one extension logic description through acts including reading one or more prototype description and modifying the one or more prototype description by substituting values in the one or more prototype description or merging additional descriptions based on the at least one customized parameter.

17. A computer-implemented method of generating the design of an integrated circuit at a high level of abstraction using a description language, comprising the acts of:

providing an existing processor core configuration;

receiving one or more inputs from a user for at least one customized parameter of the existing processor core configuration for the integrated circuit device, the input being selected from a constrained set of input parameters associated with said configuration, said parameters comprising:
(i) at least one custom instruction;
(ii) a cache configuration; and
(iii) a memory interface configuration;

receiving an identification of a location of one or more library files that provide at least one prototype description and at least one extension logic description for the integrated circuit device for which a model is being generated; and generating through an automated process a customized description language model based on at least one customized parameter, the at least one prototype description, and the at least one extension logic description, the automated process including the acts of reading at least one prototype description and modifying the at least one prototype description by substituting values in the at least one prototype description or merging additional descriptions based on the at least one customized parameter.

18. A method of generating an integrated circuit design at a high level of abstraction, comprising:

providing a user with a plurality of optional inputs, including the ability to generate a customized hardware description language code instruction;

selecting at least one of said plurality of optional inputs;

selecting at least one cache configuration;

defining at least one memory interface;

generating through an automated process a customized description language model based on at least one optional input, cache configuration, and memory interface customized parameter, the automated process including the acts of reading at least one prototype description, modifying the at least one prototype description by substituting values in the at least one prototype description or merging additional descriptions based on the at least one optional input, cache configuration and memory interface, and incorporating any customized hardware description language code instructions.

19. A description language model of an integrated circuit design generated at a high level of abstraction using the method comprising:

receiving one or more inputs from a user for at least one customized parameter of the existing processor core configuration for the integrated circuit device, the input being selected from a plurality of input parameters associated with said design, said parameters comprising:
(i) at least one extension instruction; and
(ii) a cache configuration;

defining the location of at least one library file that provides at least one prototype description and at least one extension logic description for the integrated circuit device for which a model is being generated; and;

generating through an automated process a customized description language model based on at least one customized parameter, the at least one prototype description, and the at least one extension logic description, the automated process including the acts of reading at least one prototype description and modifying the at least one prototype description by substituting values in the at least one prototype description or merging additional descriptions based on the at least one customized parameter.

20. A method of generating an extended processor design at a high level of abstraction, comprising:
providing the user with a basecase processor core configuration having a base instruction set;
providing a user with a plurality of optional instructions adaptable for use with said basecase core;
receiving the selection of at least one of said plurality of optional instructions;
receiving the selection of at least one cache configuration;
receiving an identification of a location of one or more library files that provide at least one basecase description and at least one extension logic description for the integrated circuit device for which a model is being generated;
generating through an automated process a customized description language model based on at least one optional instruction, the at least one basecase description, and the at least one extension logic description, the automated process including the acts of reading at least one basecase description and modifying the at least one basecase description by substituting values in the at least one basecase description or merging additional descriptions based on the at least one customized parameter; and
wherein said plurality of optional instructions and cache configurations are constrained so as to ensure the functionality of said processor design irrespective of the user's selections.

21. A computer-implemented method of generating a customized description language model of a integrated circuit design including at least one of a microprocessor or microprocessor peripheral device comprising the following acts performed by a computer process:
receiving one or more inputs from a user for at least one customized parameter of the microprocessor or microprocessor peripheral;
receiving an identification of a location of one or more library files that provide at least one prototype description and at least one extension logic description for the microprocessor or microprocessor peripheral for which a model is being generated; and
generating through an automated process a customized description language model based on the least one customized parameter, the at least one prototype description, and the at least one extension logic description, the automated process including the acts of reading at least one of the prototype descriptions and modifying the at least one prototype description by substituting values in the at least one prototype description or merging additional descriptions based on the at least one customized parameter.

22. The method of claim 21 where the inputs are received through an interactive process.

23. The method of claim 21 wherein the inputs are received in a non-description language format.

24. The method of claim 21 wherein the customized description language model includes both functional and structural description language descriptions for the microprocessor or microprocessor peripheral.

25. The method of claim 21 wherein the generating act comprises copying one or more prototype files, substituting chosen and calculated values in those prototype files and merging in additional hardware language description language to the prototype file.

26. The method of claim 21 wherein the description language is written in steps.

27. A method of designing an integrated circuit design including at least one of a microprocessor or microprocessor peripheral device comprising the acts of:
receiving one or more inputs from a user for at least one customized parameter of the microprocessor or microprocessor peripheral;
receiving an identification of a location of one or more library files that provide at least one prototype description and at least one extension logic description for the microprocessor or microprocessor peripheral for which a model is being generated;
generating through an automated process a customized description language model based on the least one customized parameter, the at least one prototype description, and the at least one extension logic description, the automated process including the acts of reading at least one prototype description and modifying the at least one prototype description by substituting values in the at least one prototype description or merging additional descriptions based on the at least one customized parameter;
testing the customized description language through simulation or synthesis; and
if a different testing outcome is desired, receiving an identification of one or more input for at least one customized parameter and generating a second customized description language model.

28. The method of claim 27 where the inputs are received through an interactive process.

29. The method of claim 27 wherein the inputs are received in a non-description language format.

30. The method of claim 27 wherein the customized description language model includes both functional and structural description language descriptions for the microprocessor or microprocessor peripheral.

31. The method of claim 27 wherein the generating act comprises copying one or more prototype files, substituting chosen and calculated values in those prototype files and merging in additional hardware language description language to the prototype file.

32. The method of claim 27 wherein the description language is written in steps.

33. An apparatus that generates a customized description language model of an integrated circuit design including at least one of a microprocessor or microprocessor peripheral device comprising:
an input module that receives one or more inputs from a user for at least one customized parameter of the microprocessor or microprocessor peripheral;
a library file module that receives an identification of a location of one or more library files that provide at least one prototype description and at least one extension logic description for the integrated circuit device for which a model is being generated;
a description language model generator that generates a customized description language model based on the least one customized parameter, the at least one prototype description and the at least one extension logic description through an automated process that reads at least one prototype description and modifies the at least one prototype description by substituting values in the at least one prototype description or merging additional descriptions based on the at least one customized parameter; and wherein the customized description language model includes both functional and structural description language descriptions for the microprocessor or microprocessor peripheral.

34. The apparatus of claim 33 where the inputs are received through an interactive process.

35. The apparatus of claim 33 wherein the inputs are received in a non-description language format.

36. The apparatus of claim 33 wherein the generator copies one or more prototype files, substitutes chosen and calculated values in those prototype files and merges in additional hardware language description language to the prototype file.

37. The apparatus of claim 33 wherein the description language is written in steps.

38. An apparatus that generates a customized description language model of an integrated circuit design including at least one of a microprocessor or microprocessor peripheral device comprising:

an input module that receives one or more inputs from a user for at least one customized parameter of the microprocessor or microprocessor peripheral;

a library file module that receives an identification of a location of one or more library files that provide at least one prototype description and at least one extension logic description for the integrated circuit device for which a model is being generated;

a description language model generator that generates a customized description language model based on the least one customized parameter, the at least one prototype description and the at least one extension logic description through an automated process that reads at least one prototype description and modifies the at least one prototype description by substituting values in the at least one prototype description or merging additional descriptions based on the at least one customized parameter; and a feedback module that enables a user to test the customized description language through simulation or synthesis;

wherein if a different testing outcome is desired, the input receiving module enables the user to input an identification of one or more input for at least one customized parameter and the description language generator generates a second customized description language model; and wherein the customized description language model includes both functional and structural description language descriptions for the microprocessor or microprocessor peripheral.

39. The method of claim 38 where the inputs are received through an interactive process.

40. The method of claim 38 wherein the inputs are received in a non-description language format.

41. The method of claim 38 wherein the generator copies one or more prototype files, substitutes chosen and calculated values in those prototype files and merges in additional hardware language description language to the prototype file.

42. A computer-implemented method of generating a customized description language model and associated test code of a integrated circuit design including at least one of a microprocessor or microprocessor peripheral device comprising the following acts performed by a computer process:

receiving one or more inputs from a user for at least one customized parameter of the microprocessor or microprocessor peripheral;

generating through an automated process a customized description language model based on the least one customized parameter, the automated process including the act of modifying at least one prototype description by substituting values in the at least one prototype description or merging additional descriptions based on the at least one customized parameter;

generating through an automated process test code associated with the customized description language model based on the at least one customized parameter; and wherein the customized description language model includes both functional and structural description language descriptions for the microprocessor or microprocessor peripheral.

43. A method of designing an integrated circuit design including at least one of a microprocessor or microprocessor peripheral device comprising the acts of:

receiving one or more inputs from a user for at least one customized parameter of the microprocessor or microprocessor peripheral;

generating through an automated process a customized description language model based on the least one customized parameter, the automated process including the act of modifying at least one prototype description by substituting values in the at least one prototype description or merging additional descriptions based on the at least one customized parameter;

generating through an automated process test code associated with the customized description language model based on the at least one customized parameter testing the customized description language through simulation or synthesis using the test code generated;

if a different testing outcome is desired, receiving an identification of one or more input for at least one customized parameter and generating a second customized description language model; and wherein the customized description language model includes both functional and structural description language descriptions for the microprocessor or microprocessor peripheral.

44. An apparatus that generates a customized description language model of an integrated circuit design including at least one of a microprocessor or microprocessor peripheral device comprising:

an input module that receives one or more inputs from a user for at least one customized parameter of the microprocessor or microprocessor peripheral;

a description language model generator that generates through an automated process a customized description language model based on the least one customized parameter, the automated process including the act of modifying at least one prototype description by substituting values in the at least one prototype description or merging additional descriptions based on the at least one customized parameter;

a test code generator that generates through an automated process test code associated with the customized description language model based on the at least one customized parameter; and wherein the customized description language model includes both functional and structural description language descriptions for the microprocessor or microprocessor peripheral.

45. An apparatus that generates a customized description language model of an integrated circuit design including at least one of a microprocessor or microprocessor peripheral device comprising:

an input module that receives one or more inputs from a user for at least one customized parameter of the microprocessor or microprocessor peripheral;

a description language model generator that generates through an automated process a customized description language model based on the least one customized parameter, the automated process including the act of modifying at least one prototype description by substituting values in the at least one prototype description or merging additional descriptions based on the at least one customized parameter;

a test code generator that generates through an automated process test code associated with the customized description language model based on the at least one customized parameter;

a feedback module that enables a user to test the customized description language through simulation or synthesis using the test code generated; and wherein if a different testing outcome is desired, the input receiving module enables the user to input an identification of one or more input for at least one customized parameter and the description language generator generates a second customized description language model.

46. The method of claim 45 wherein the customized description language model includes both functional and structural description language descriptions for the microprocessor or microprocessor peripheral.

47. The method of claim 21, wherein said one or more inputs received from the user are received via a graphical user interface (GUI).

48. The method of claim 21, wherein the method further comprises conducting a hardware/software co-verification.

49. The method of claim 21, wherein the act of conducting a hardware/software co-verification further comprises using a debugger to run software using at least a portion of the description language model.

50. The method of claim 21, wherein the method further comprises conducting a core verification as part of the act of generating a customized description language model.

51. The apparatus of claim 33, wherein said one or more inputs received from said user are received via a graphical user interface (GUI).

52. The apparatus of claim 33, wherein the method further comprises conducting a hardware/software co-verification.

53. The apparatus of claim 33, wherein the act of conducting a hardware/software co-verification further comprises using a debugger to run software using at least a portion of said description language model.

54. The apparatus of claim 33, wherein the method further comprises conducting a core verification as part of the act of generating a customized description language model.

* * * * *